United States Patent
Goda et al.

(10) Patent No.: US 7,429,765 B2
(45) Date of Patent: Sep. 30, 2008

(54) NONVOLATILE SEMICONDUCTOR MEMORY

(75) Inventors: Akira Goda, Yokohama (JP); Hiroyuki Nitta, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 20 days.

(21) Appl. No.: 10/935,269

(22) Filed: Sep. 8, 2004

(65) Prior Publication Data

US 2005/0101081 A1 May 12, 2005

(30) Foreign Application Priority Data

Sep. 30, 2003 (JP) .............................. P2003-342390

(51) Int. Cl.
*H01L 29/788* (2006.01)
(52) U.S. Cl. .................... 257/314; 257/E29.3
(58) Field of Classification Search ................. 257/315, 257/314, E29.3
See application file for complete search history.

(56) References Cited

U.S. PATENT DOCUMENTS

| | | | |
|---|---|---|---|
| 5,144,579 A | 9/1992 | Okabe et al. | |
| 5,235,199 A | 8/1993 | Hamamoto et al. | |
| 5,248,628 A | 9/1993 | Okabe et al. | |
| 5,561,311 A | 10/1996 | Hamamoto et al. | |
| 5,589,699 A * | 12/1996 | Araki | 257/316 |
| 5,670,404 A * | 9/1997 | Dai | 438/239 |
| 6,310,374 B1 | 10/2001 | Satoh et al. | |
| 6,611,010 B2 | 8/2003 | Goda et al. | |
| 6,649,508 B1 | 11/2003 | Park et al. | |
| 6,943,453 B2 | 9/2005 | Goda et al. | |
| 2001/0002713 A1 * | 6/2001 | Goda et al. | 257/315 |
| 2003/0095448 A1 * | 5/2003 | Ichige et al. | 365/200 |
| 2003/0117836 A1 * | 6/2003 | Kim et al. | 365/158 |
| 2004/0056281 A1 * | 3/2004 | Shin et al. | 257/213 |
| 2005/0101081 A1 | 5/2005 | Goda et al. | |
| 2005/0237847 A1 | 10/2005 | Goda et al. | |

FOREIGN PATENT DOCUMENTS

| | | | |
|---|---|---|---|
| JP | 5-198822 | | 8/1993 |
| JP | 08078551 A | * | 3/1996 |
| JP | 2000164714 A | * | 6/2000 |
| JP | 2001-217201 | | 8/2001 |
| JP | 2003-188252 | | 7/2003 |

OTHER PUBLICATIONS machine translation of JP 2000164714 A.*
U.S. Appl. No. 10/455,711, filed Jun. 6, 2003, Goda, et al.
U.S. Appl. No. 10/318,257, filed Dec. 13, 2002, Goda, et al.

* cited by examiner

*Primary Examiner*—Richard T. Elms
*Assistant Examiner*—Michael Lulis
(74) *Attorney, Agent, or Firm*—Oblon, Spivak, McClelland, Maier & Neustadt, P.C.

(57) ABSTRACT

A nonvolatile semiconductor memory includes: a device region and a device isolating region, which have a pattern with a striped form that extends in a first direction, and are alternately and sequentially disposed at a first pitch in a second direction that is perpendicular to the first direction; and a contact made of a first conductive material, which is connected to the device region and disposed at the first pitch in the second direction. On a cross section of the second direction, the bottom width of the contact is longer than the top width of the contact, and the bottom width is longer than the width of the device region.

8 Claims, 77 Drawing Sheets

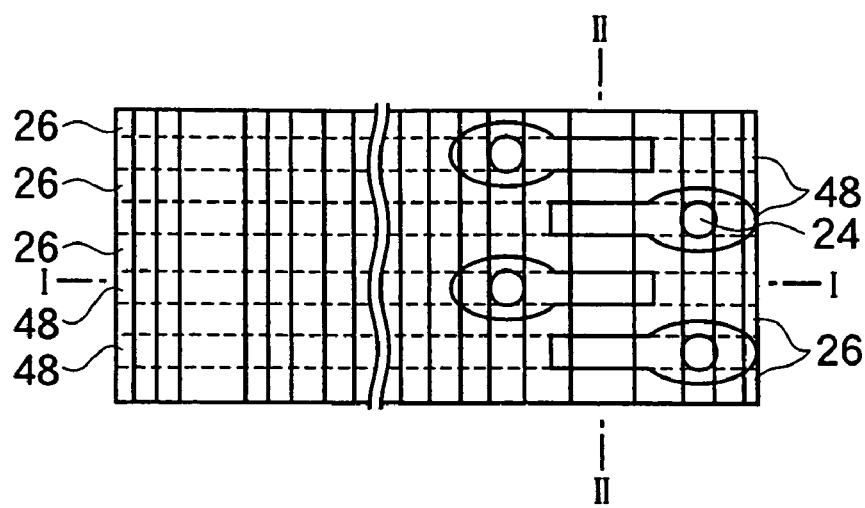
FIG. 23A
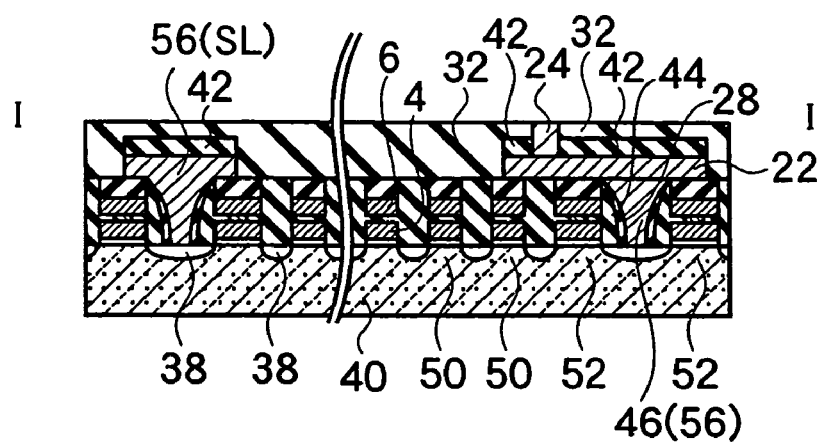
FIG. 23B
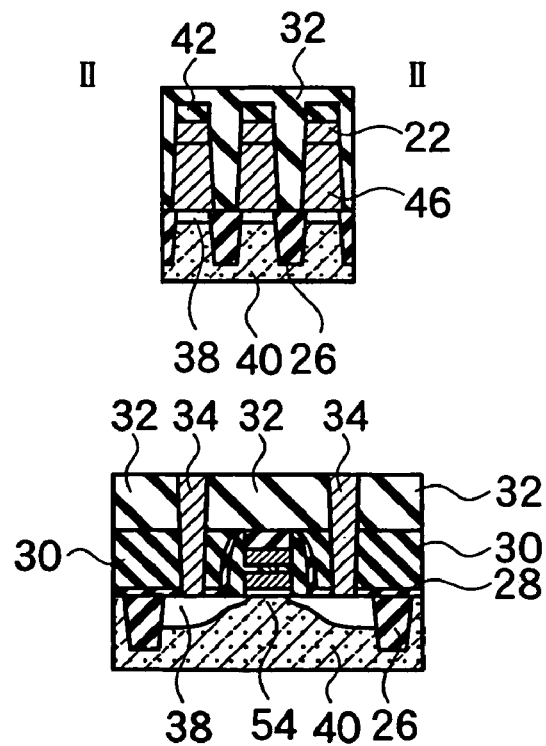
FIG. 23C
FIG. 23D

1

NONVOLATILE SEMICONDUCTOR MEMORY

CROSS REFERENCE TO RELATED APPLICATIONS

This application is based upon and claims the benefit of priority from prior Japanese Patent Applications P2003-342390 filed on Sep. 30, 2003; the entire contents of which are incorporated by reference herein.

BACKGROUND OF THE INVENTION

1. Field of the Invention

The present invention relates to a non-volatile semiconductor memory. In particular, it relates to techniques for contacts aligned with a minimum feature size for a processing dimension, such as contacts for data transfer lines of NAND-type electrically erasable programmable read-only memory (EEPROM) or NOR EEPROM, and interconnect layers thereof.

2. Description of the Related Art

FIGS. 1 through 3 show conventional contacts and interconnect layers in, for example, a NAND EEPROM or a non-volatile semiconductor memory. FIG. 1 shows a aerial pattern view; FIG. 2 shows a schematic cross sectional structure cut along the line I-I in FIG. 1; FIG. 3A shows a schematic cross sectional structure cut along the line II-II in FIG. 1; and FIG. 3B shows a schematic cross sectional structure cut along the line III-III in FIG. 1. In FIG. 1, memory cell transistors are aligned in series along the line I-I between select gate transistors SGS and SGD. Data transfer lines BL are disposed along the line I-I. Word lines WL are disposed in a direction perpendicular to the data transfer lines BL. Circular contacts CSL or elliptic contacts CBL are disposed in a direction perpendicular to the data transfer lines BL. The intervals of the contacts CBL along the line III-III depend on the widths of a device region 148 and a device isolating region 126; and those contacts are aligned at intervals of, for example, 2 F where F denotes a minimum processing dimension. Each of the intervals of those contacts along the line I-I that is perpendicular to the line III-III is longer than each of those along the line III-III, and may be 40 to 100 F, for example.

The contacts CSL and CBL are filled with polycrystalline silicon, which is doped with a high impurity concentration of phosphorus, and the interconnect layer is filled with a metal such as tungsten. The interconnect layer is assumed here to be a data transfer line extension 122, which is longer than 3 F, along the data transfer lines BL. It goes without saying that the interconnect layer can be any kind of long, straight, and fine metallic pattern, and may have a configuration not including via contacts 24 and data transfer line extension 122 but using the data transfer lines BL as interconnects so as to directly form contacts.

In order to provide a lithographic margin, it is preferable that the diameter of each circular contact is greater than F and the width of each interconnect is equal to F (in the case of contacts disposed at intervals of 2 F.) Therefore, on the cross section in the direction perpendicular to the data transfer lines BL (i.e., the cross section cut along the line III-III), the width of each interconnect is shorter than the diameter of each contact.

A method has been disclosed for forming capacitor over bit line (COB) DRAM, which includes the steps of forming drain contact holes for select transistors in a self-aligning manner, depositing a polycide film, and forming drain contacts and bit lines simultaneously through reactive ion etching (RIE) (Japanese Patent Application Laid-open No. Hei 9-3211241).

In addition, a method has been disclosed for a NAND EEPROM, which includes the steps of forming drain contact holes, subjecting a deposited conductive layer to RIE so as to simultaneously form drain contacts and extended electrodes from drain diffusion layers or the like (U.S. Pat. No. 6,310,374).

Furthermore, a method for forming a 1 MOS-1 capacitor DRAM, has been disclosed which includes the steps of covering the top surface of MOS gates with an etching stop layer, forming a planarized insulator film, forming bit line contacts in a self aligning manner, coating with a polycide film and then subjecting the DRAM to RIE so as to simultaneously form bit line contacts and bit lines (U.S. Pat. No. 5,670,404).

Moreover, a configuration of a flash EEPROM, has been disclosed which allows reduction in the minimum interconnect pitch necessary for bit lines by providing a second contact area. The second contact area is a junction between a first conductive layer and a second conductive layer, almost above a charge accumulating electrodes that sandwich a drain region. Bit lines are formed with a shorter width than that of bit line contact areas, and the second contact area is disposed in the expanded space (Japanese Patent Application Laid-open No. Hei 5-198822).

As miniaturization of devices progress, the following problems occur with the conventional technology for forming contacts, as described above, through use of a photolithography processing at only once. When forming contacts through a photolithography processing at only once, circular or elliptical contacts may naturally be formed due to restriction on spatial frequencies of waveforms.

First, as shown in FIG. 4A, there is a problem of bit line contacts CBL, which are disposed along the line III-III, being short-circuited due to deterioration of lithographic margin for the bit line contacts CBL. Circular or elliptical contacts may be easily short-circuited as the distance between adjacent contacts becomes shorter. In addition, when using photolithography and a positive resist, an inter-contact area is partially exposed. As a result, a pattern may be easily lost due to increase in the amount of exposure upon the short inter-contact areas on the cross section along the line III-III.

Alternatively, when reducing the diameter of each contact in order to prevent deterioration in lithographic margin for contacts, it becomes difficult to form contact holes through lithography. In other words, since the exposure intensity for a contact hole pattern is lower than that for a line and space pattern, the exposure sensitivity decreases. As a result, it becomes difficult to form minute contact holes with a sufficient focal depth and an allowable sufficient margin for variation in the amount of exposure. This is apparent from the fact that the spatial frequencies of waveforms having an optical intensity in an arbitrary direction is below the so-called resolution limit, and the minimum line width at the resolution limit cannot be obtained in two directions simultaneously. In short, this problem results from forming circular or elliptical contacts through lithography having two axes with almost the same diameter.

Secondarily, as shown in FIG. 4B, FIG. 1 through FIG. 3A, and FIG. 3B, there is a problem of deterioration in alignment margin. When the intervals between adjacent contacts are short, interconnect layers are easily short-circuited with the adjacent contacts due to misalignment of the interconnect layers with contacts. This problem results from forming interconnect layers and contacts independently through lithography. Referencing FIG. 3B, a region C schematically shows deterioration in the margin for the data transfer line contacts CBL and the interconnects formed of data transfer line extended parts 122. A region A schematically shows that the data transfer line contacts CBL and p-well regions 140 are short-circuited. Referencing FIG. 3A, a region B schematically shows that source line contacts CSL and the p-well regions 140 are short-circuited.

Furthermore, since the contacts are conventionally mask-aligned on a single under-layer, aligning or directly aligning the contacts with gate electrodes, for example, develops indirect alignment of the contacts with device regions that are perpendicular to the gate electrodes. As a result, misalignment of the contacts with the device region increases by the square root of 2 times or more than the amount of misalignment in the case of a direct alignment. Moreover, contacts are formed up to the device isolating region 126 due to misalignment of the device region 148 with a contact region, and a contact material reaches the p-well region 140 under the contact, resulting in deterioration in the withstand voltage between the p-well region 140 and the contacts. Also when the contacts are aligned with the device region 148, the gates and the contacts are indirectly aligned. Therefore, since a sufficient alignment margin must be provided in order to avoid short-circuits between, for example, the data transfer line contacts CBL and the select gate transistor SGD, there is a serious problem that the length of a memory cell array along the data transfer lines BL increases, resulting in an increase in the chip size.

SUMMARY OF THE INVENTION

A first aspect of the present invention inheres in a nonvolatile semiconductor memory including: a device region and a device isolating region, which have a striped pattern that extends in a first direction, the device region and the device isolating region being alternately and sequentially disposed at a first pitch in a second direction that is perpendicular to the first direction; and a contact of a first conductive material, connected to the device region and disposed at the first pitch in the second direction; and wherein on a cross section along the second direction, a bottom width of the contact is longer than the top width of the contact, and the bottom width is longer than the width of the device region.

A second aspect of the present invention inheres in a nonvolatile semiconductor memory including: a device region and a device isolating region having a striped pattern that extends in a first direction, the device region and the device isolating region being alternately and sequentially disposed at a first pitch in a second direction that is perpendicular to the first direction; a plurality of word lines and a plurality of select gate lines, extending in the second direction in a striped pattern; a memory cell transistor configured to use the word line as control gate electrodes; a select transistor configured to use the select gate lines as control gates; and a common source line linearly formed in the second direction and connected to the device region; wherein the common source line is embedded and disposed in a self-aligning manner between the select gate lines via a sidewall insulator film for the select transistor.

A third aspect of the present invention inheres in a nonvolatile semiconductor memory including: a device region and a device isolating region, which have a striped pattern that extends in a first direction, the device region and the device isolating region being alternately and sequentially disposed at a first pitch in a second direction that is perpendicular to the first direction; a plurality of word lines having a striped pattern extending in the second direction; a memory cell transistor configured to use corresponding word line as a control gate electrode; and a conductive material contact connected to the device region disposed at the first pitch in the second direction, and a bit line connected to the contact; wherein the contact is embedded and disposed in a self-aligning manner between the word lines via a sidewall insulator film of the memory cell transistor.

A fourth aspect of the present invention inheres in a fabrication method of a nonvolatile semiconductor memory including: forming a device isolating region, a memory cell transistor, a select transistor, and a peripheral transistor; forming a source/drain diffusion layer using the gate electrode of the memory cell transistor as a mask; depositing a sidewall insulator film of an oxide film; subjecting the sidewall insulator film to etching so that the sidewall insulator film remains between the sidewall of the select transistor and the memory cell transistor; depositing a barrier insulator film on the entire surface of the semiconductor substrate; and filling the area between the select transistors by depositing a first interlayer film.

BRIEF DESCRIPTION OF DRAWINGS

FIG. 23A is an aerial view of a pattern showing a step of the fabrication method of the nonvolatile semiconductor memory according to the first embodiment of the present invention;

FIG. 23B is a schematic cross-sectional structure cut along the line I-I;

FIG. 23C is a schematic cross-sectional structure cut along the line II-II;

FIG. 23D is a schematic cross-sectional structure of a transistor in the peripheral circuit;

FIG. 39A is an aerial view of a pattern showing a step of the fabrication method of the nonvolatile semiconductor memory according to the third embodiment of the present invention;

FIG. 39B is a schematic cross-sectional structure cut along the line I-I;

FIG. 39C is a schematic cross-sectional structure cut along the line II-II;

FIG. 39D is a schematic cross-sectional structure of a transistor in the peripheral circuit;

FIG. 40A is an aerial view of a pattern showing a step of the fabrication method of the nonvolatile semiconductor memory according to the third embodiment of the present invention;

FIG. 40B is a schematic cross-sectional structure cut along the line I-I;

FIG. 40C is a schematic cross-sectional structure cut along the line II-II;

FIG. 40D is a schematic cross-sectional structure of a transistor in the peripheral circuit;

FIG. 41A is an aerial view of a pattern showing a step of the fabrication method of the nonvolatile semiconductor memory according to the third embodiment of the present invention;

FIG. 41B is a schematic cross-sectional structure cut along the line I-I;

FIG. 41C is a schematic cross-sectional structure cut along the line II-II;

FIG. 41D is a schematic cross-sectional structure of a transistor in the peripheral circuit;

Figure 42A:
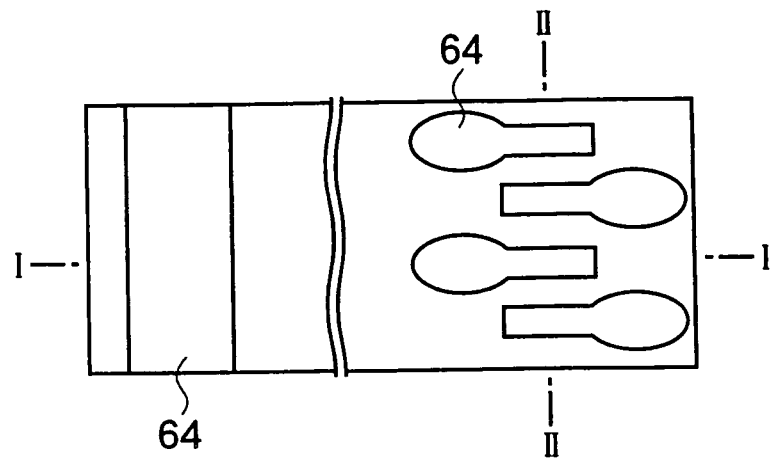
Figure 42B:
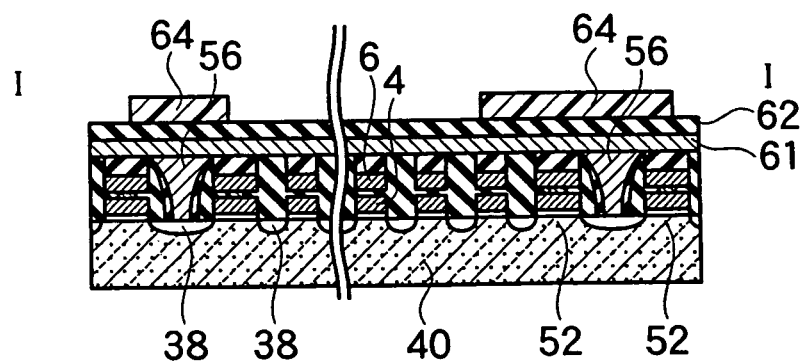
Figure 42C:
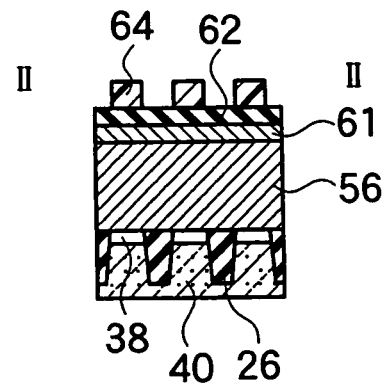
Figure 42D:
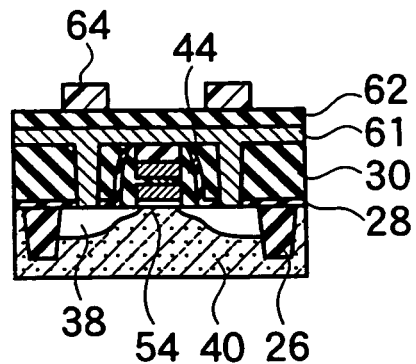
Figure 43A:
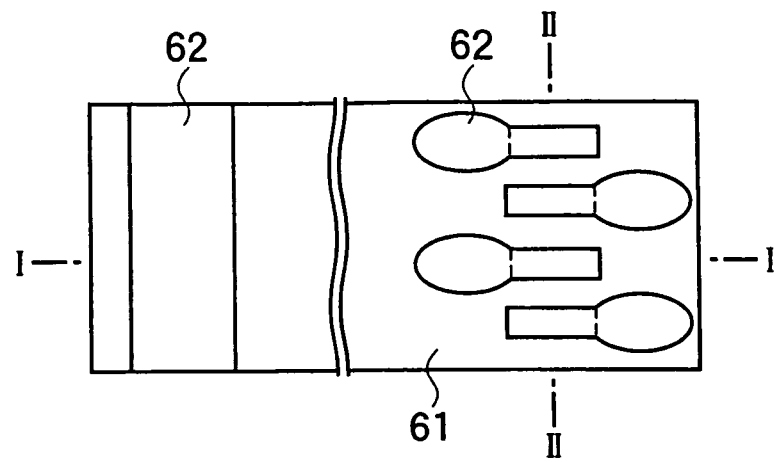
Figure 43B:
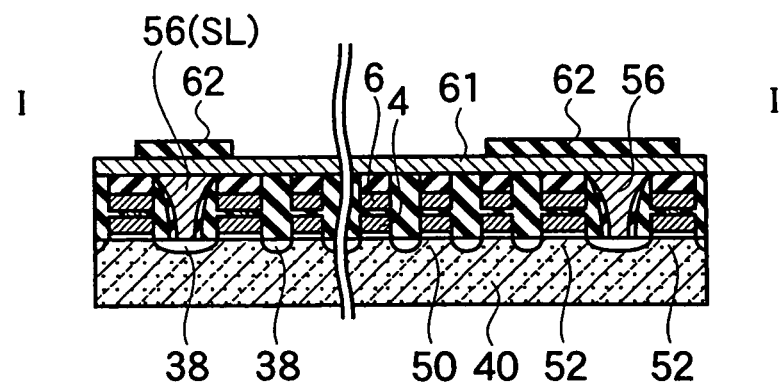
Figure 43C:
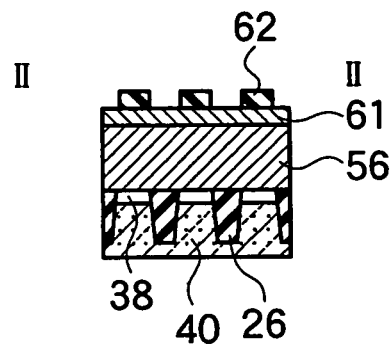
Figure 43D:
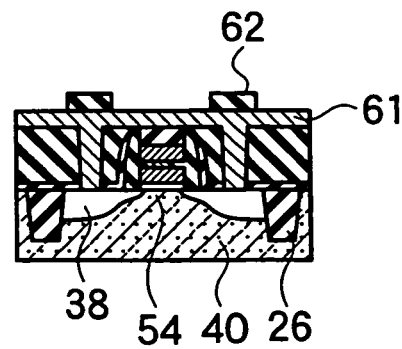
Figure 44A:
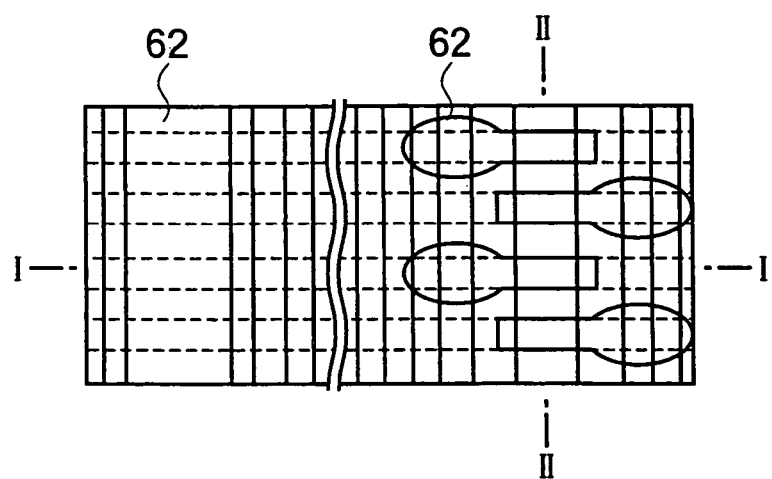
Figure 44B:
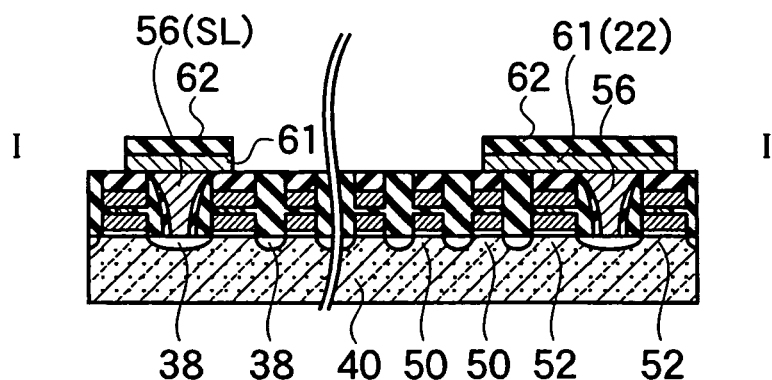
Figure 44C:
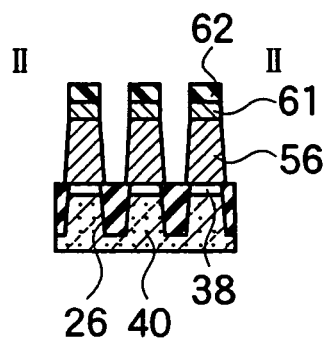
Figure 44D:
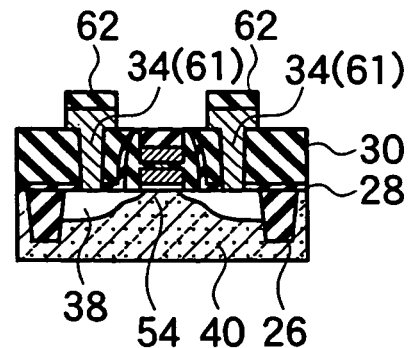
Figure 45A:
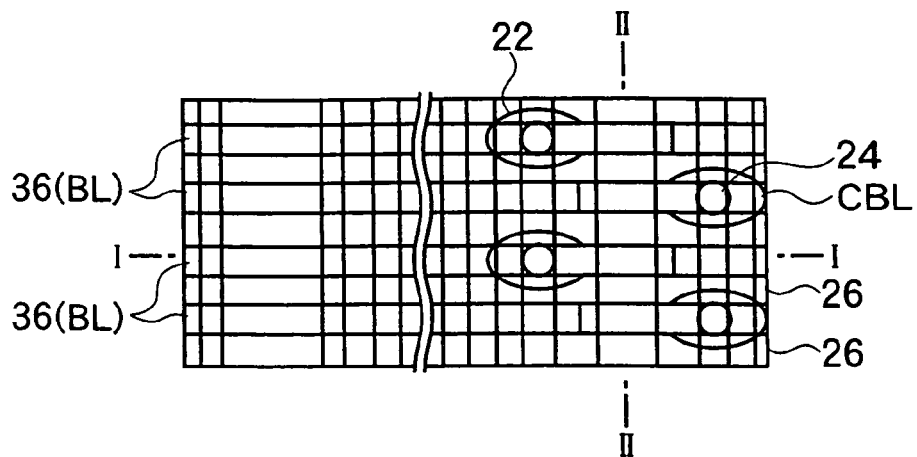
Figure 45B:
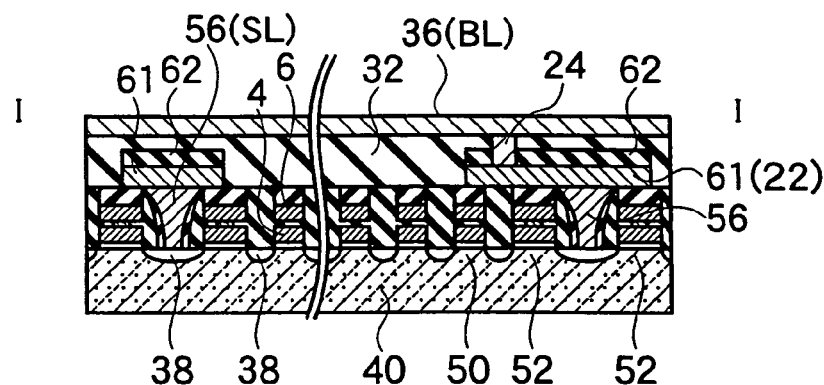
Figure 45C:
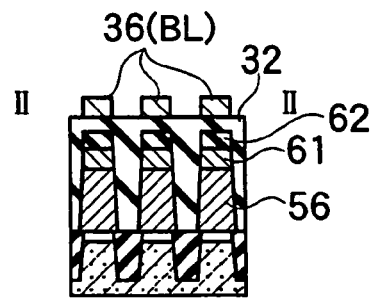
Figure 45D:
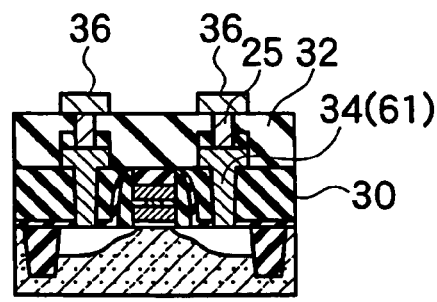
Figure 46:
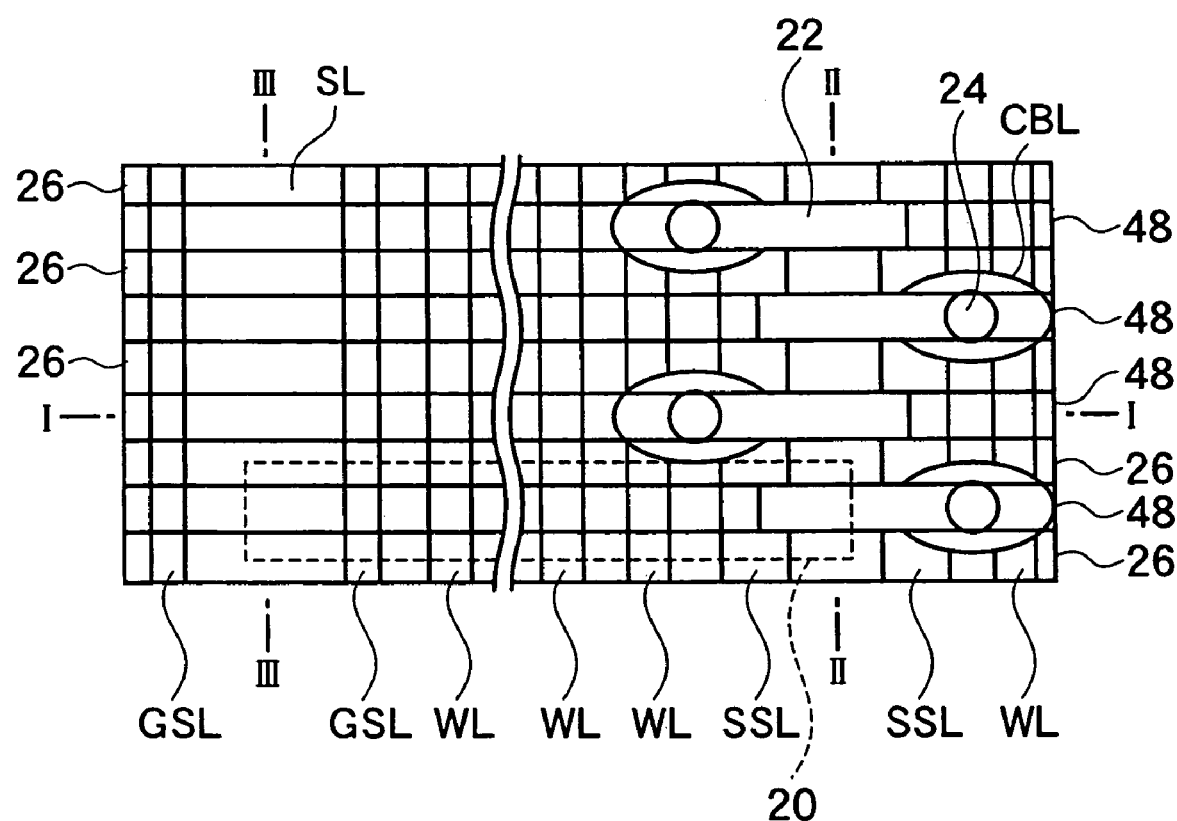
Figure 47A:
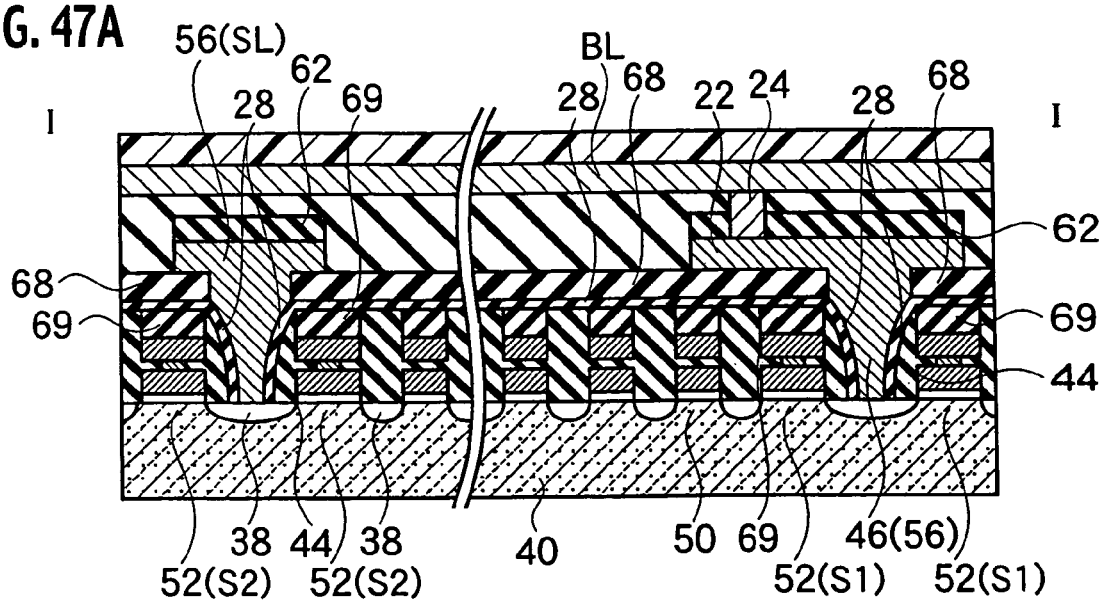
Figure 47B:
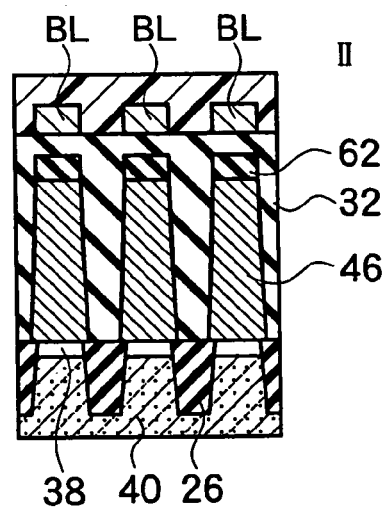
Figure 47C:
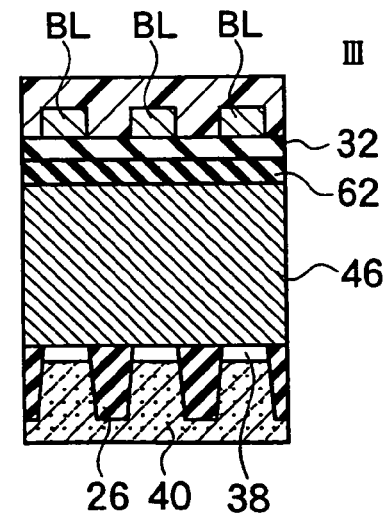
Figure 48:
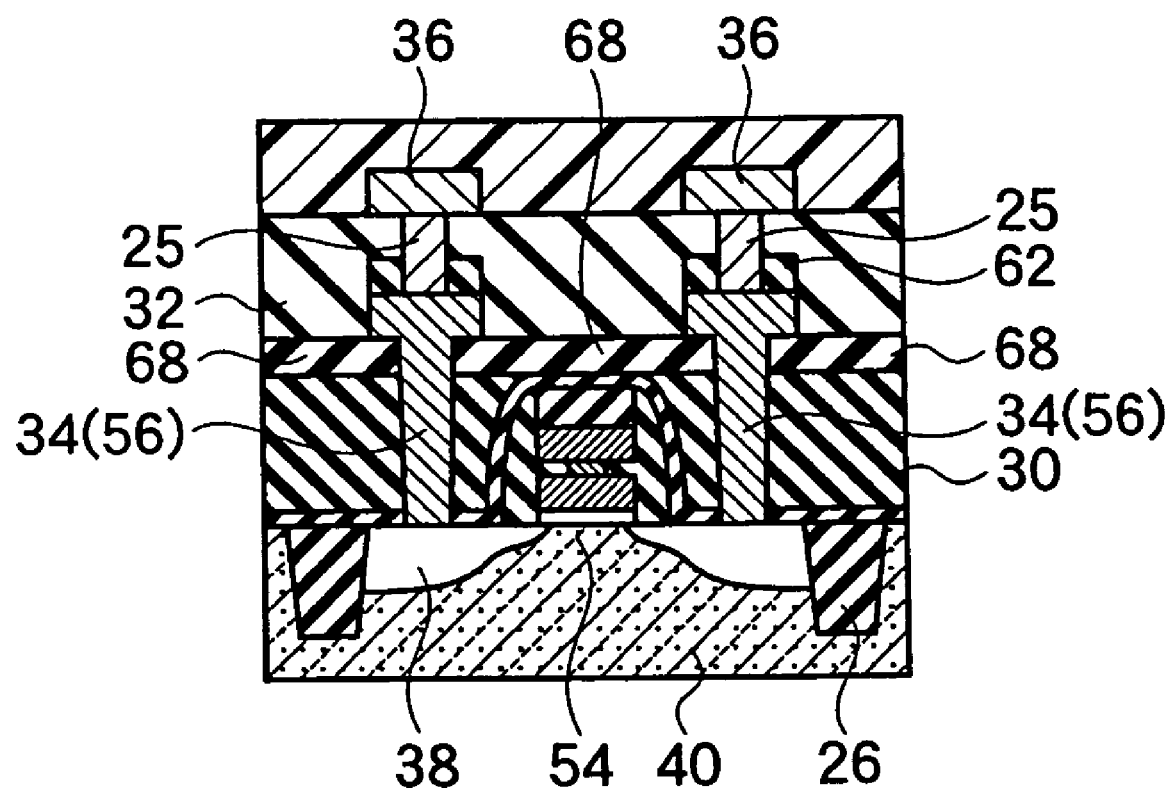
Figure 49A:
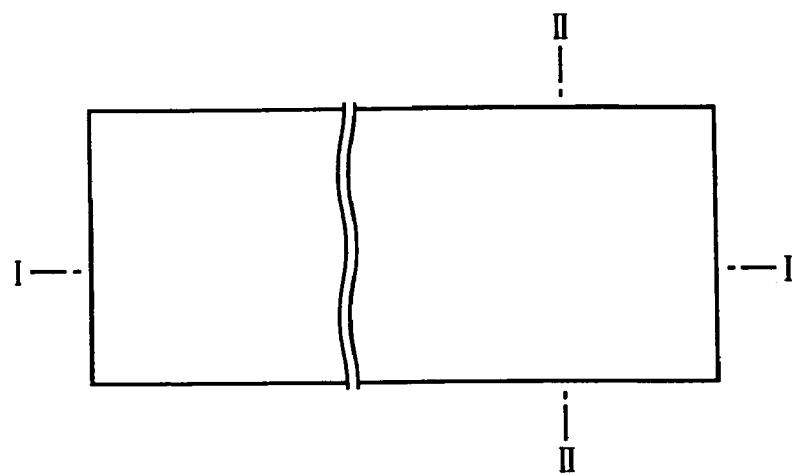
Figure 49B:
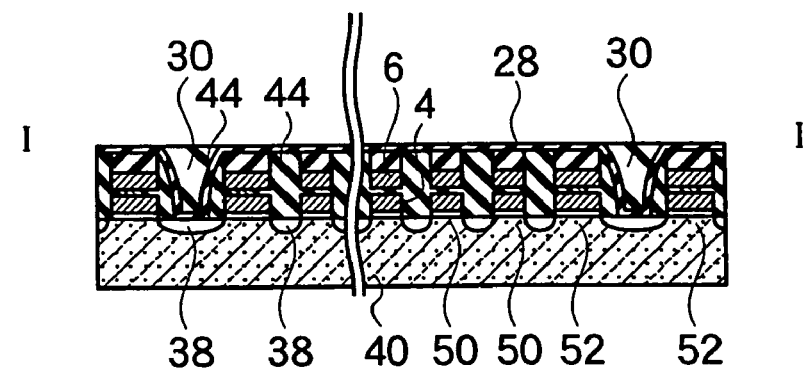
Figure 49C:
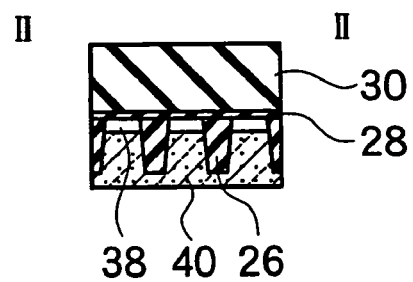
Figure 49D:
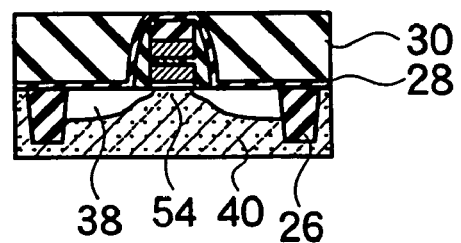
Figure 50A:
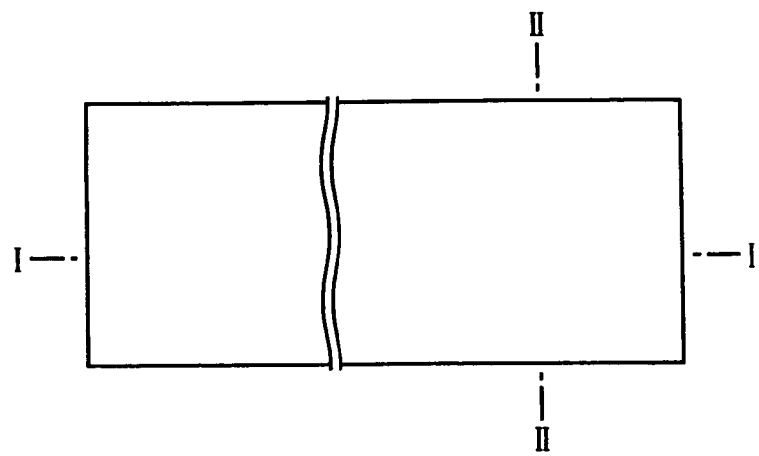
Figure 50B:
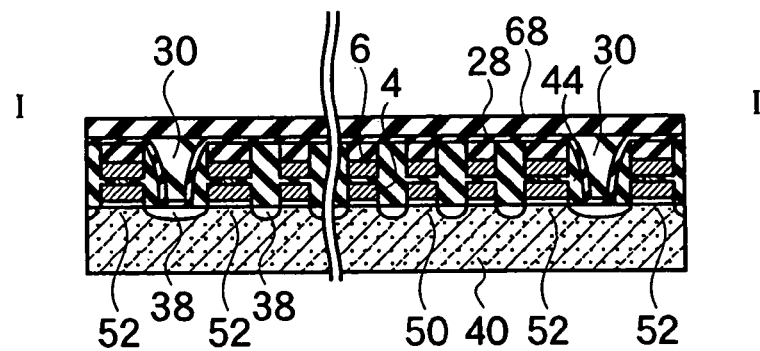
Figure 50C:
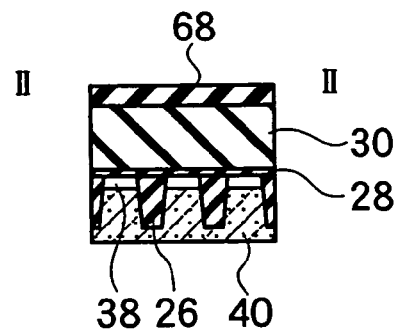
Figure 50D:
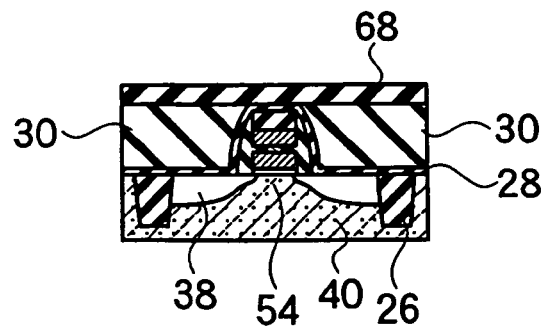
Figure 51A:
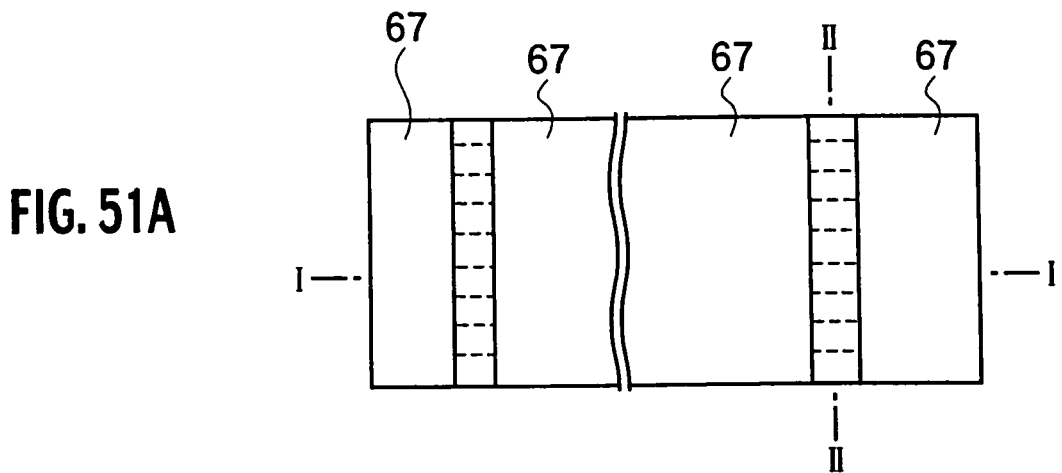
Figure 51B:
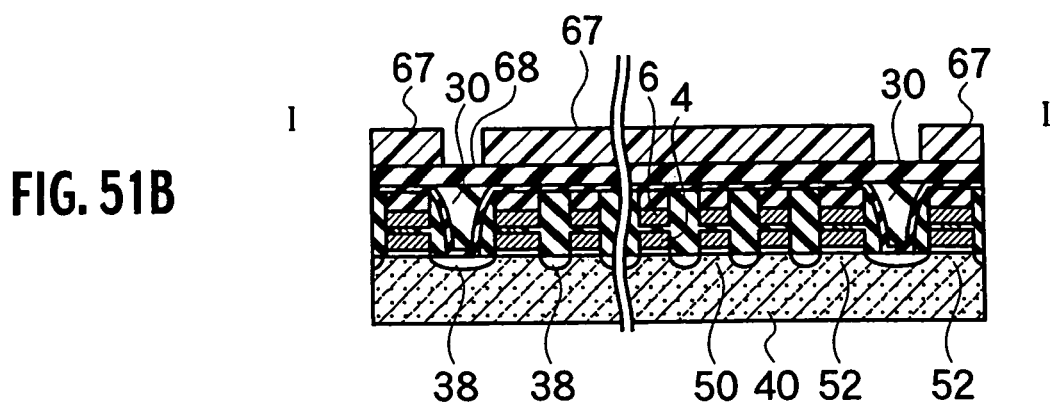
Figure 51C:
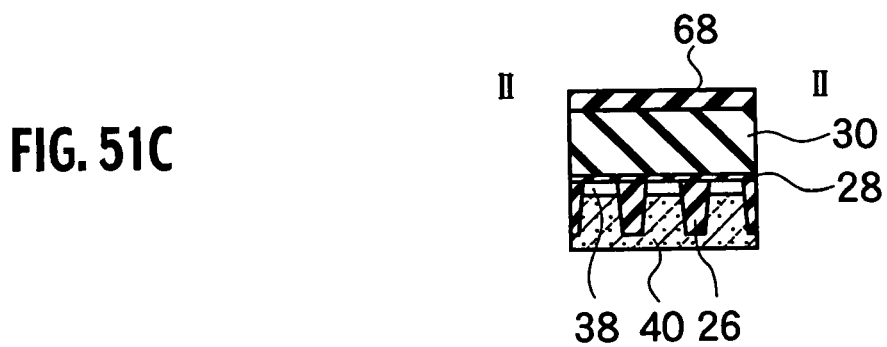
Figure 51D:
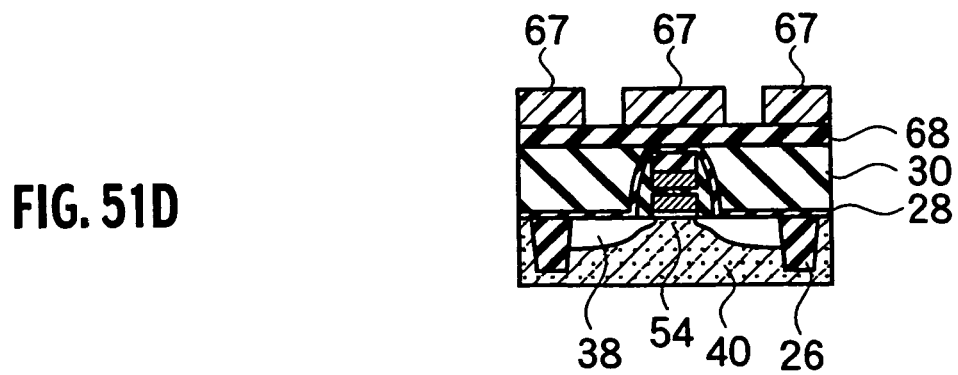
Figure 52A:
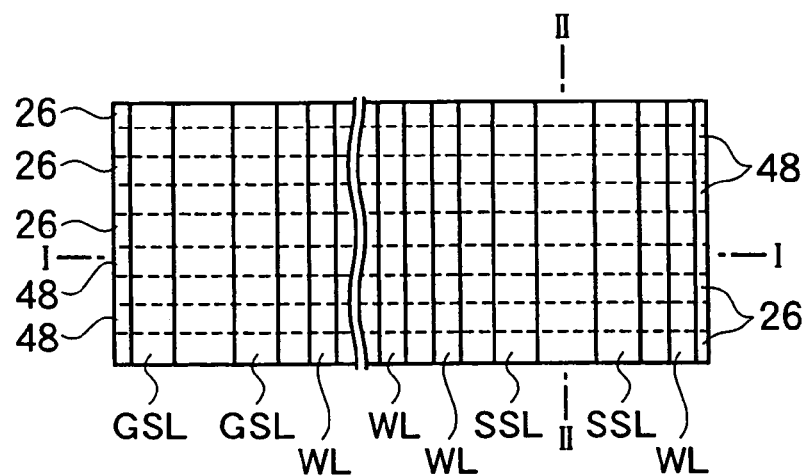
Figure 52B:
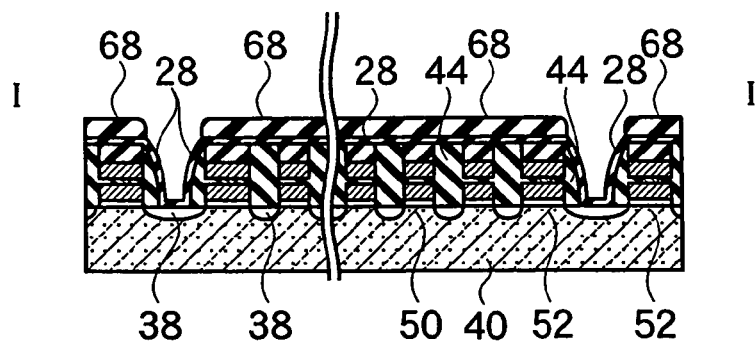
Figure 52C:
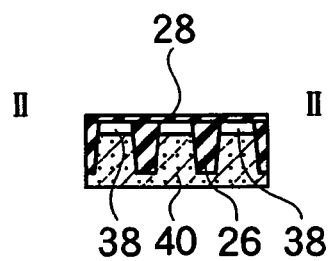
Figure 52D:
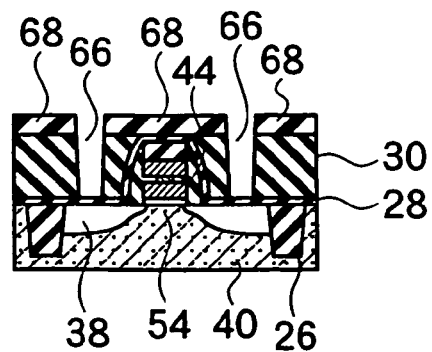
Figure 53A:
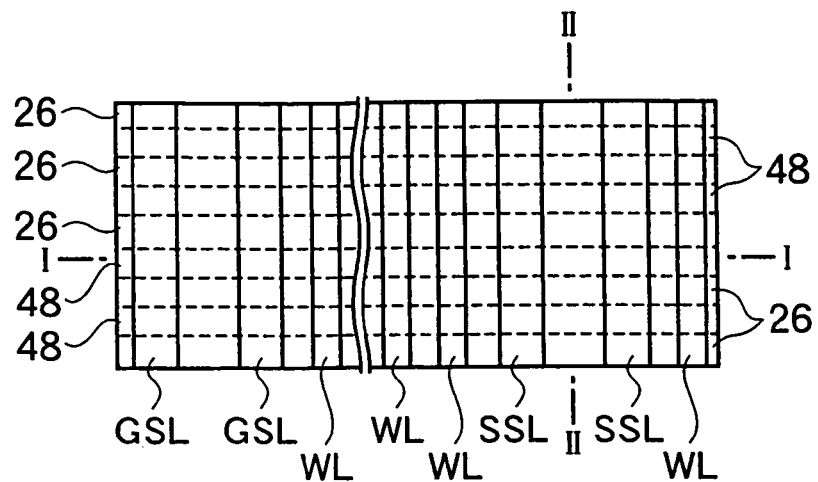
Figure 53B:
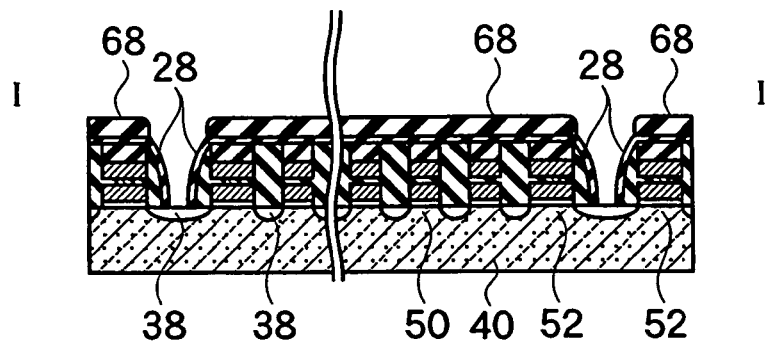
Figure 53C:
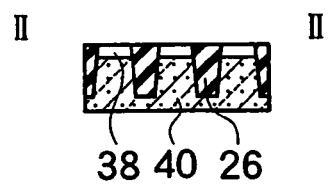
Figure 53D:
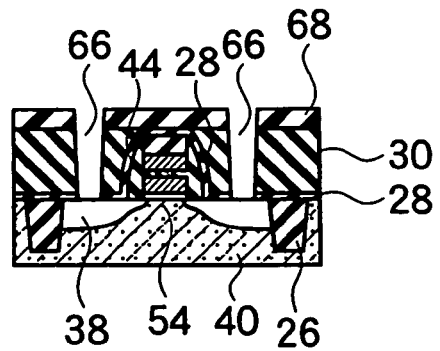
Figure 54A:
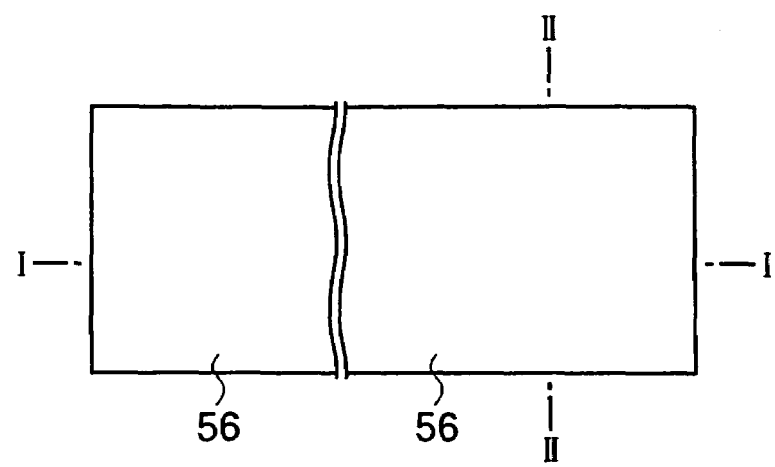
Figure 54B:
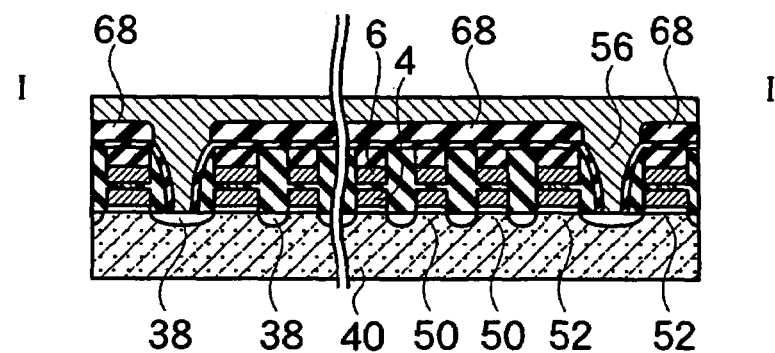
Figure 54C:
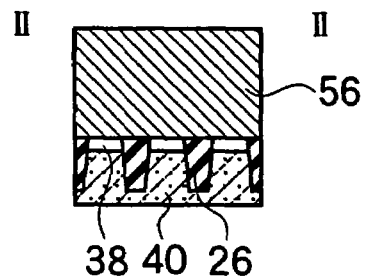
Figure 54D:
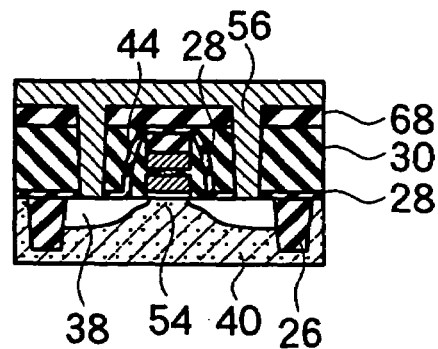
Figure 55A:
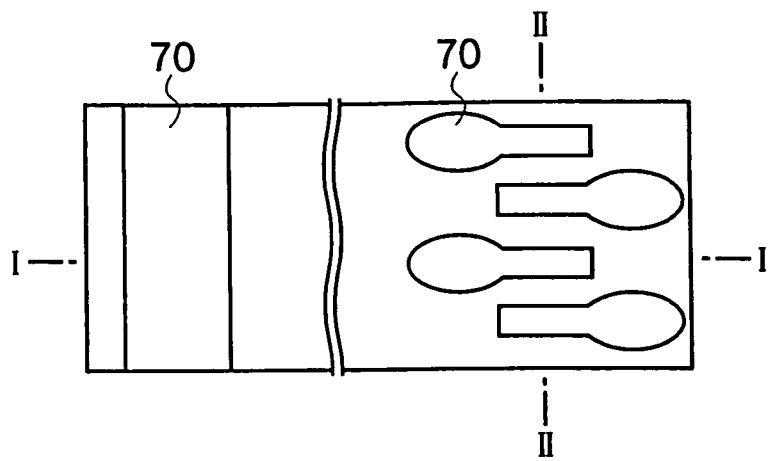
Figure 55B:
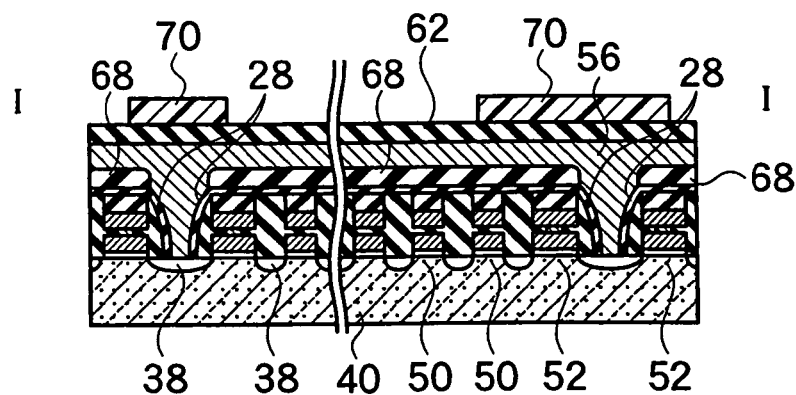
Figure 55C:
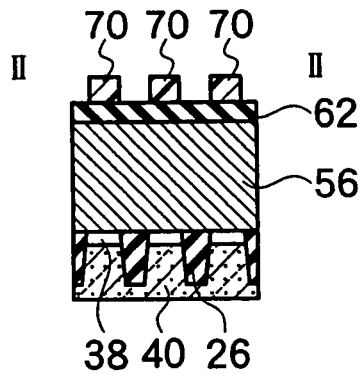
Figure 55D:
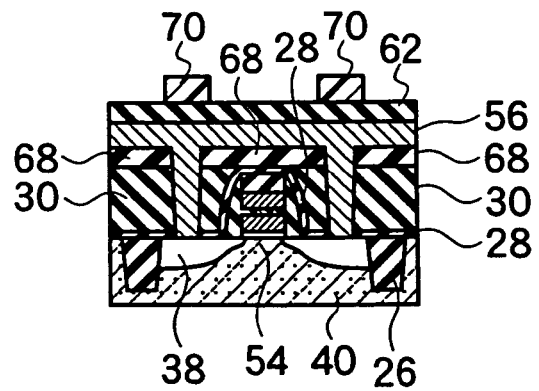
Figure 56A:
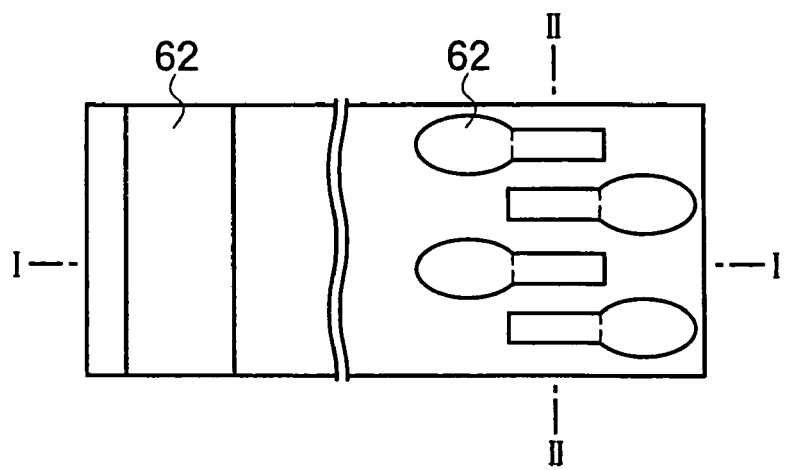
Figure 56B:
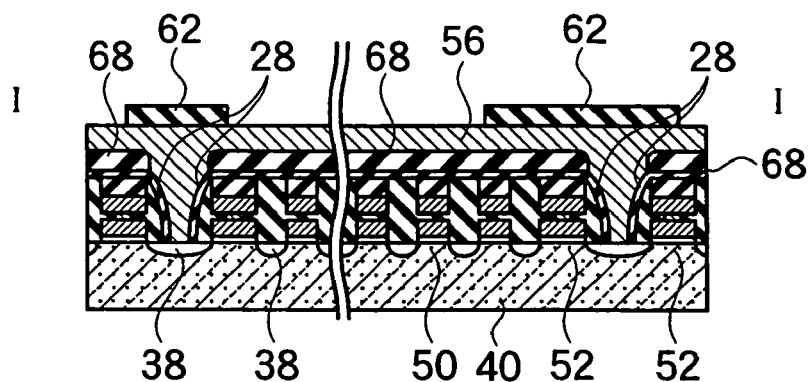
Figure 56C:
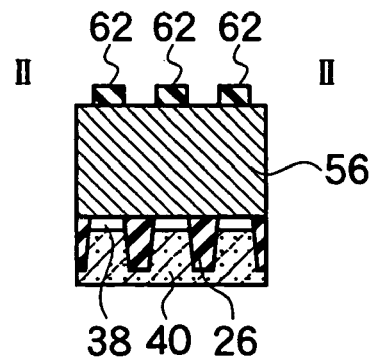
Figure 56D:
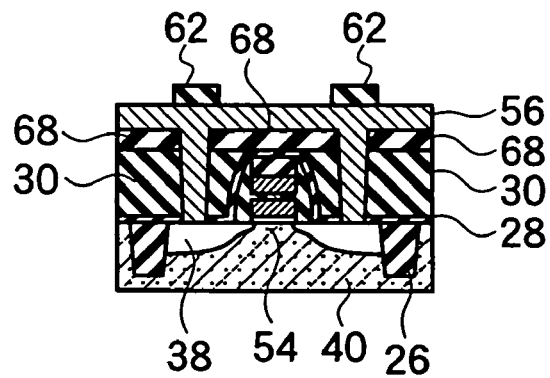
Figure 57A:
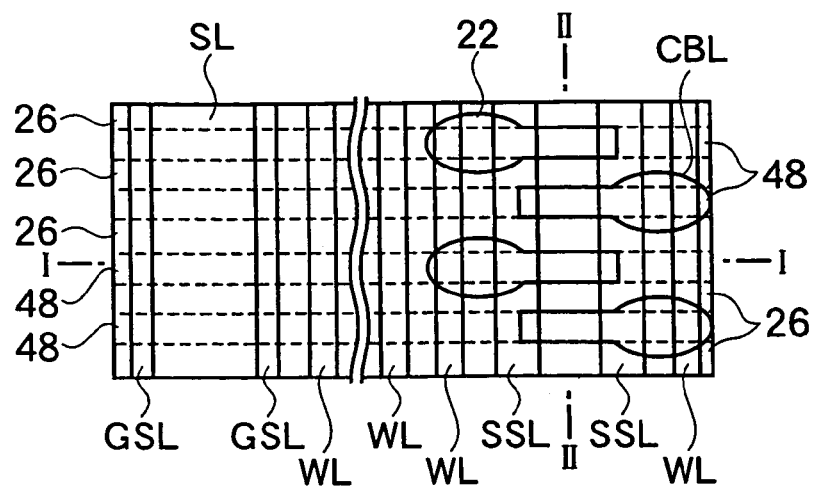
Figure 57B:
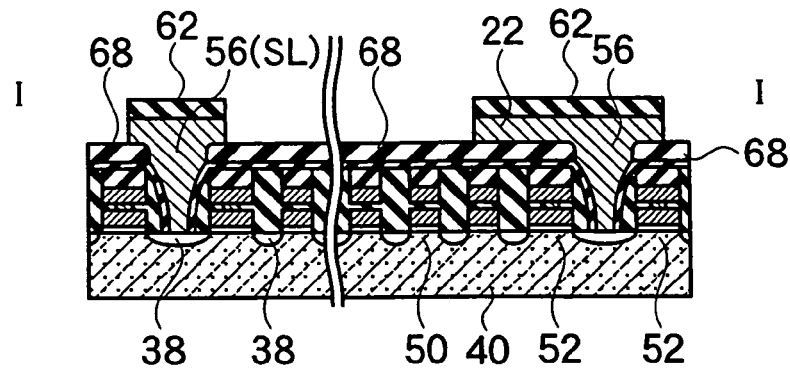
Figure 57C:
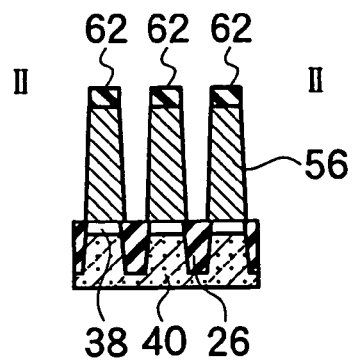
Figure 57D:
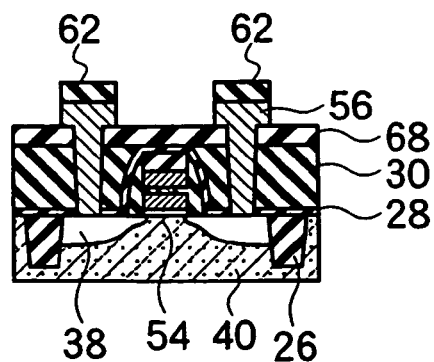
Figure 58A:
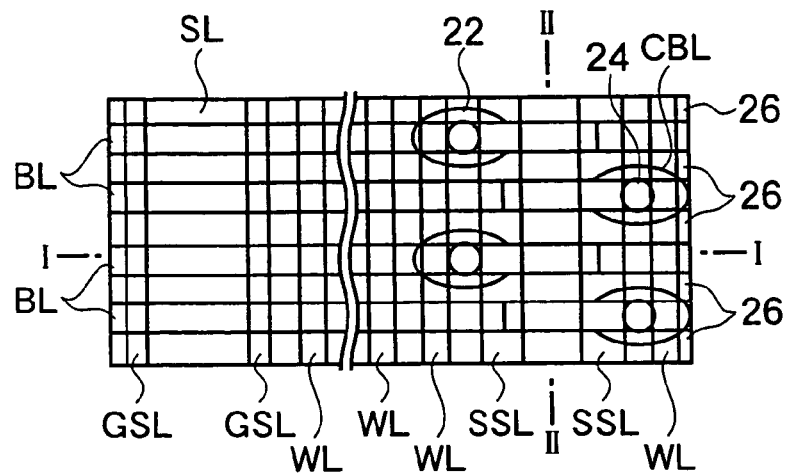
Figure 58B:
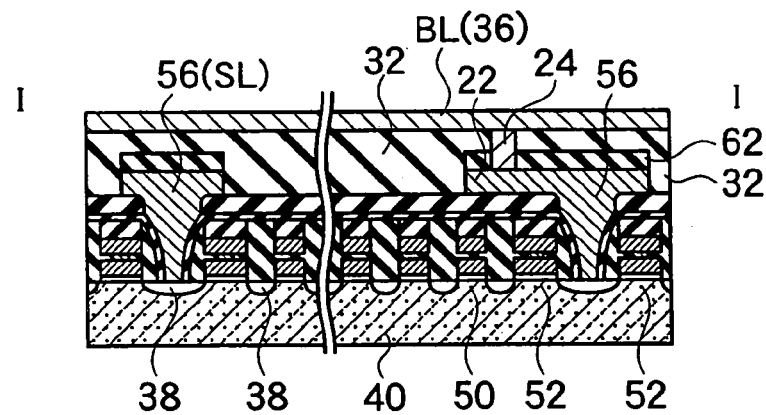
Figure 58C:
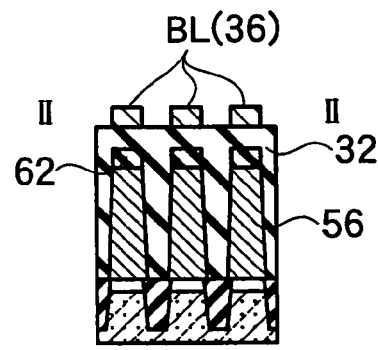
Figure 58D:
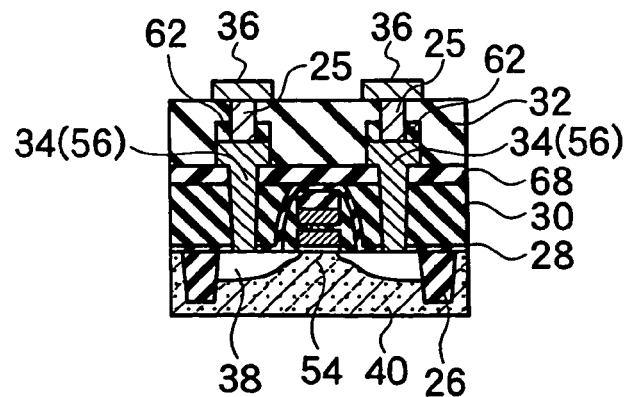
Figure 59:
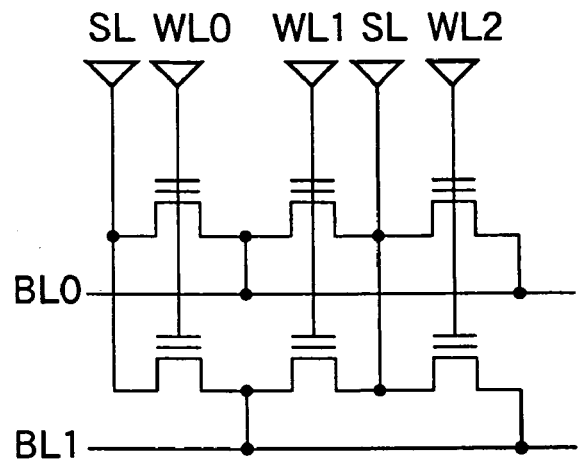
Figure 60:
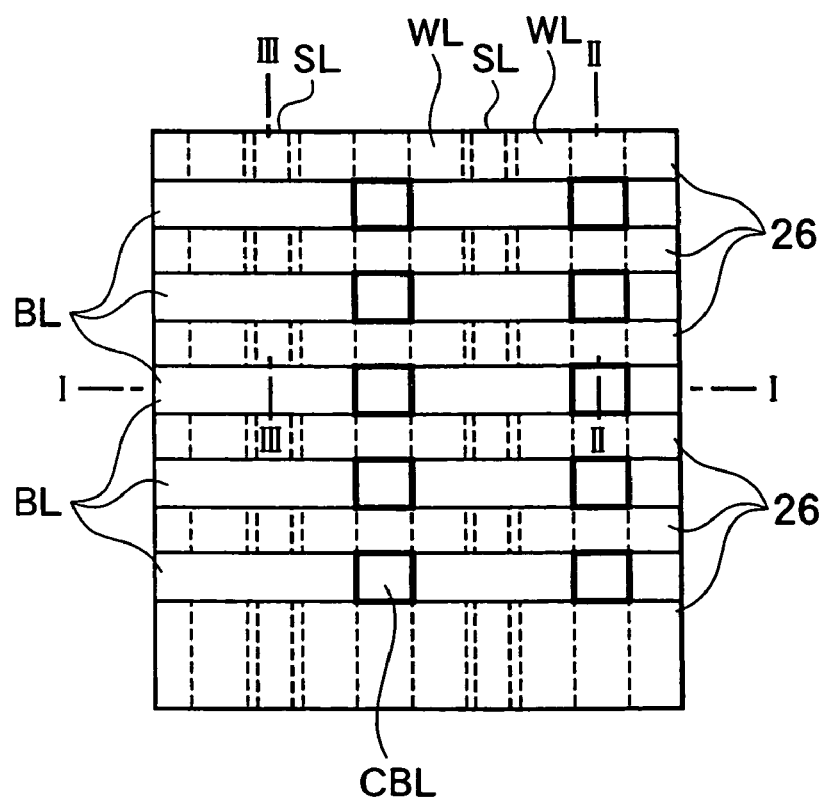
Figure 61:
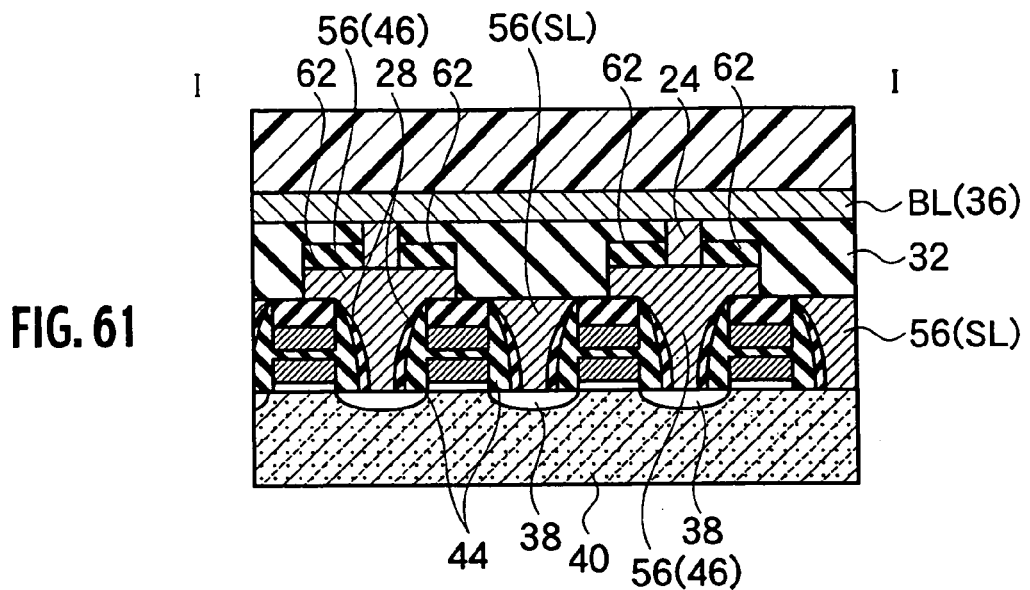
Figure 62:
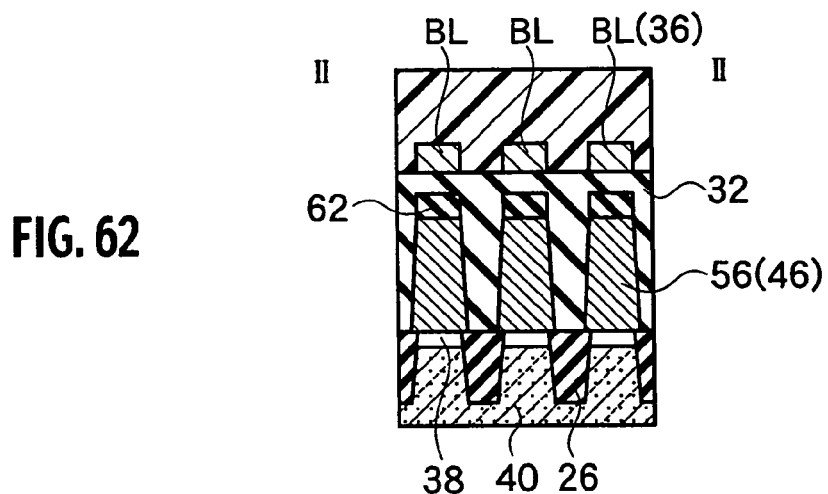
Figure 63:
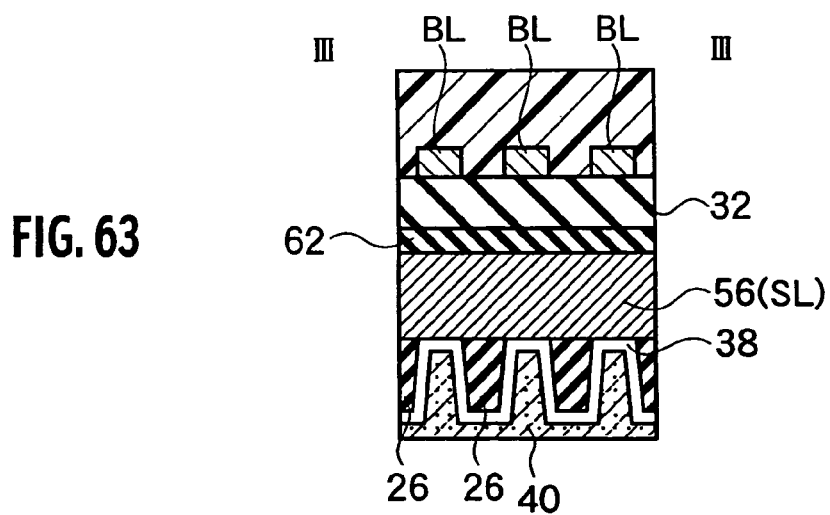
Figure 64:
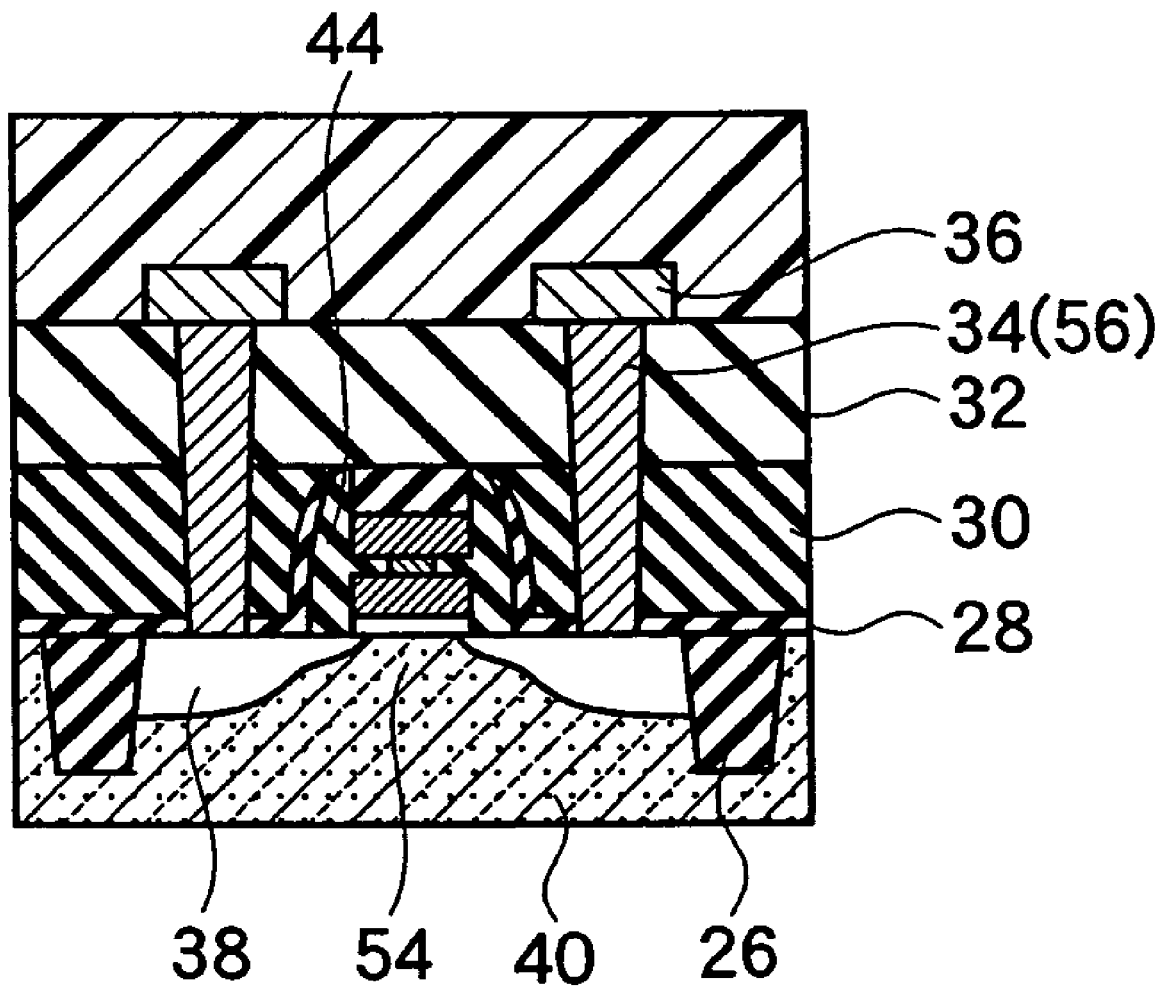
Figure 65:
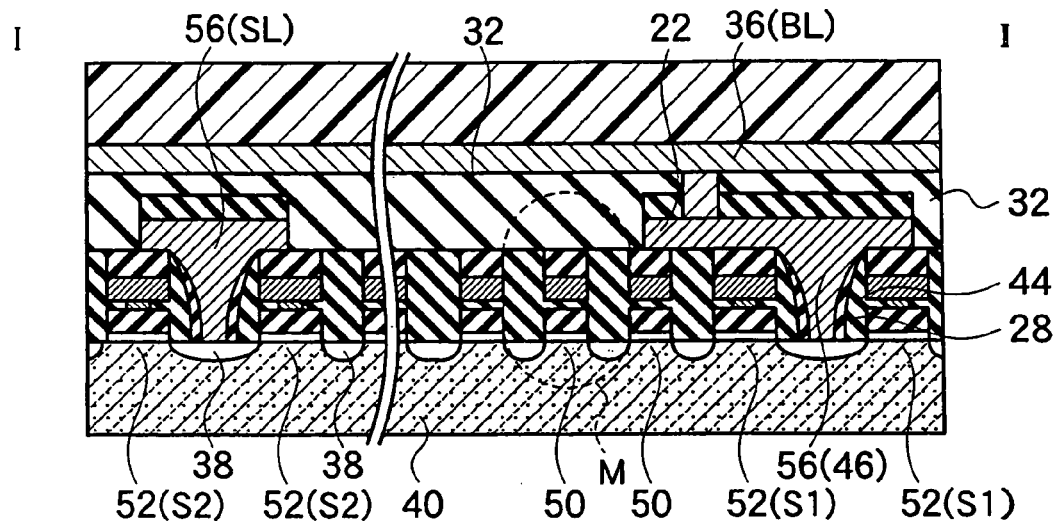
Figure 66:
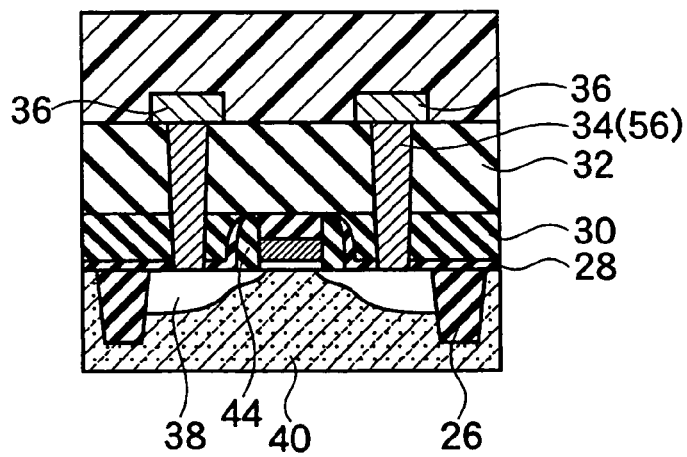
Figure 67:
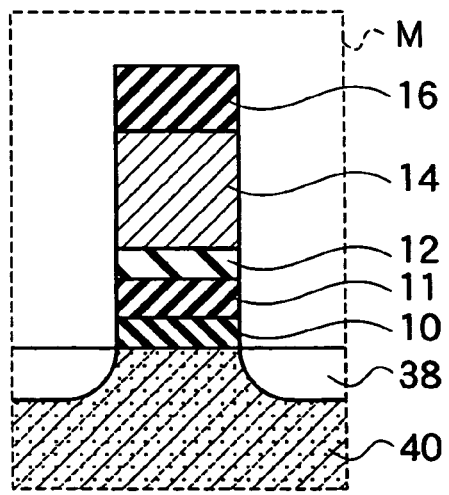
Figure 68:
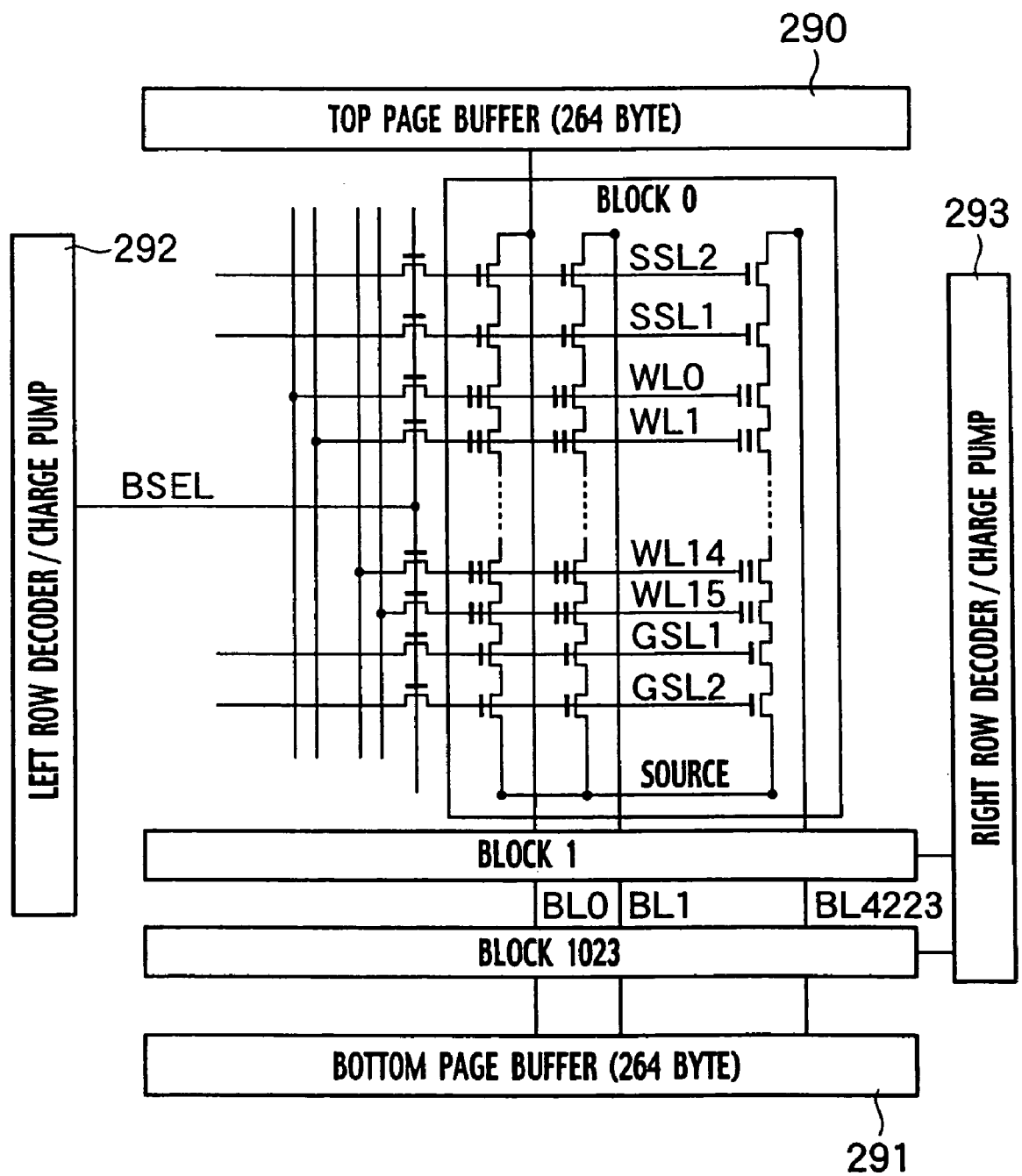
Figure 69:
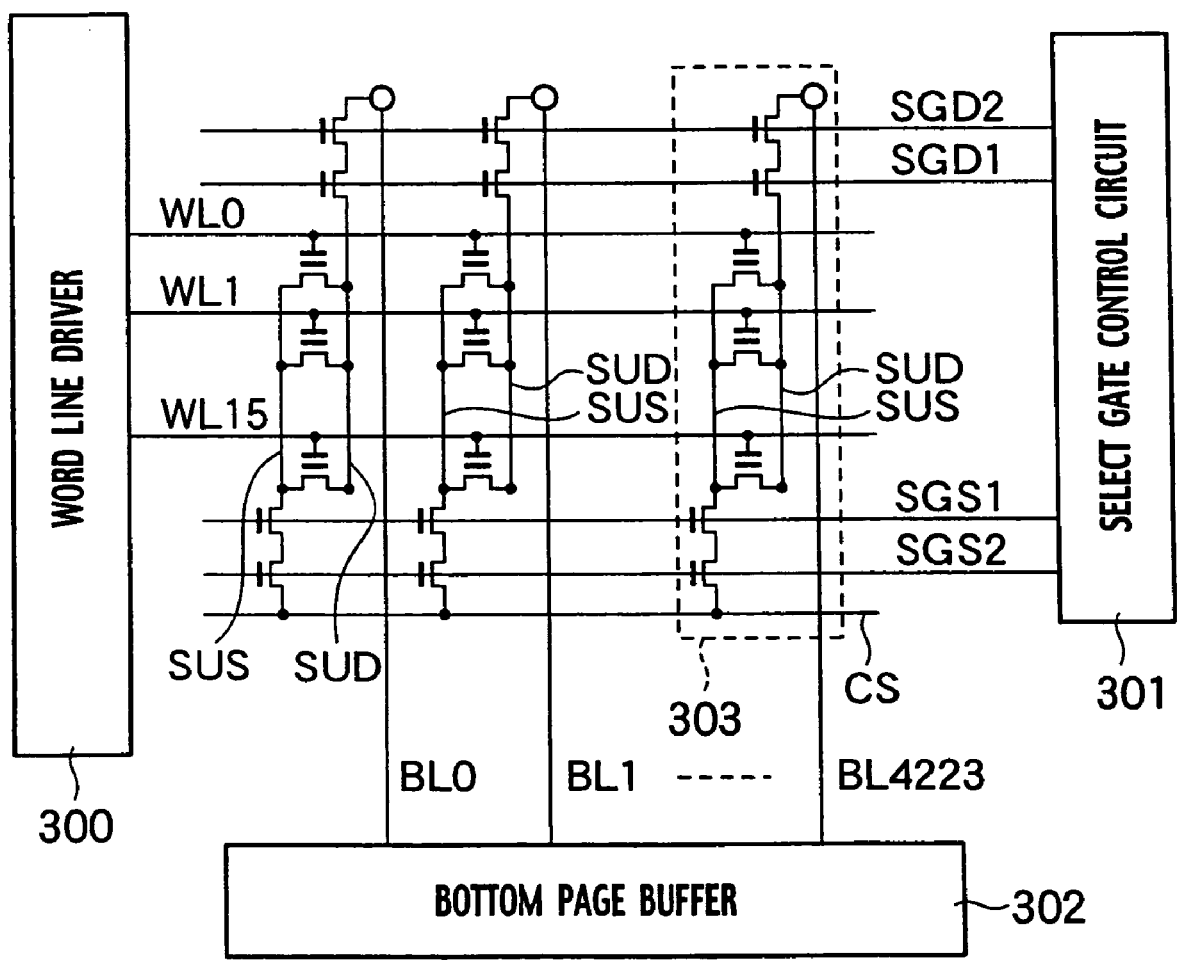
Figure 70:
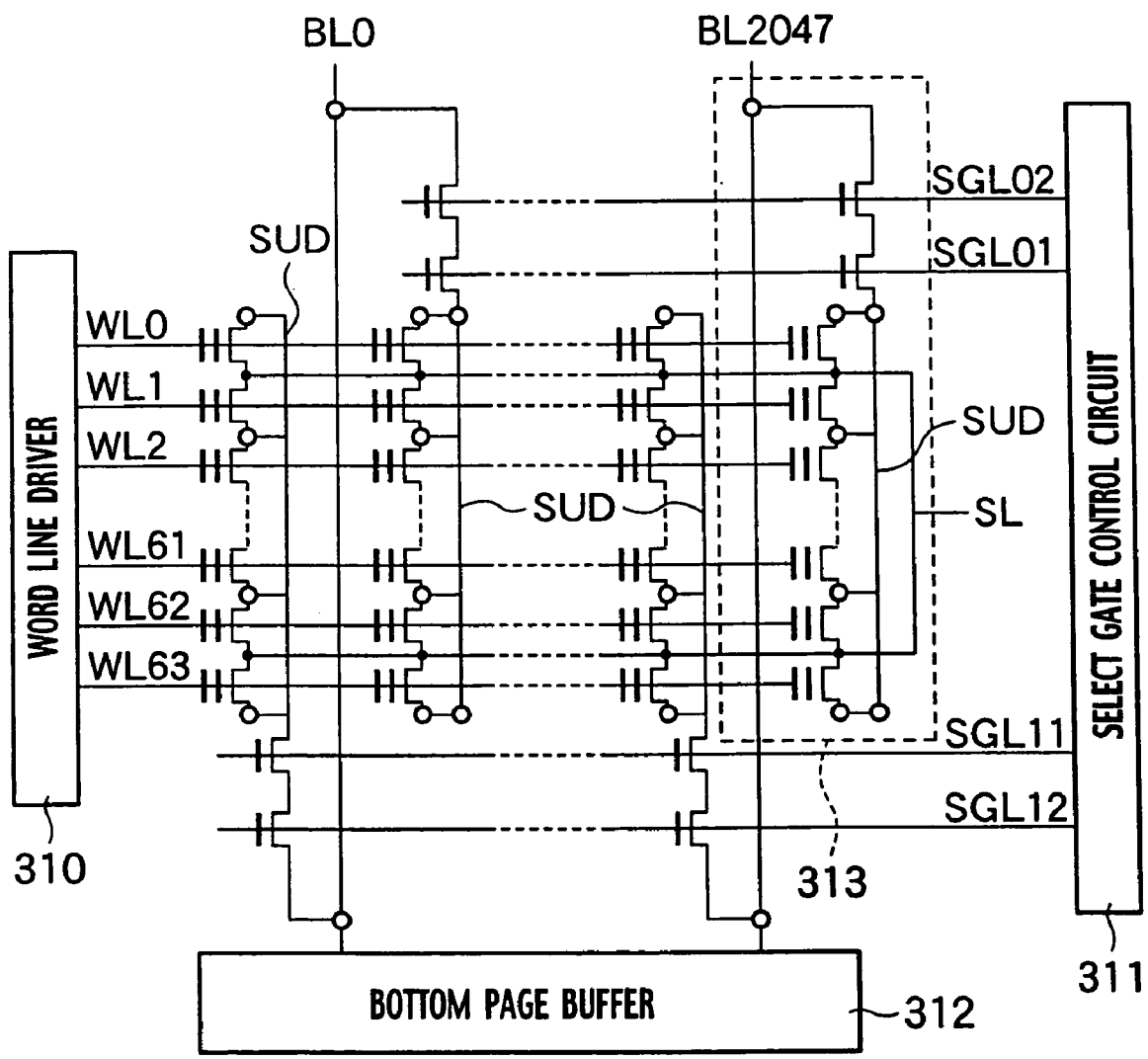
Figure 71:
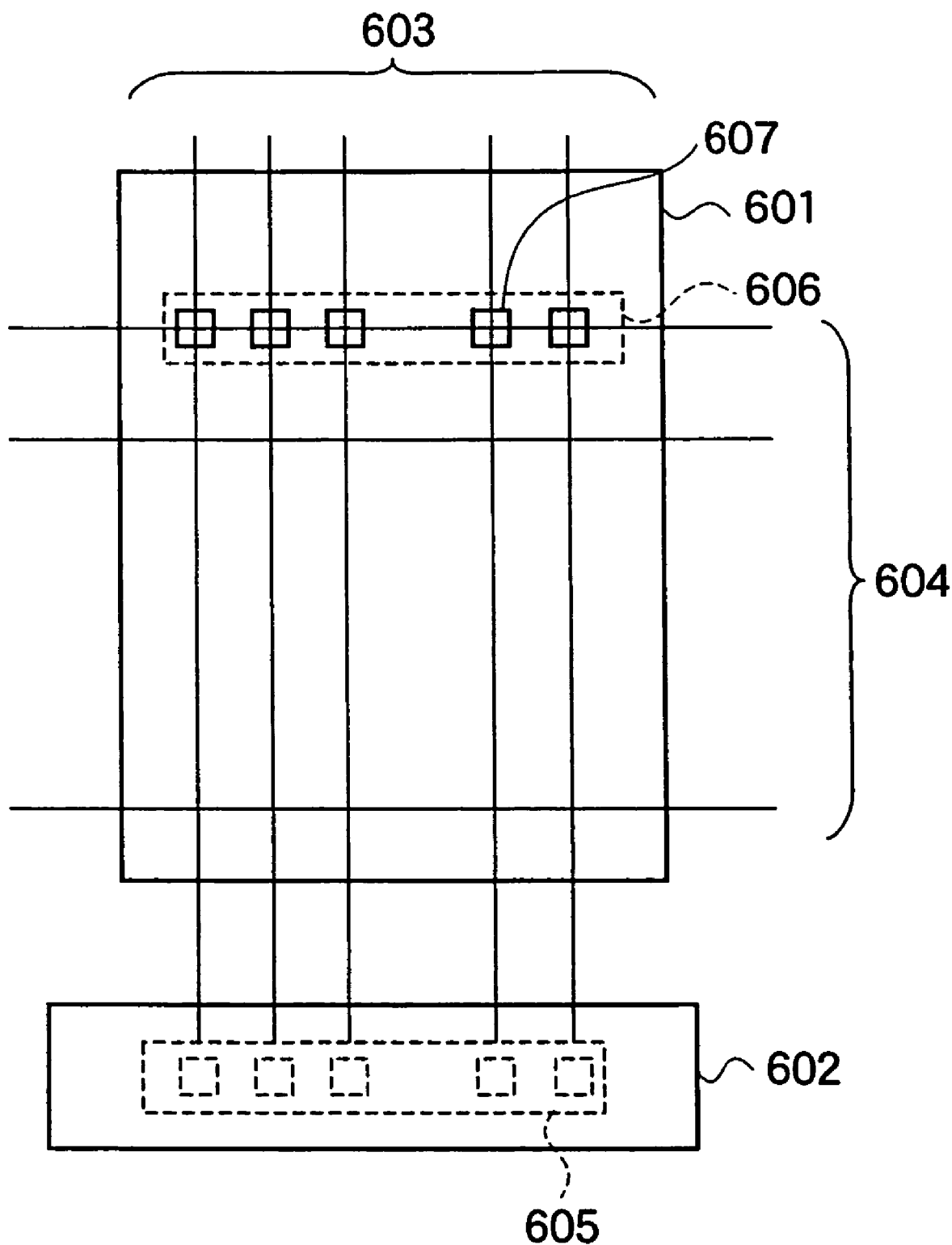
Figure 72:
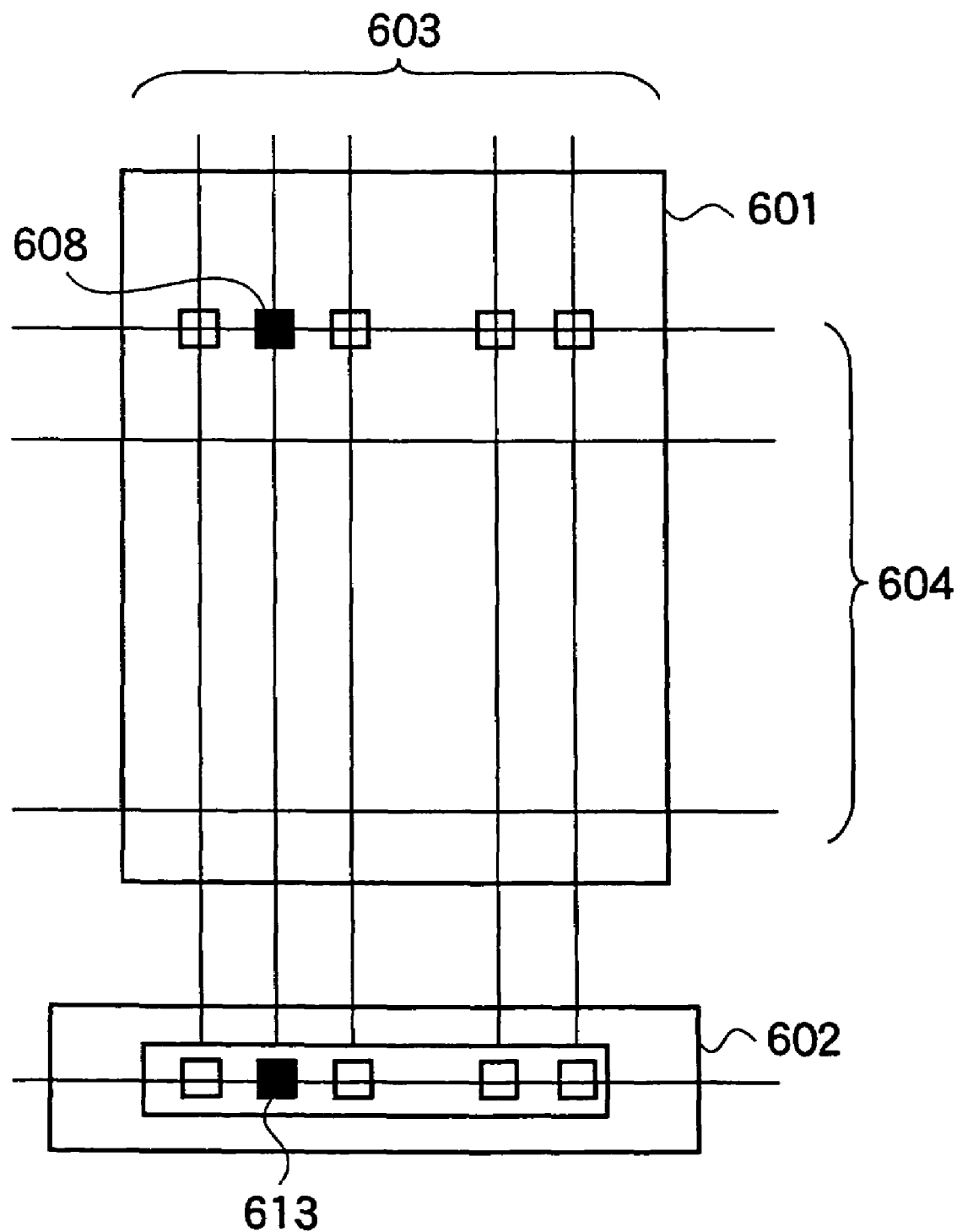
Figure 73:
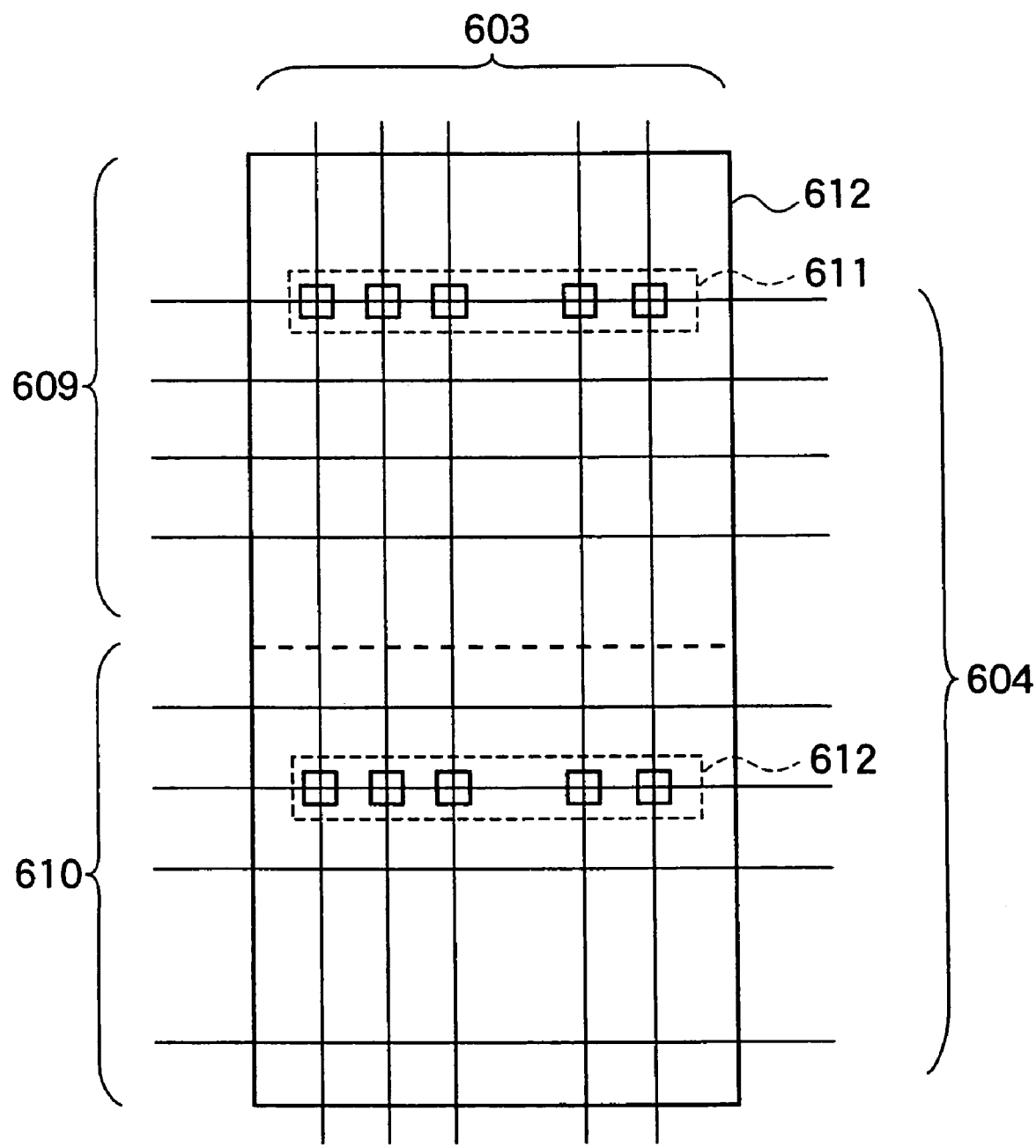
Figure 74:
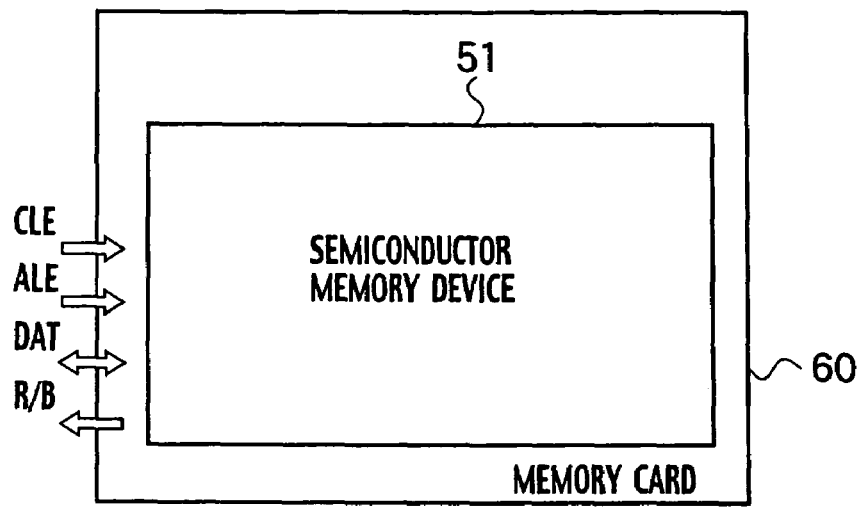
Figure 75:
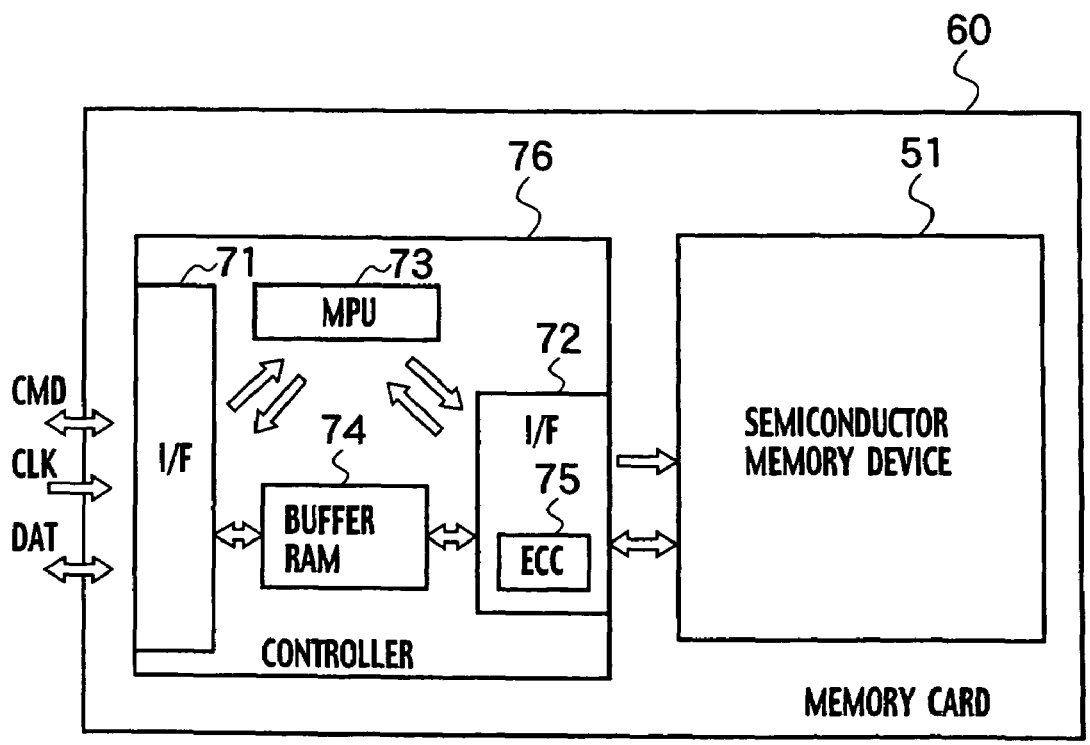
Figure 76:
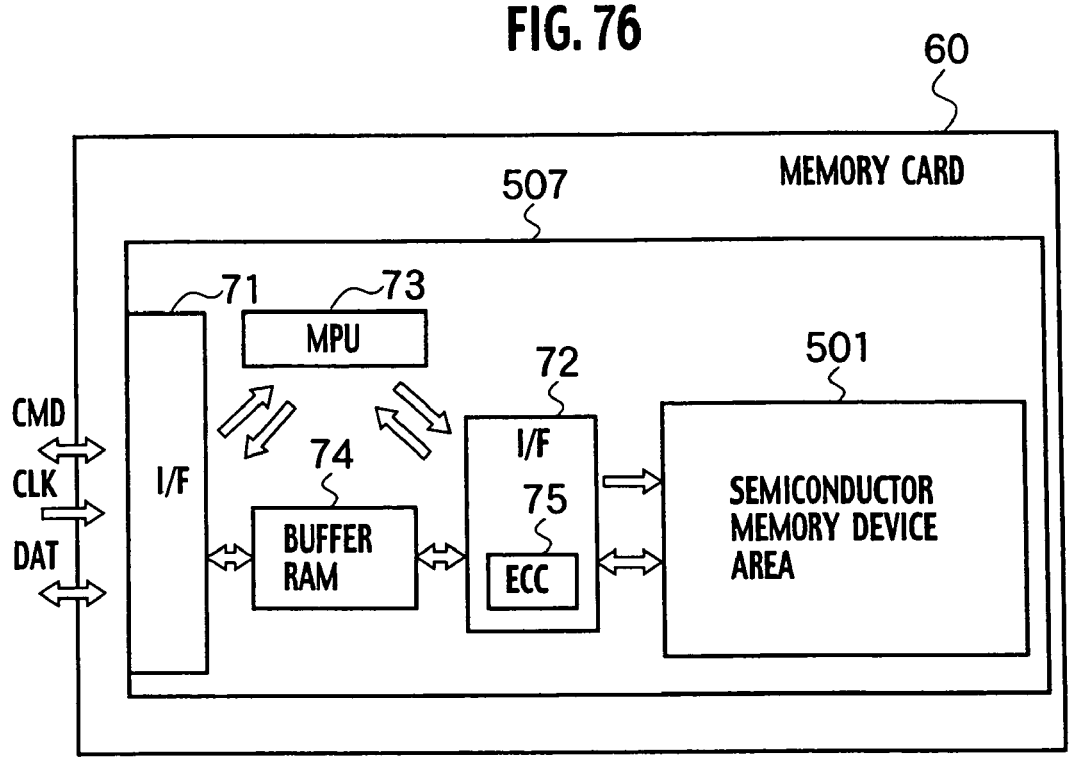
Figure 77:
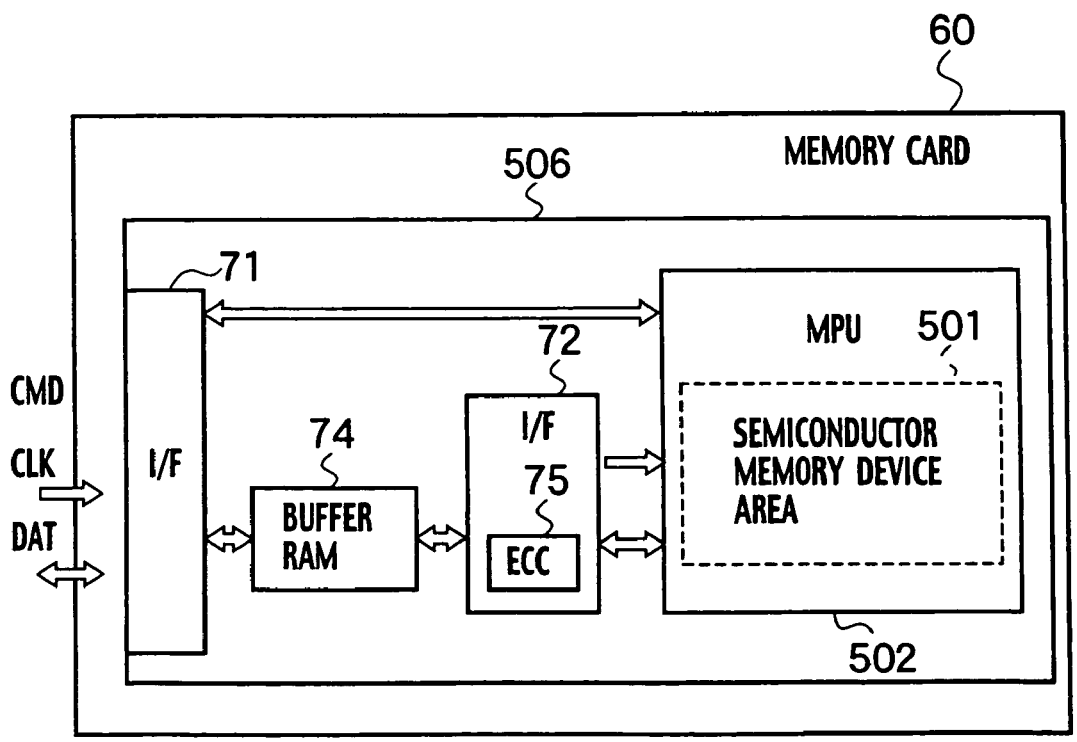
Figure 78:
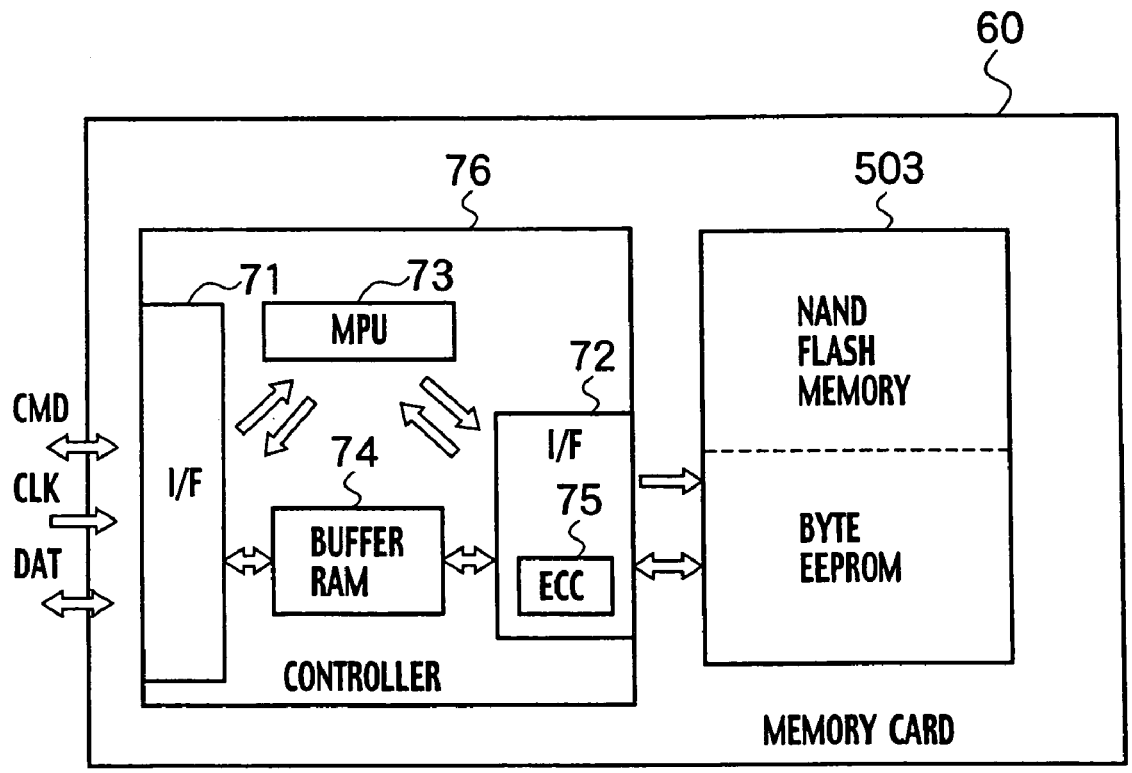
Figure 79:
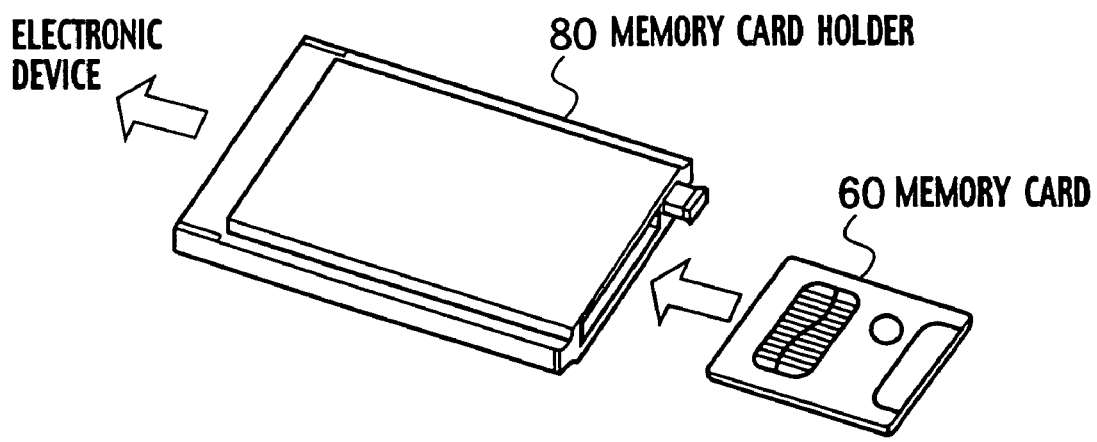
Figure 80:
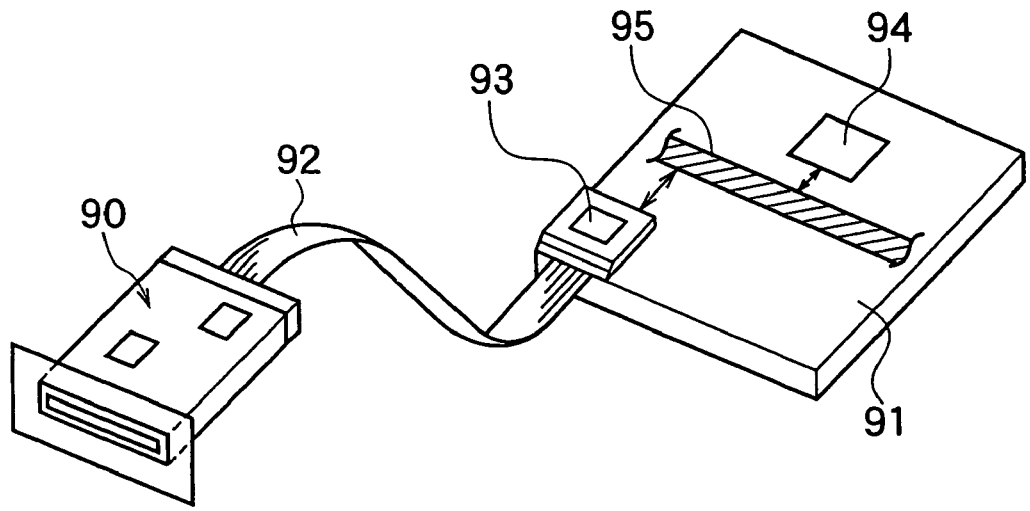
Figure 81:
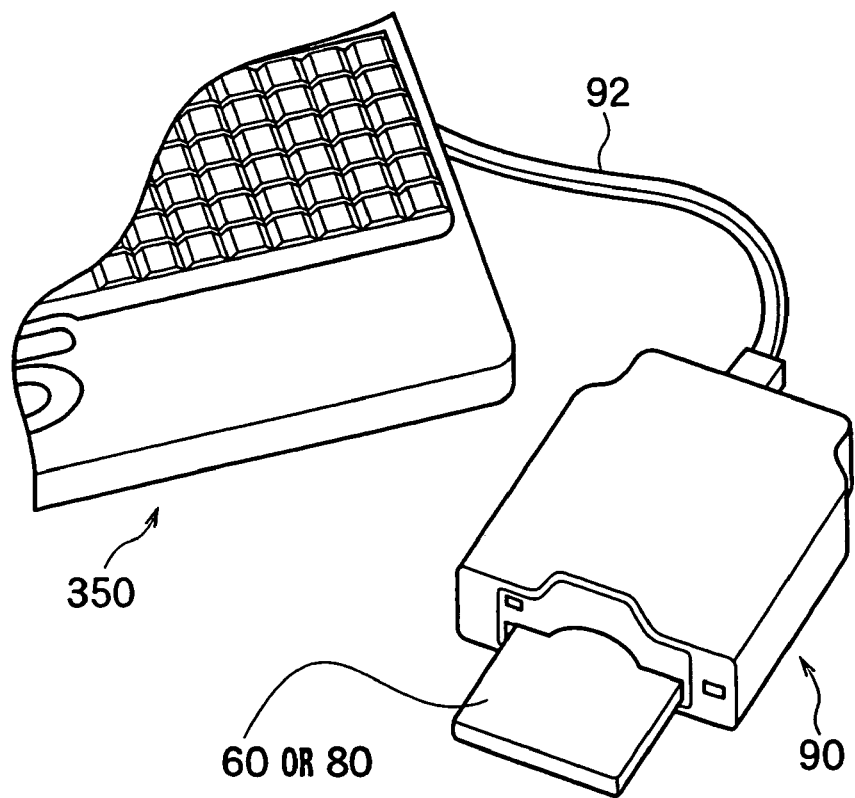
Figure 82:
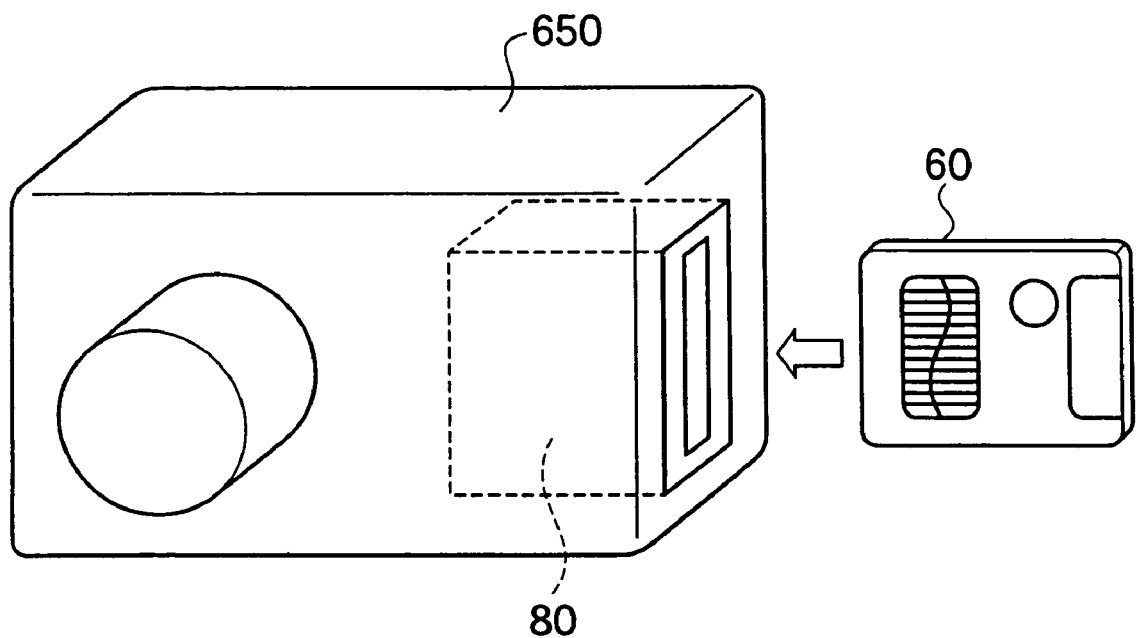
Figure 83:
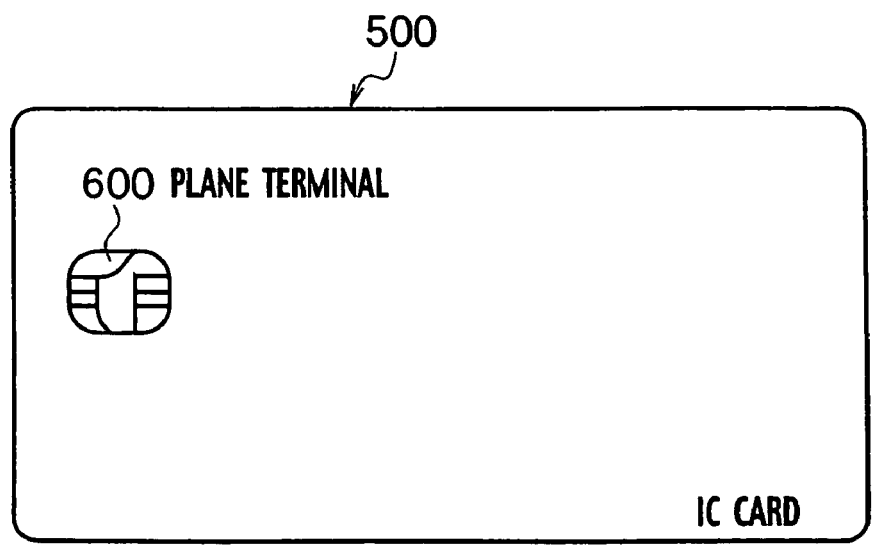
Figure 84:
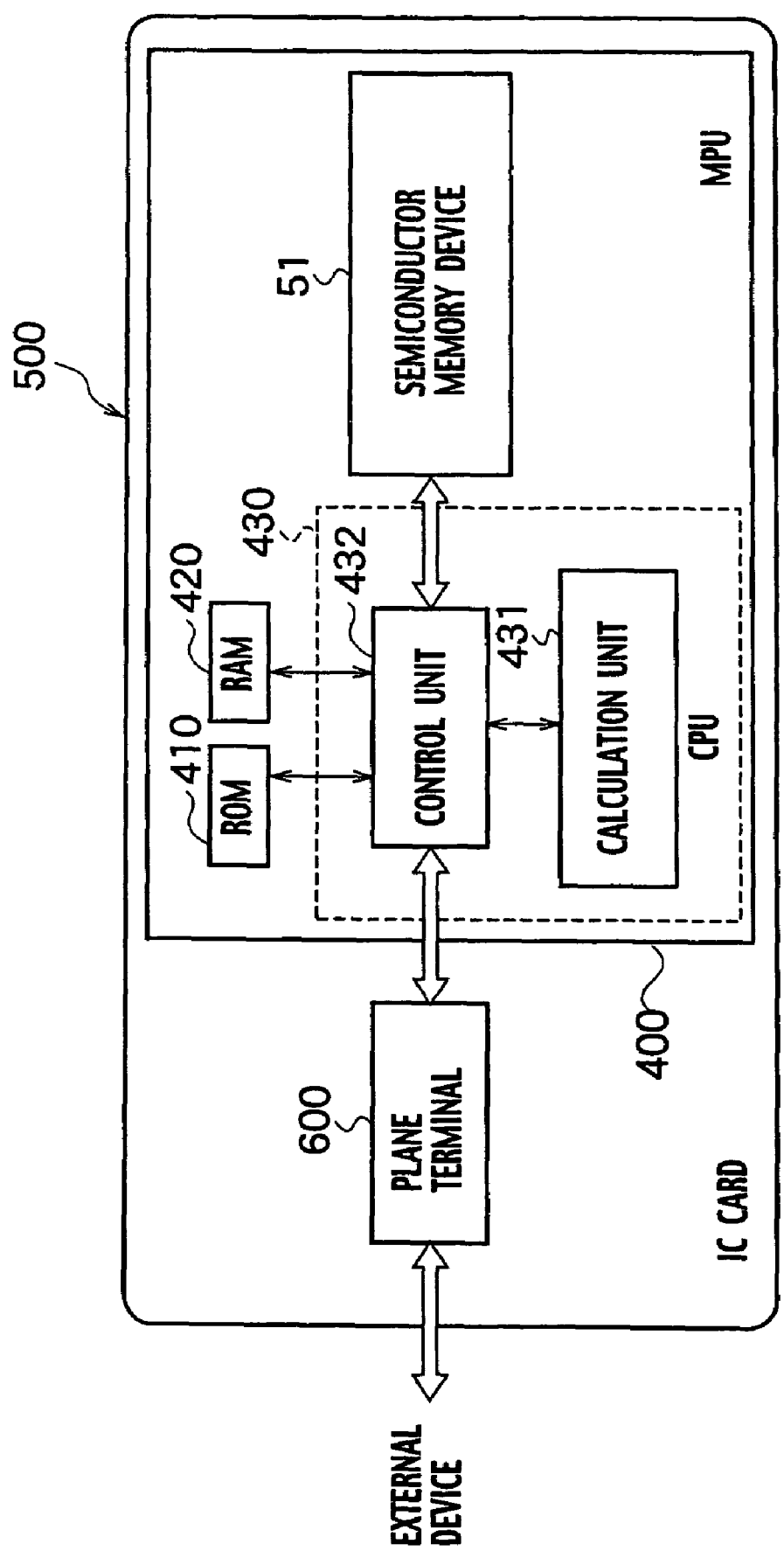
Figure 85:
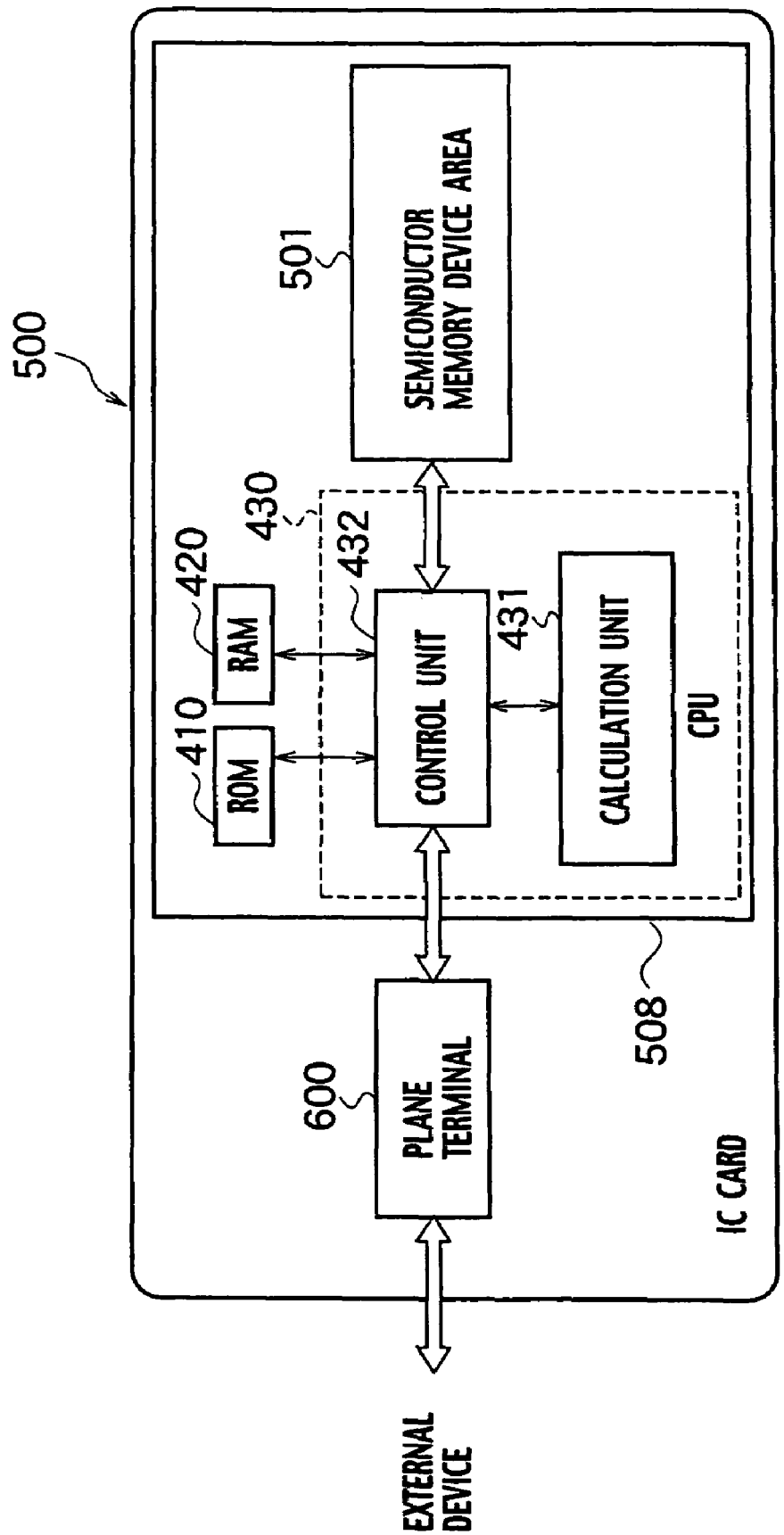
Figure 86:
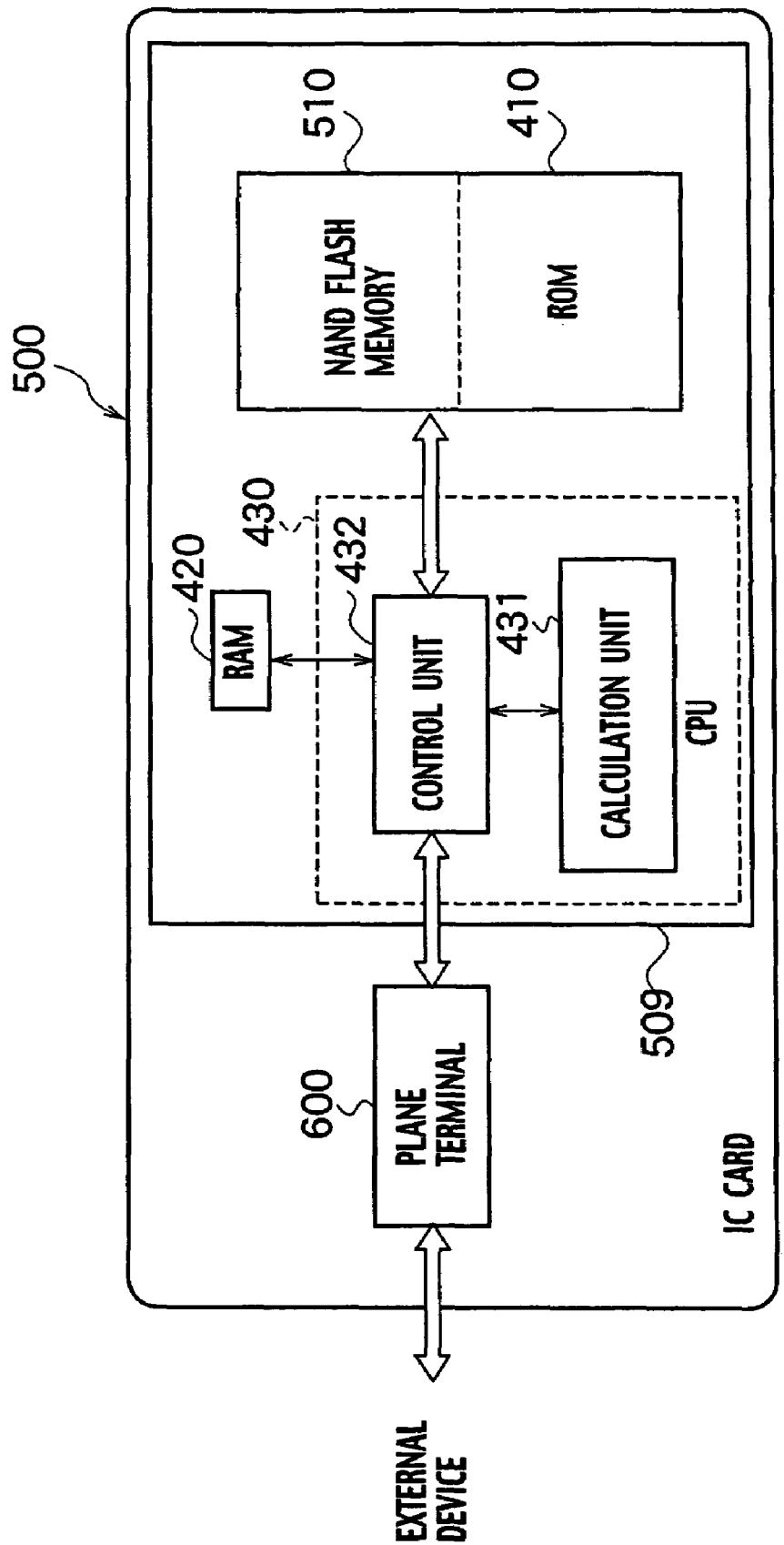
Figure 87:
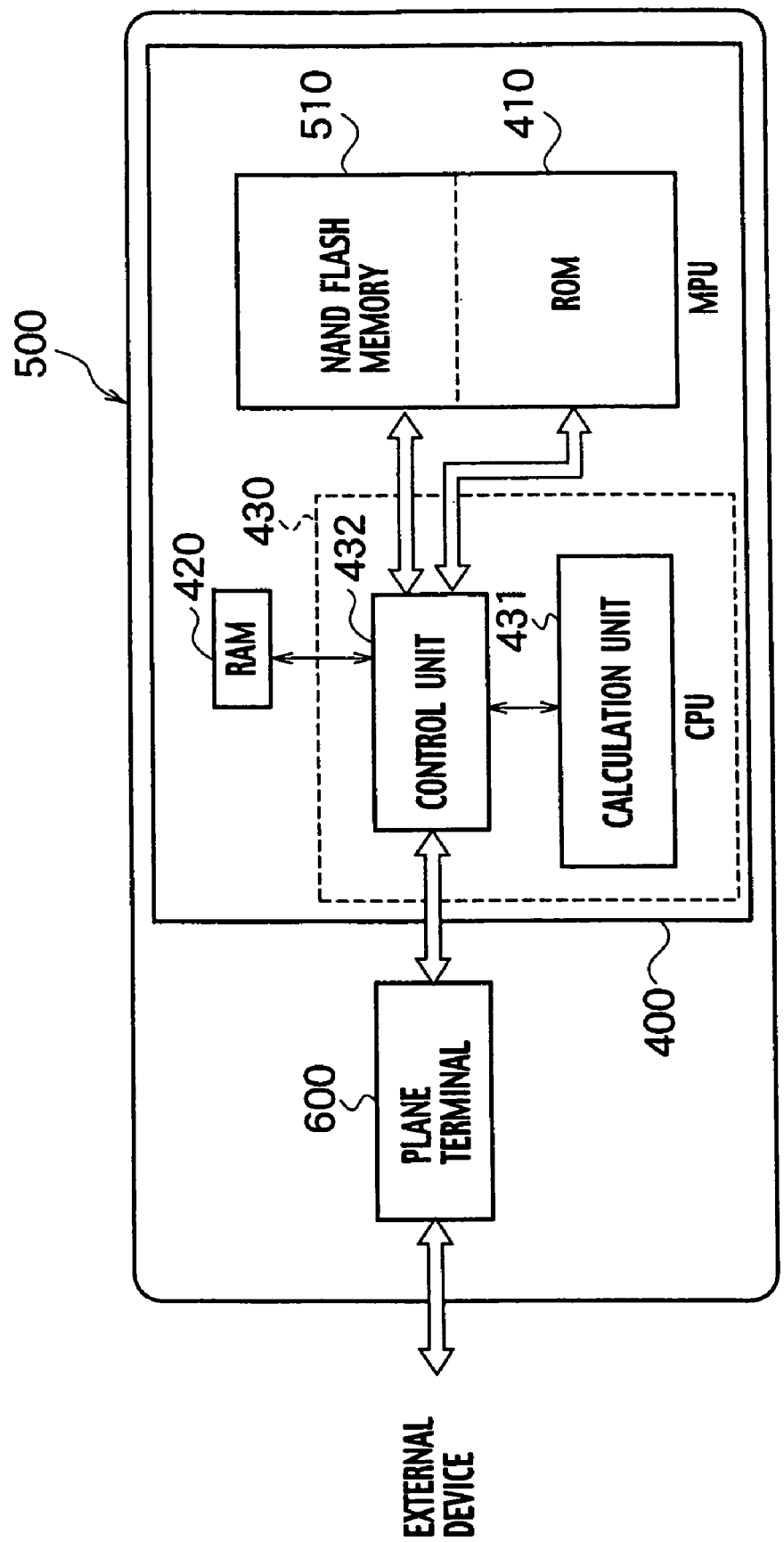

FIG. 42A is an aerial view of a pattern showing a step of the fabrication method of the nonvolatile semiconductor memory according to the third embodiment of the present invention;

FIG. 42B is a schematic cross-sectional structure cut along the line I-I;

FIG. 42C is a schematic cross-sectional structure cut along the line II-II;

FIG. 42D is a schematic cross-sectional structure of a transistor in the peripheral circuit;

FIG. 43A is an aerial view of a pattern showing a step of the fabrication method of the nonvolatile semiconductor memory according to the third embodiment of the present invention;

FIG. 43B is a schematic cross-sectional structure cut along the line I-I;

FIG. 43C is a schematic cross-sectional structure cut along the line II-II;

FIG. 43D is a schematic cross-sectional structure of a transistor in the peripheral circuit;

FIG. 44A is an aerial view of a pattern showing a step of the fabrication method of the nonvolatile semiconductor memory according to the third embodiment of the present invention;

FIG. 44B is a schematic cross-sectional structure cut along the line I-I;

FIG. 44C is a schematic cross-sectional structure cut along the line II-II;

FIG. 44D is a schematic cross-sectional structure of a transistor in the peripheral circuit;

FIG. 45A is an aerial view of a pattern showing a step of the fabrication method of the nonvolatile semiconductor memory according to the third embodiment of the present invention;

FIG. 45B is a schematic cross-sectional structure cut along the line I-I;

FIG. 45C is a schematic cross-sectional structure cut along the line II-II;

FIG. 45D is a schematic cross-sectional structure of a transistor in the peripheral circuit;

FIG. 46 is an aerial view of a partial pattern in a memory cell array for a nonvolatile semiconductor memory according to the fourth embodiment of the present invention;

FIG. 47A is a schematic cross-sectional structure cut along the line I-I in FIG. 46;

FIG. 47B is a schematic cross-sectional structure cut along the line II-II in FIG. 46;

FIG. 47C is a schematic cross-sectional structure cut along the line III-III in FIG. 46;

FIG. 48 is a cross-sectional structure of a transistor in a peripheral circuit of the nonvolatile semiconductor memory according to the fourth embodiment of the present invention;

FIG. 49A is an aerial view of a pattern showing a step of a fabrication method of the nonvolatile semiconductor memory according to the fourth embodiment of the present invention;

FIG. 49B is a schematic cross-sectional structure cut along the line I-I;

FIG. 49C is a schematic cross-sectional structure cut along the line II-II;

FIG. 49D is a schematic cross-sectional structure of a transistor in the peripheral circuit;

FIG. 50A is an aerial view of a pattern showing a step of the fabrication method of the nonvolatile semiconductor memory according to the fourth embodiment of the present invention;

FIG. 50B is a schematic cross-sectional structure cut along the line I-I;

FIG. 50C is a schematic cross-sectional structure cut along the line II-II;

FIG. 50D is a schematic cross-sectional structure of a transistor in the peripheral circuit;

FIG. 51A is an aerial view of a pattern showing a step of the fabrication method of the nonvolatile semiconductor memory according to the fourth embodiment of the present invention;

FIG. 51B is a schematic cross-sectional structure cut along the line I-I;

FIG. 51C is a schematic cross-sectional structure cut along the line II-II;

FIG. 51D is a schematic cross-sectional structure of a transistor in the peripheral circuit;

FIG. 52A is an aerial view of a pattern showing a step of the fabrication method of the nonvolatile semiconductor memory according to the fourth embodiment of the present invention;

FIG. 52B is a schematic cross-sectional structure cut along the line I-I;

FIG. 52C is a schematic cross-sectional structure cut along the line II-II;

FIG. 52D is a schematic cross-sectional structure of a transistor in the peripheral circuit;

FIG. 53A is an aerial view of a pattern showing a step of the fabrication method of the nonvolatile semiconductor memory according to the fourth embodiment of the present invention;

FIG. 53B is a schematic cross-sectional structure cut along the line I-I;

FIG. 53C is a schematic cross-sectional structure cut along the line II-II;

FIG. 53D is a schematic cross-sectional structure of a transistor in the peripheral circuit;

FIG. 54A is an aerial view of a pattern showing a step of the fabrication method of the nonvolatile semiconductor memory according to the fourth embodiment of the present invention;

FIG. 54B is a schematic cross-sectional structure cut along the line I-I;

FIG. 54C is a schematic cross-sectional structure cut along the line II-II;

FIG. 54D is a schematic cross-sectional structure of a transistor in the peripheral circuit;

FIG. 55A is an aerial view of a pattern showing a step of the fabrication method of the nonvolatile semiconductor memory according to the fourth embodiment of the present invention;

FIG. 55B is a schematic cross-sectional structure cut along the line I-I;

FIG. 55C is a schematic cross-sectional structure cut along the line II-II;

FIG. 55D is a schematic cross-sectional structure of a transistor in the peripheral circuit;

FIG. 56A is an aerial view of a pattern showing a step of the fabrication method of the nonvolatile semiconductor memory according to the fourth embodiment of the present invention;

FIG. 56B is a schematic cross-sectional structure cut along the line I-I;

FIG. 56C is a schematic cross-sectional structure cut along the line II-II;

FIG. 56D is a schematic cross-sectional structure of a transistor in the peripheral circuit;

FIG. 57A is an aerial view of a pattern showing a step of the fabrication method of the nonvolatile semiconductor memory according to the fourth embodiment of the present invention;

FIG. 57B is a schematic cross-sectional structure cut along the line I-I;

FIG. 57C is a schematic cross-sectional structure cut along the line II-II;

FIG. 57D is a schematic cross-sectional structure of a transistor in the peripheral circuit;

FIG. 58A is an aerial view of a pattern showing a step of the fabrication method of the nonvolatile semiconductor memory according to the fourth embodiment of the present invention;

FIG. 58B is a schematic cross-sectional structure cut along the line I-I;

FIG. 58C is a schematic cross-sectional structure cut along the line II-II;

FIG. 58D is a schematic cross-sectional structure of a transistor in the peripheral circuit;

FIG. 59 shows a schematic NOR EEPROM circuit structure of a nonvolatile semiconductor memory according to a fifth embodiment of the present invention;

FIG. 60 is an aerial view of a partial pattern in a memory cell array of a nonvolatile semiconductor memory according to a sixth embodiment of the present invention;

FIG. 61 is a schematic cross-sectional structure cut along the line I-I in FIG. 60;

FIG. 62 is a schematic cross-sectional structure cut along the line II-II in FIG. 60;

FIG. 63 is a schematic cross-sectional structure cut along the line III-III in FIG. 60;

FIG. 64 is a cross-sectional structure of a transistor in a peripheral circuit of the nonvolatile semiconductor memory according to the sixth embodiment of the present invention;

FIG. 65 is a schematic cross-sectional structure of a memory cell transistor with a MONOS structure cut along the line I-I;

FIG. 66 is a schematic cross-sectional structure of a transistor in the peripheral circuit of the nonvolatile semiconductor memory corresponding to FIG. 65;

FIG. 67 is a cross-sectional structure showing a magnified memory cell block of FIG. 65;

FIG. 68 is an exemplary circuit structure of a nonvolatile semiconductor memory configured with 64-Mbit NAND flash memory according to a seventh embodiment of the present invention;

FIG. 69 is an exemplary circuit structure of a nonvolatile semiconductor memory configured with AND flash memory according to an eighth embodiment of the present invention;

FIG. 70 is an exemplary circuit structure of a nonvolatile semiconductor memory configured with divided bit line (DI) NOR flash memory according to a ninth embodiment of the present invention;

FIG. 71 is an exemplary block diagram of page flash memory used in a nonvolatile semiconductor memory system according to a tenth embodiment of the present invention;

FIG. 72 is an exemplary block diagram of byte flash memory used in the nonvolatile semiconductor memory system according to the tenth embodiment of the present invention;

FIG. 73 is a schematic block diagram of ROM region included EEPROM flash memory used in the nonvolatile semiconductor memory system according to the tenth embodiment of the present invention;

FIG. 74 is a schematic block diagram showing an internal configuration of a memory card to which is applied a nonvolatile semiconductor memory system according to an eleventh embodiment of the present invention;

FIG. 75 is a schematic block diagram showing the internal configuration of the memory card to which is applied the nonvolatile semiconductor memory system according to the eleventh embodiment of the present invention;

FIG. 76 is a schematic block diagram showing the internal configuration of the memory card to which is applied the nonvolatile semiconductor memory system according to the eleventh embodiment of the present invention;

FIG. 77 is a schematic block diagram showing the internal configuration of the memory card to which is applied the nonvolatile semiconductor memory system according to the eleventh embodiment of the present invention;

FIG. 78 is a schematic block diagram showing the internal configuration of the memory card to which is applied the nonvolatile semiconductor memory system according to the eleventh embodiment of the present invention;

FIG. 79 is a schematic block diagram of a memory card and a card holder to which is applied the nonvolatile semiconductor memory system according to the eleventh embodiment of the present invention;

FIG. 80 is a schematic block diagram of a connecting device operable to receive the memory card and the card holder to which is applied the nonvolatile semiconductor memory according to the eleventh embodiment of the present invention;

FIG. 81 is a schematic block diagram of a coupling device, which connects to a personal computer via a connecting wire and can be loaded with an internal memory card to which is applied the nonvolatile semiconductor memory according to the eleventh embodiment of the present invention;

FIG. 82 is a digital camera system, which can be loaded with a memory card to which is applied the nonvolatile semiconductor memory according to the eleventh embodiment of the present invention;

FIG. 83 is a schematic block diagram of an IC card to which is applied the nonvolatile semiconductor memory system according to the eleventh embodiment of the present invention;

FIG. 84 is a schematic block diagram showing the internal configuration of the IC card to which is applied the nonvolatile semiconductor memory system according to the eleventh embodiment of the present invention;

FIG. 85 is a schematic block diagram showing the internal configuration of the IC card to which is applied the nonvolatile semiconductor memory system according to the eleventh embodiment of the present invention;

FIG. 86 is a schematic block diagram showing the internal configuration of the IC card to which is applied the nonvolatile semiconductor memory system according to the eleventh embodiment of the present invention; and FIG. 87 is a schematic block diagram showing the internal configuration of the IC card to which is applied the nonvolatile semiconductor memory system according to the eleventh embodiment of the present invention.

DETAILED DESCRIPTION OF THE EMBODIMENTS

The present invention provides a non-volatile semiconductor memory and fabrication method thereof for providing a lithographic margin for minute contacts aligned with the minimum processing dimension, such as data transfer line contacts for NAND EEPROM and NOR EEPROM, and interconnect layers. In addition, in a NAND EEPROM, when filling in, between gates, with a conductive material and then forming contacts, and etching the conductive material, interconnect layers made of the conductive material for the contacts are also formed at the same time with a linear pattern formed during etching. A nonvolatile semiconductor memory and a method for fabricating the nonvolatile semiconductor memory are provided that provides a lithographic margin for minute contacts and resolution of a problem of misalignment with interconnects.

In a NAND EEPROM, when filling in between gates with a conductive material and then forming contacts by etching that conductive material, interconnect layers made of that conductive material for the contacts are also formed at the same time with a linear pattern formed during etching. This technique provides a lithographic margin for minute contacts and resolution of a problem of misalignment with interconnects.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Generally and as is conventional in the representation of circuits, it will be appreciated that the various drawings are not drawn to scale from one figure to another nor inside a given figure, and in particular that the circuit diagrams are arbitrarily drawn for facilitating the reading of the drawings.

In the following descriptions, numerous specific details are set fourth such as specific signal values, etc. to provide a thorough understanding of the present invention. However, it will be obvious to those skilled in the art that the present invention may be practiced without such specific details. In other instances, circuits well-known have been shown in block diagram form in order not to obscure the present invention in unnecessary detail.

Referring to the drawings, embodiments of the present invention are described below. The same or similar reference numerals are attached to identical or similar parts among the following drawings. The embodiments shown below exemplify an apparatus and a method that are used to implement the technical ideas according to the present invention, and do not limit the technical ideas according to the present invention to those that appear below. These technical ideas, according to the present invention, may receive a variety of modifications that fall within the scope of the claims.

First Embodiment

A nonvolatile semiconductor memory according to a first embodiment of the present invention is described referencing FIG. 5 through FIG. 8. The nonvolatile semiconductor memory of the first embodiment has, as shown in FIG. 5A, a memory cell array 1 and a peripheral circuit 2 upon the same semiconductor substrate. The memory cell array 1 has a NAND structure as shown in FIG. 5B, which forms a NAND cell unit 20 with a structure including a plurality of memory cell transistors M0 through M15 connected in series between two current terminals, in this case, between a common source line SL and a bit line BL through select transistors S1 and S2.

Figure 6:
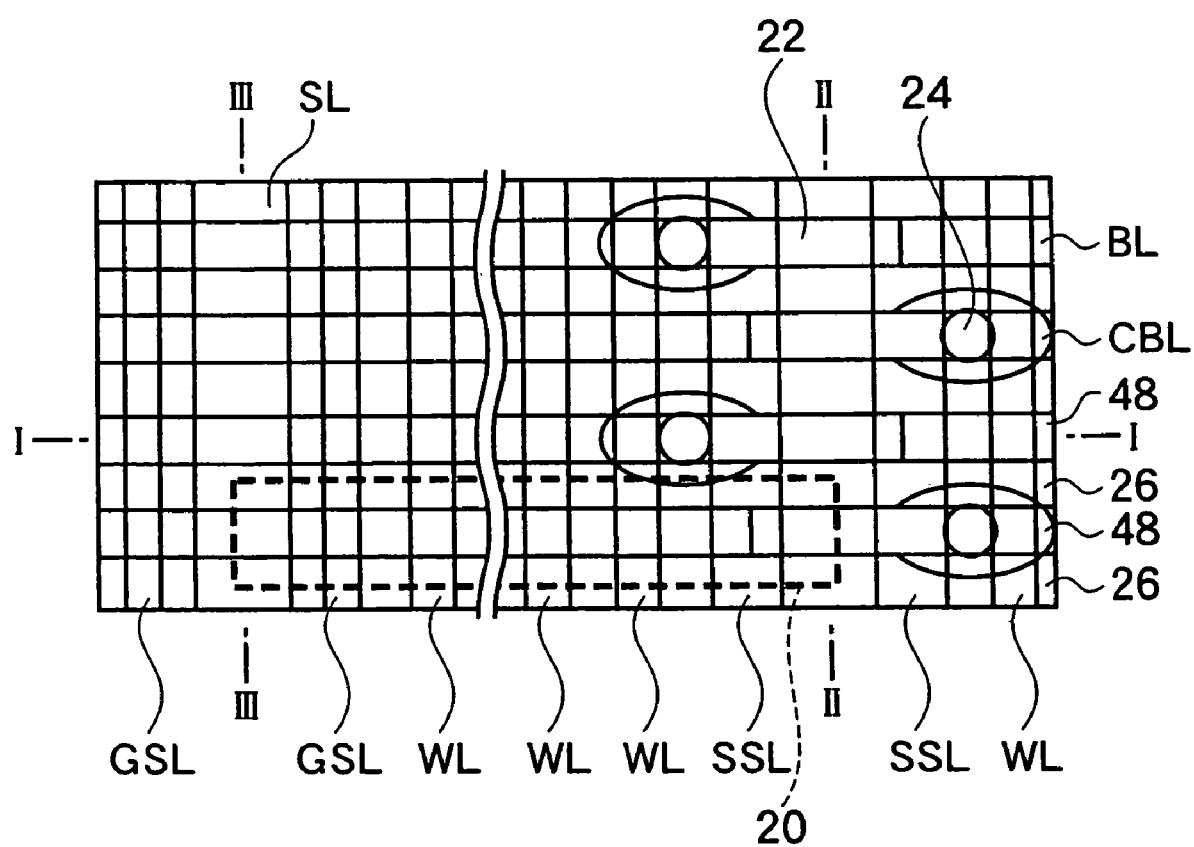
FIG. 6 is an aerial view of a partial pattern of the memory cell array of the nonvolatile semiconductor memory according to the first embodiment of the present invention.
Figure 7A:
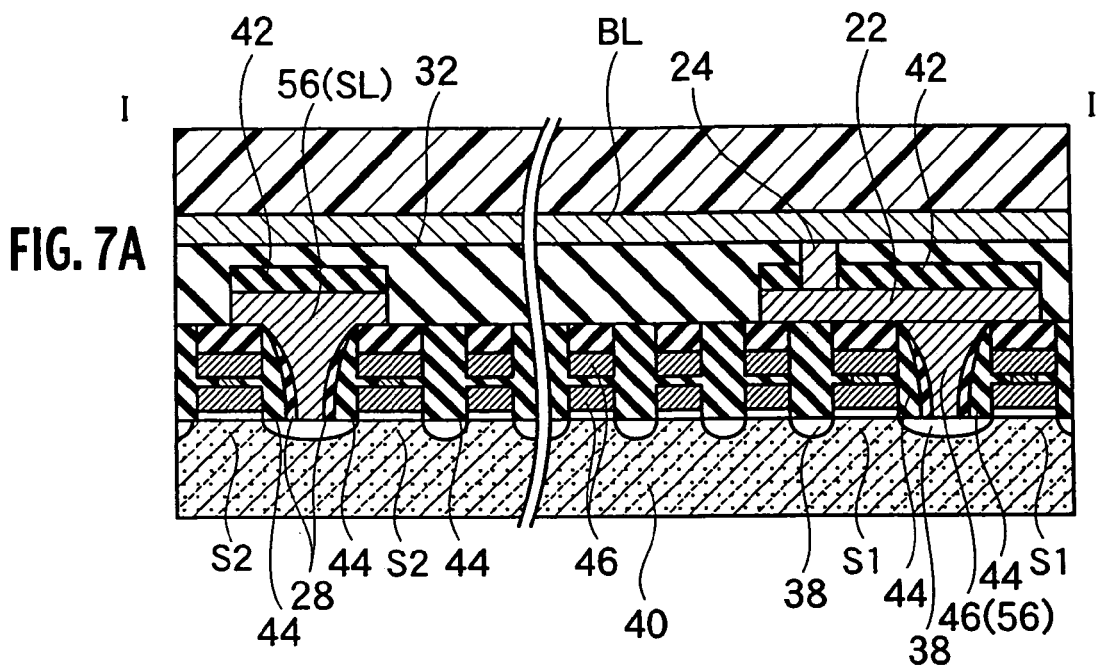
FIG. 7A is a schematic cross-sectional structure cut along the line I-I in FIG. 6.
Figure 7B:
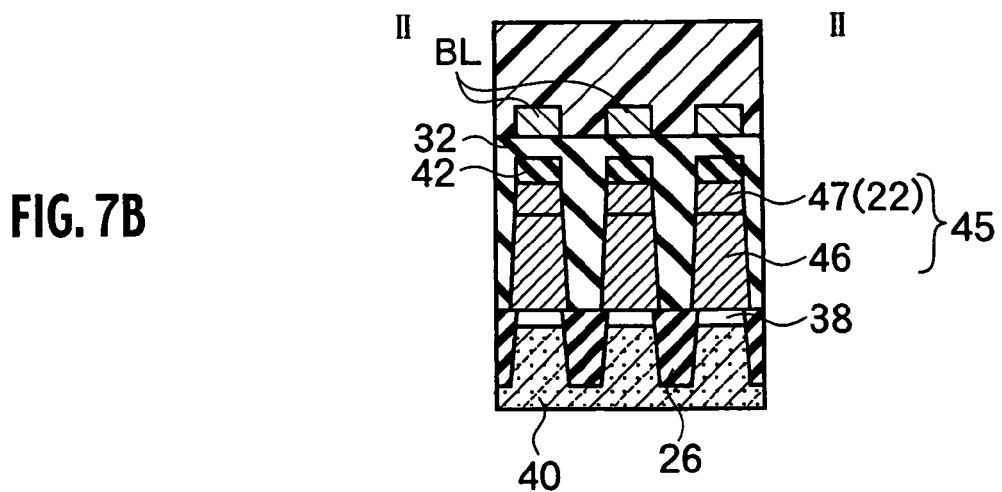
FIG. 7B is a schematic cross-sectional structure cut along the line II-II in FIG. 6.
Figure 7C:
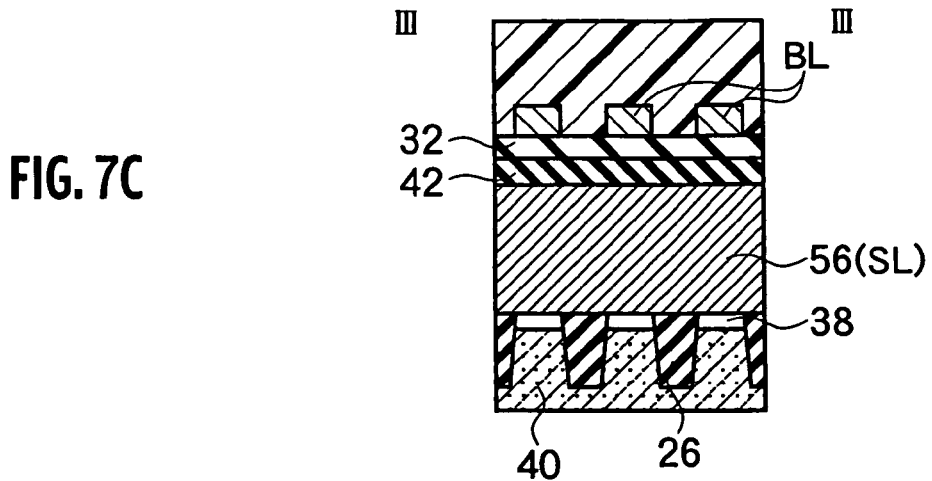
FIG. 7C is a schematic cross-sectional structure cut along the line III-III of FIG. 6.

FIG. 6 is an aerial view of a part of memory cell array 1. FIGS. 7A through 7C are schematic cross-sectional structures cut along the lines I-I, II-II, and III-III, respectively, in the aerial view of FIG. 6. Note that a part of the NAND cell unit 20 configured with memory cell transistors connected in series is omitted in FIG. 6 and FIG. 7A, that is, those drawings are schematic drawings that do not exactly correspond to the configuration along the line I-I. Device isolating regions 26 are disposed with a striped form in the semiconductor substrate 40 at fixed intervals in a first direction along the line I-I, and word lines WL are disposed with a striped form in a direction perpendicular to the first direction. The memory cell transistors have, as shown in FIG. 7A, a stacked-layer structure including floating gates 4 and control gates 6. In addition, the memory cell transistors are, as shown in FIG. 7A, connected in series via diffusion layers 38, and connected to a source line SL and a bit line contact CBL via the select transistors S2 and S1 on both ends, respectively A bit line contact 46 and an extending line 22, which are made of a contact plug conductive material, are buried between the adjacent select transistors S1 via sidewall insulator films 44 so as to form a bit line contact CBL. Similarly, the contact plug conductive material is buried between the adjacent select transistors S2 via the sidewall insulator films 44 so as to form a source line SL. The contact plug conductive material is, for example, impurity-doped polysilicon or amorphous silicon. Alternatively, the contact plug is a metal such as tungsten, aluminum, or copper deposited via a barrier metal such as Ti, Ta, TaN, or TiN.

The conductive material buried between the source select transistors S2 is linearly formed parallel to the word lines WL so as to form a source line SL. The upper portion of each conductive material protrudes over a corresponding select transistor. Such a shape with an extended upper portion allows an increase in the cross-sectional area, and a reduction in the resistance of the source lines SL, resulting in improved performance of the nonvolatile semiconductor memory.

FIG. 7B shows a cross section II-II that is perpendicular to the bit lines BL, made of the conductive material filled in between drain select transistors S1. The conductive material formes lines and spaces alternatingly arranged at the same pitch as the device isolating region 26, and forms bit line contact plugs 45. Each of the bit line contact plug 45 is, as shown in FIG. 7B, made up of the bit line contact 46, the upper region 47, which forms as a common region, and the extending line 22. In addition, each bit line contact plug 45 has a forward tapered shape with the bottom width ('width' means the length perpendicular to the bit lines BL) longer than the top width. The top width is almost equivalent to a half pitch, and the bottom width is longer than the half pitch and longer than the width of a device region 48 to which the bit line contact plug 45 is connected. Such a shape allows an increase in lithographic margins and etching margins during formation of the bit line contact plug 45, minimizing the contact resistance at the junction with the semiconductor device region 48.

The conductive material of each bit line contact plug 45 has an upper portion protruding over the select transistors and the memory cell transistors, and forms an extending line 22 for a bit line contact 46 as shown in FIG. 6 and FIG. 7A. This extending line 22 is connected to the bit line BL via a via contact 24.

Figure 8:
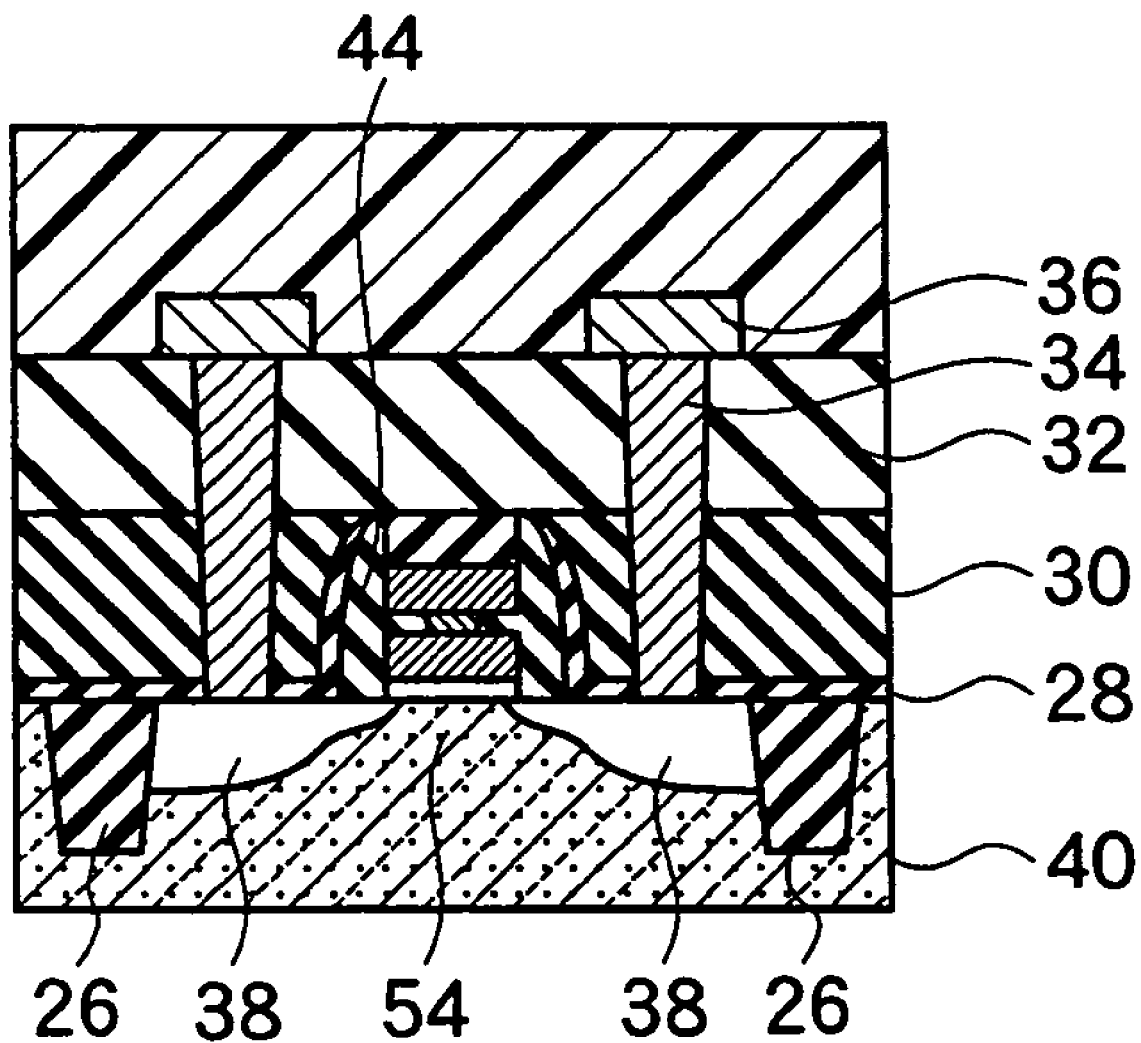
FIG. 8 is a schematic cross-sectional structure of a transistor in a peripheral circuit of the nonvolatile semiconductor memory according to the first embodiment of the present invention.
Figure 9A:
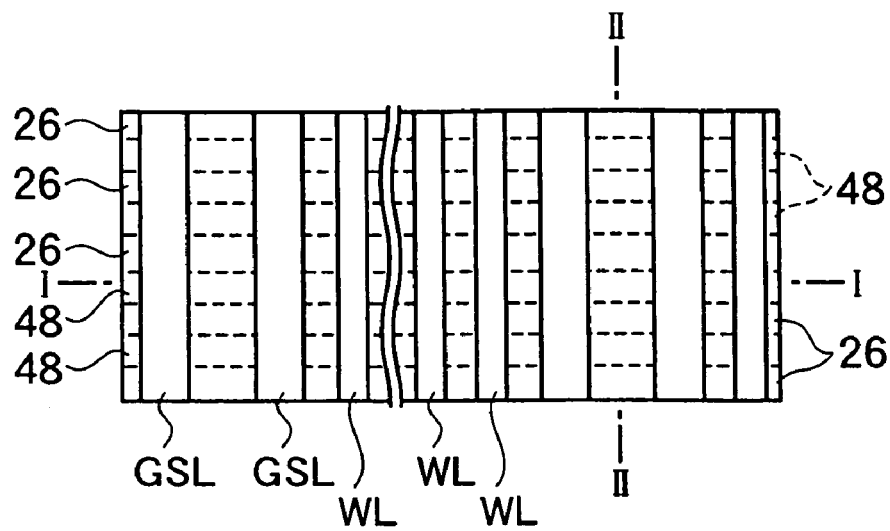
FIG. 9A is an aerial view of a pattern showing a step of a fabrication method of the nonvolatile semiconductor memory according to the first embodiment of the present invention.
Figure 9B:
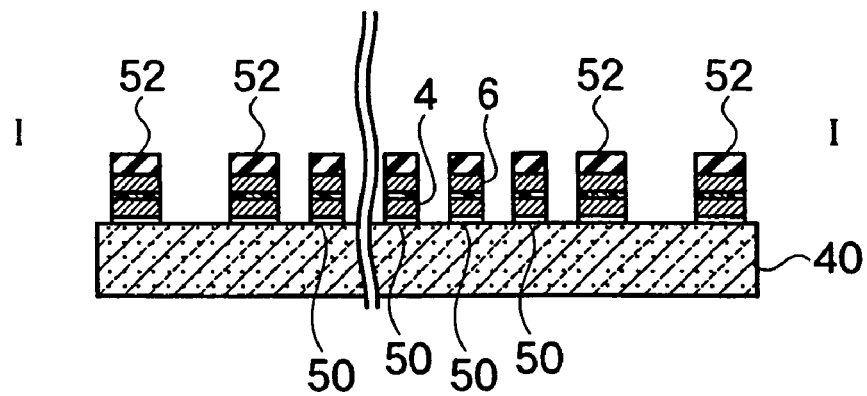
FIG. 9B is a schematic cross-sectional structure cut along the line I-I.
Figure 9C:
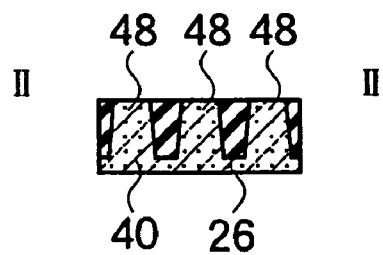
FIG. 9C is a schematic cross-sectional structure cut along the line II-II.
Figure 9D:
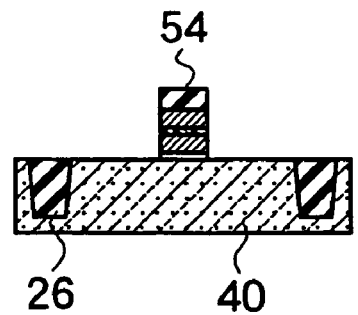
FIG. 9D is a schematic cross-sectional structure of a transistor in the peripheral circuit.
Figure 10A:
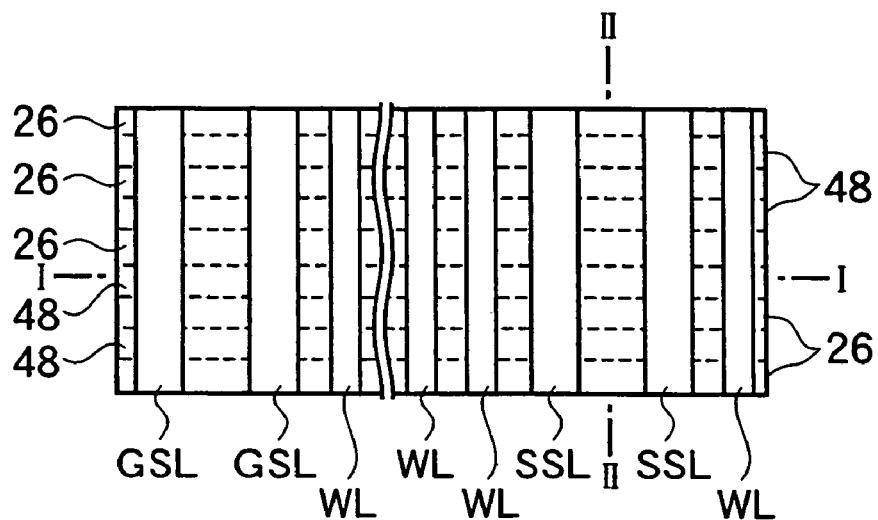
FIG. 10A is an aerial view of a pattern showing a step of the fabrication method of the nonvolatile semiconductor memory according to the first embodiment of the present invention.
Figure 10B:
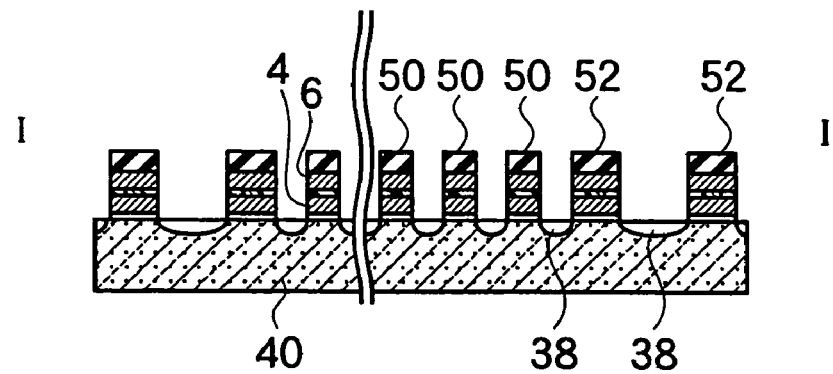
FIG. 10B is a schematic cross-sectional structure cut along the line I-I.
Figure 10C:
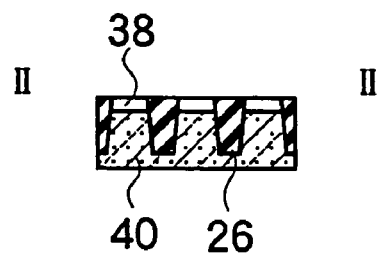
FIG. 10C is a schematic cross-sectional structure cut along the line II-II.
Figure 10D:
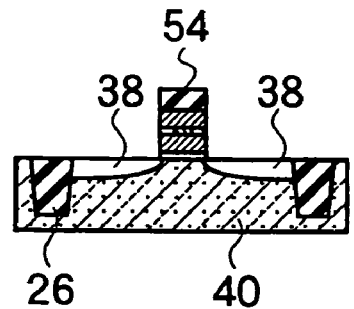
FIG. 10D is a schematic cross-sectional structure of a transistor in the peripheral circuit.

On the other hand, a transistor in the peripheral circuit 2 has, as shown in FIG. 8, diffusion layers 38 sandwiched inbetween the device isolating regions 26, sidewall insulator films 44, barrier insulator films 28, a first interlayer film 30, a second interlayer film 32, transistor contacts 34, and interconnect layers 36. The transistor in the peripheral circuit 2 is formed on a different layer than the bit line contact plug 45 shown in FIG. 7B, and is connected to the interconnect layers 36, which are the same layers as the bit lines BL. Such configuration allows independent formation of the bit line contacts CBL and the peripheral transistor contacts 34 made of the most appropriate material, respectively, resulting in improved performance of the nonvolatile semiconductor memory. Naturally, manufacturing cost can be reduced by forming both the bit line contacts and the peripheral transistor contacts in the same layer.

(Fabrication Method of the First Embodiment)

A fabrication method of the nonvolatile semiconductor memory according to the first embodiment of the present invention is described referencing FIG. 9 through FIG. 24. In each process shown in FIG. 9 through FIG. 24, A shows an aerial view of a partial pattern of the memory cell array, B shows a schematic cross-sectional device structure cut along the line I-I in A, C shows a schematic cross-sectional device structure cut along the line II-II in A, and D shows a schematic cross-sectional device structure of a peripheral transistor in the peripheral circuit.

(a) Well regions, the device isolating regions (trenches) 26 in a striped form, the memory cell transistors 50, the select transistors 52, and the peripheral transistors 54 are formed upon the semiconductor substrate 40 using a well-known method (FIG. 9A through FIG. 9D).

(b) Source/drain diffusion layers 38 are formed using the floating gates 4 and the control gate electrodes 6 as a mask (FIG. 10A through FIG. 10D).

Figure 1:
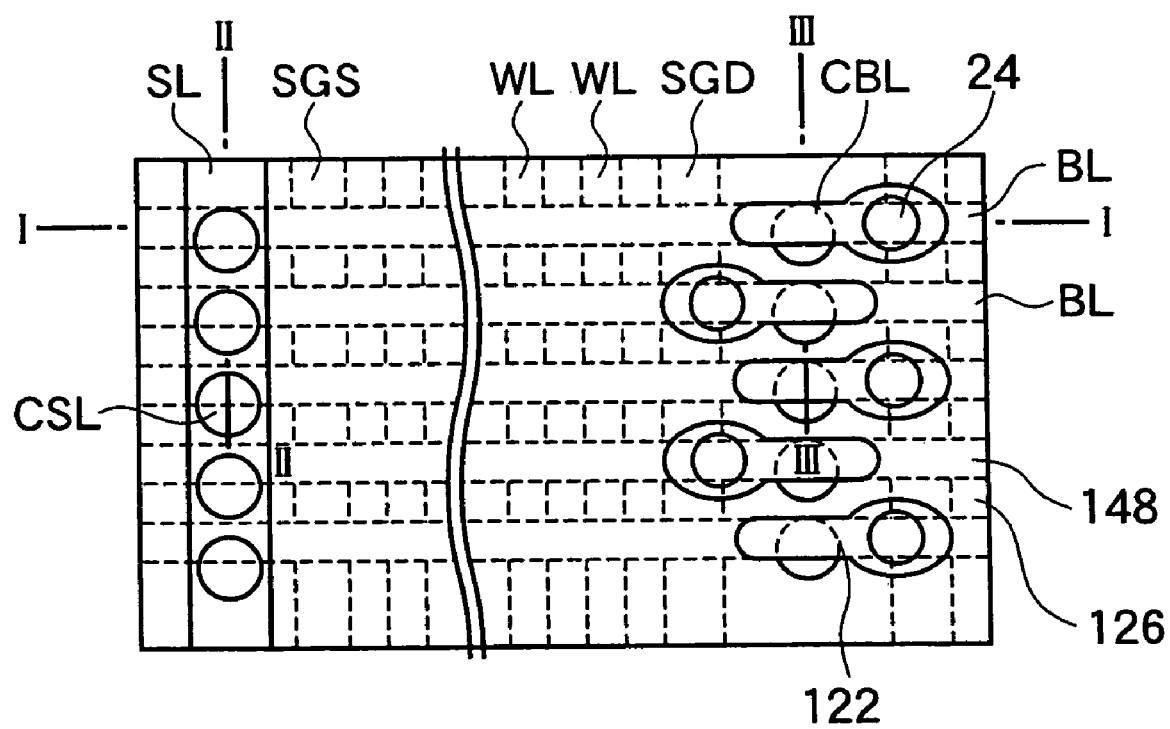
FIG. 1 is a schematic aerial view of the pattern of a nonvolatile semiconductor memory according to a conventional technology.
Figure 2:
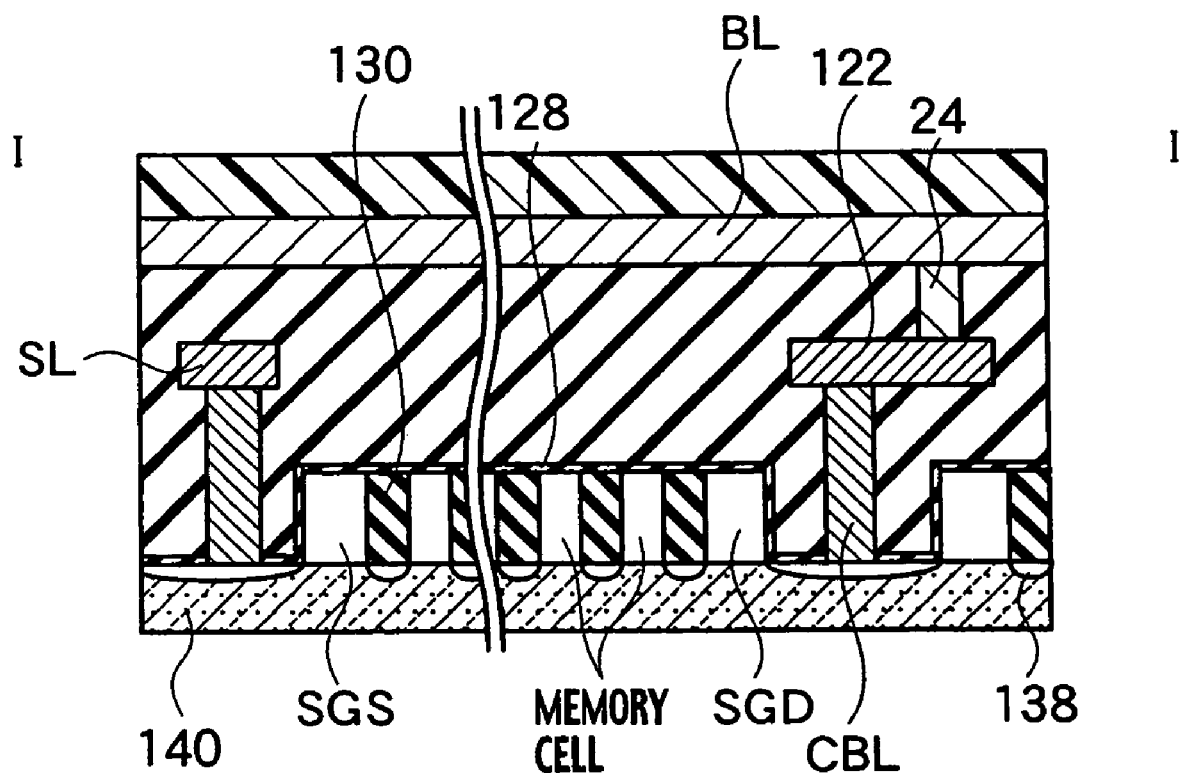
FIG. 2 is a schematic cross-sectional device structure cut along the line I-I in FIG. 1.
Figure 3A:
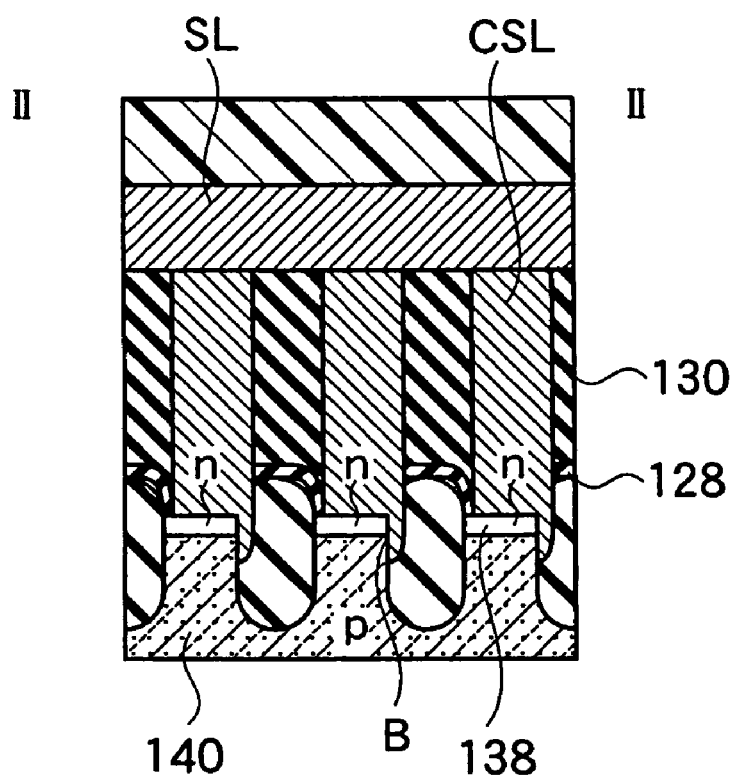
FIG. 3A is a schematic cross-sectional device structure cut along the line II-II in FIG. 1.
Figure 3B:
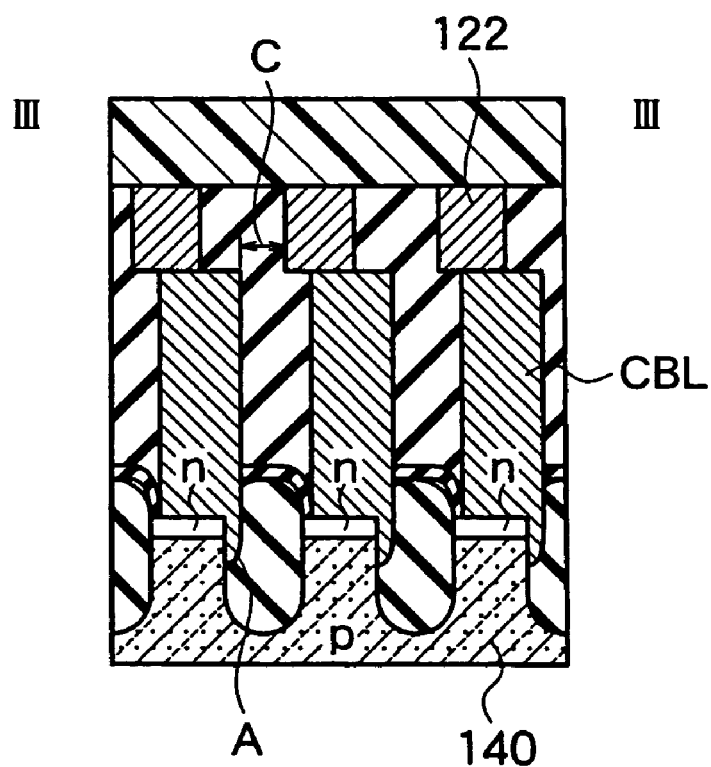
FIG. 3B is a schematic cross-sectional device structure cut along the line III-III in FIG. 1.
Figure 4A:
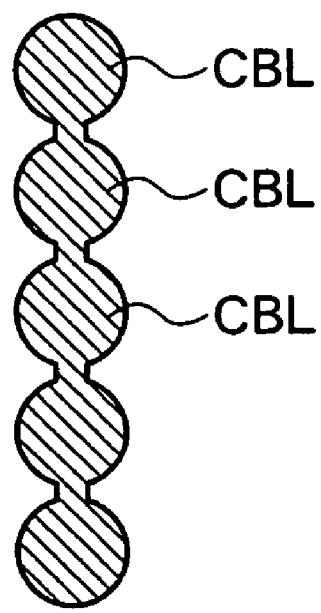
FIG. 4A is a schematic diagram for describing short-circuited bit line contacts CBL.
Figure 4B:
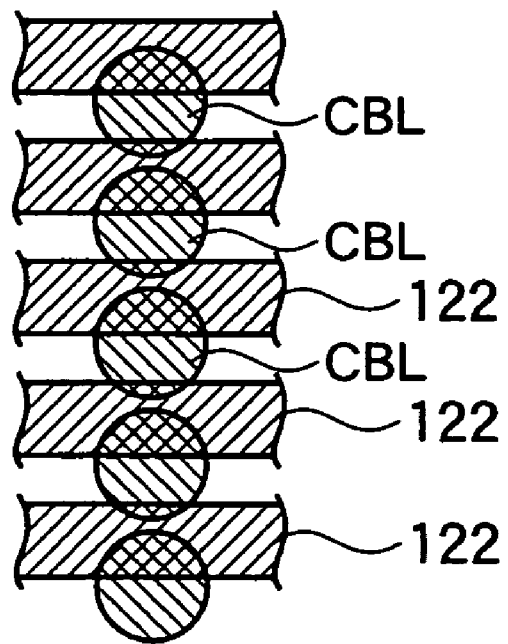
FIG. 4B is a schematic diagram for describing misalignment of the bit line contacts CBL with data transfer line extended regions 122.
Figure 5A:
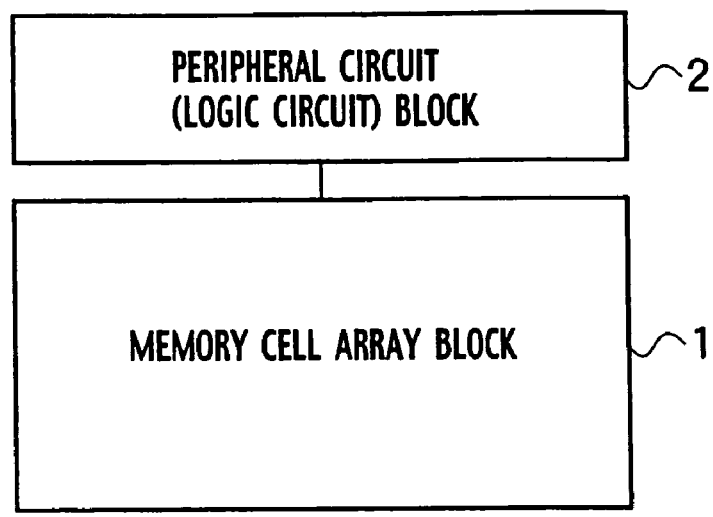
FIG. 5A is a schematic block diagram of a nonvolatile semiconductor memory according to a first embodiment of the present invention.
Figure 5B:
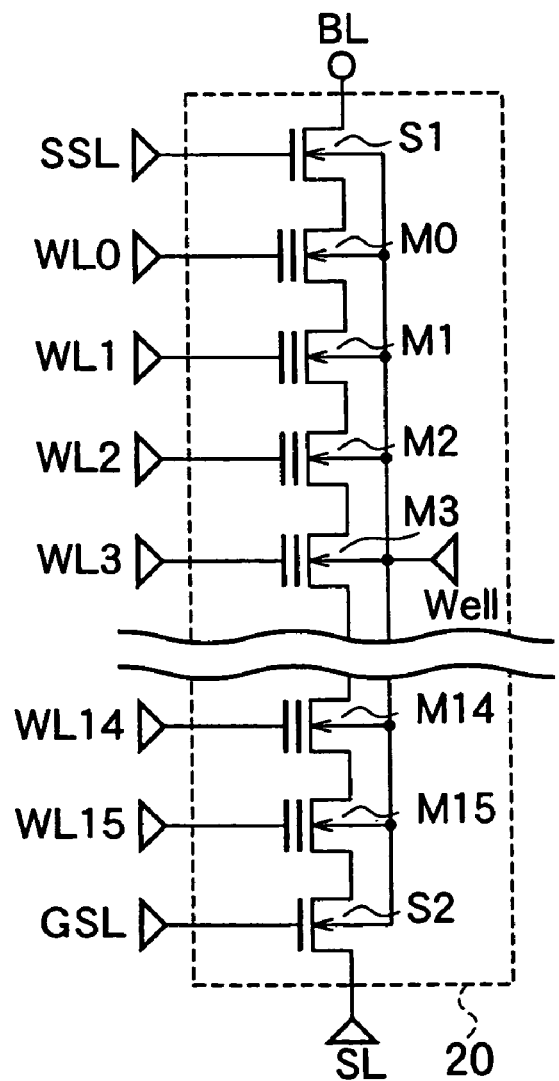
FIG. 5B is a circuit structure of a NAND cell unit in a memory cell array of the nonvolatile semiconductor memory according to the first embodiment of the present invention.
Figure 11A:
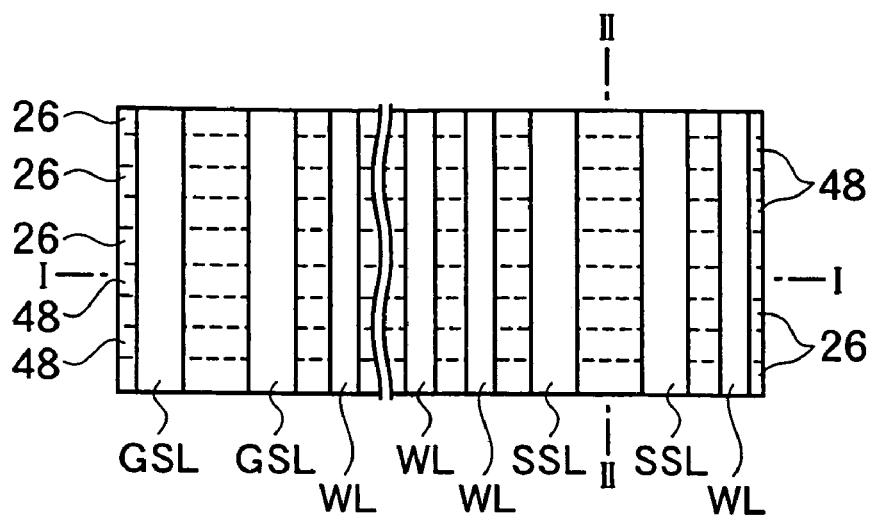
FIG. 11A is an aerial view of a pattern showing a step of the fabrication method of the nonvolatile semiconductor memory according to the first embodiment of the present invention.
Figure 11B:
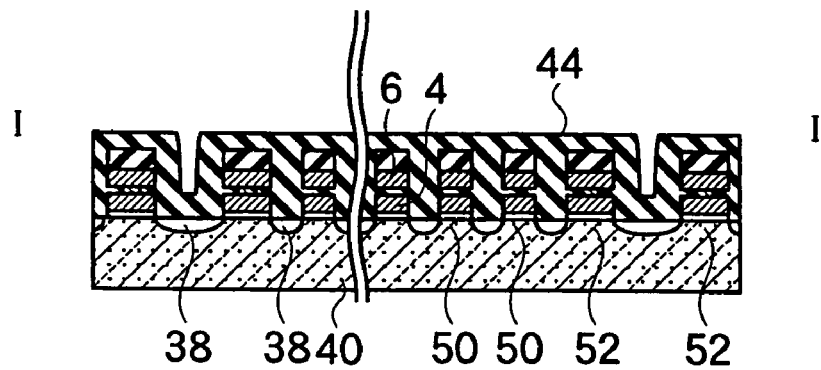
FIG. 11B is a schematic cross-sectional structure cut along the line I-I.
Figure 11C:
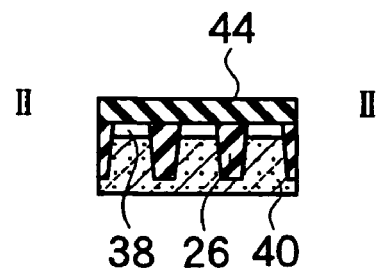
FIG. 11C is a schematic cross-sectional structure cut along the line II-II.
Figure 11D:
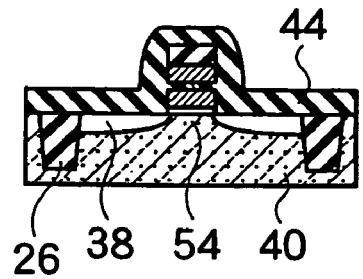
FIG. 11D is a schematic cross-sectional structure of a transistor in the peripheral circuit.
Figure 12A:
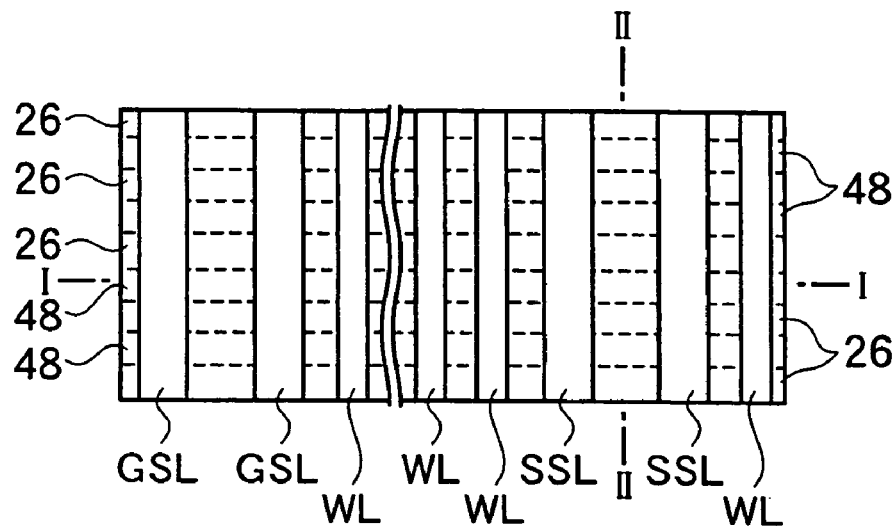
FIG. 12A is an aerial view of a pattern showing a step of the fabrication method of the nonvolatile semiconductor memory according to the first embodiment of the present invention.
Figure 12B:
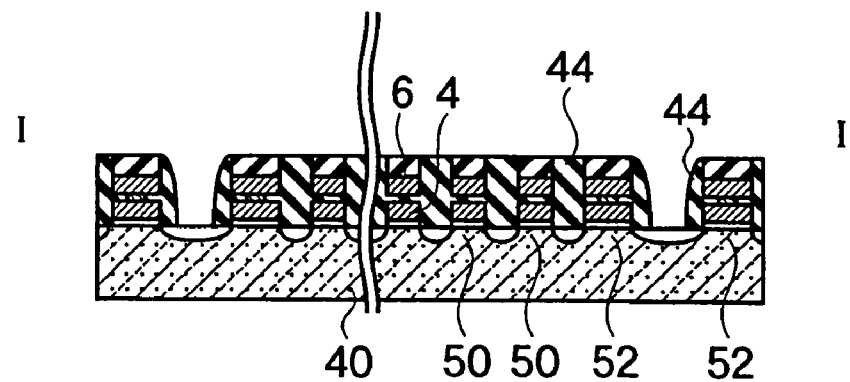
FIG. 12B is a schematic cross-sectional structure cut along the line I-I.
Figure 12C:
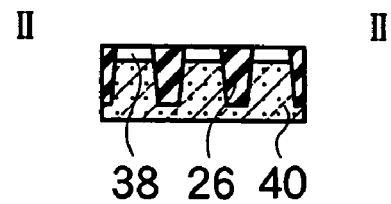
FIG. 12C is a schematic cross-sectional structure cut along the line II-II.
Figure 12D:
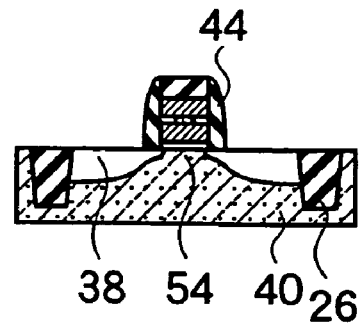
FIG. 12D is a schematic cross-sectional structure of a transistor in the peripheral circuit.
Figure 13A:
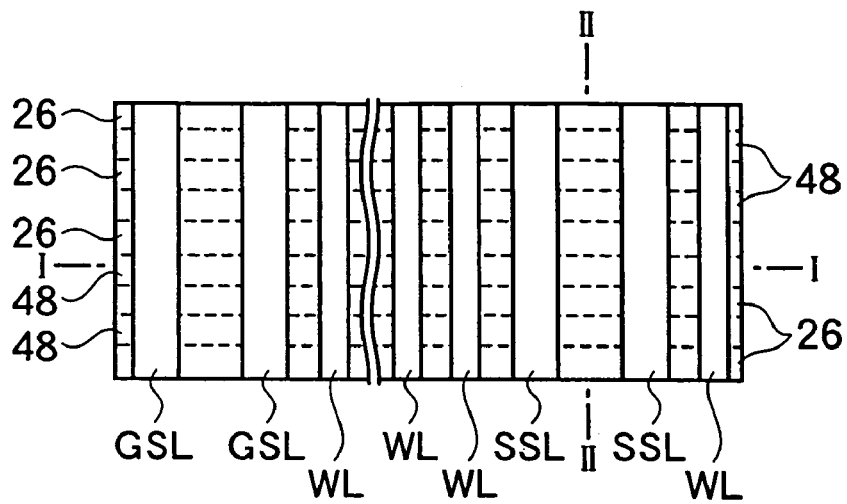
FIG. 13A is n aerial view of a pattern showing a step of the fabrication method of the nonvolatile semiconductor memory according to the first embodiment of the present invention.
Figure 13B:
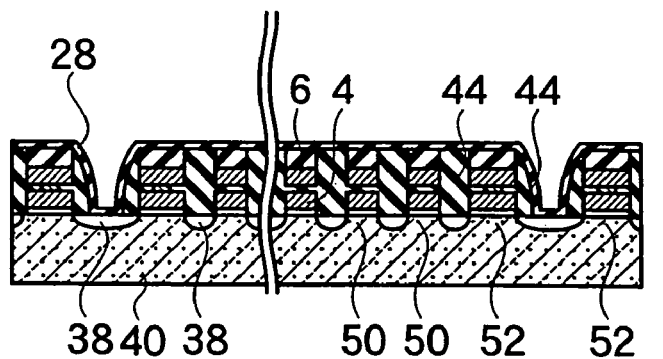
FIG. 13B is a schematic cross-sectional structure cut along the line I-I.
Figure 13C:
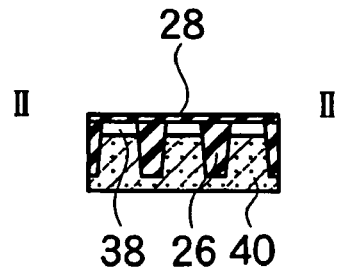
FIG. 13C is a schematic cross-sectional structure cut along the line II-II.
Figure 13D:
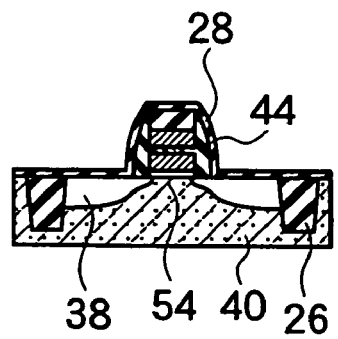
FIG. 13D is a schematic cross-sectional structure of a transistor in the peripheral circuit.
Figure 14A:
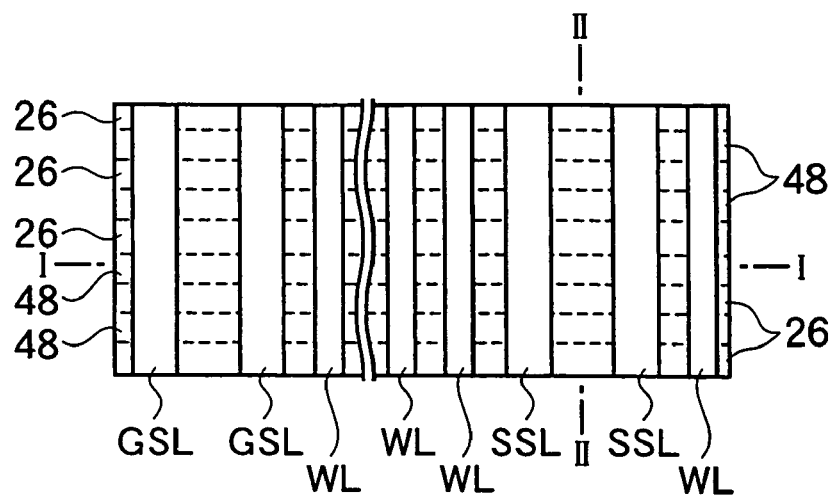
FIG. 14A is n aerial view of a pattern showing a step of the fabrication method of the nonvolatile semiconductor memory according to the first embodiment of the present invention.
Figure 14B:
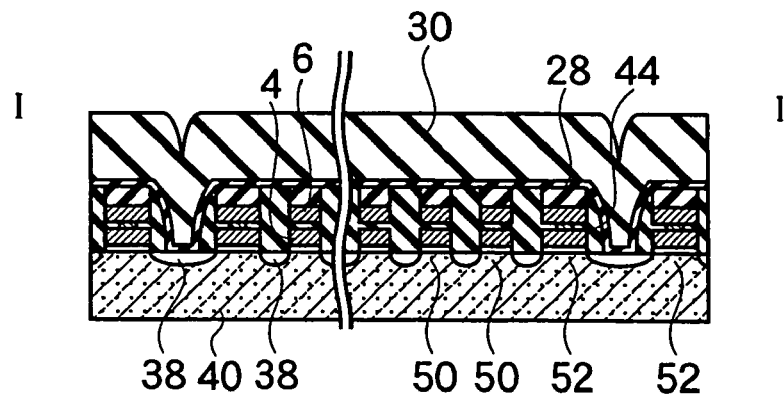
FIG. 14B is a schematic cross-sectional structure cut along the line I-I.
Figure 14C:
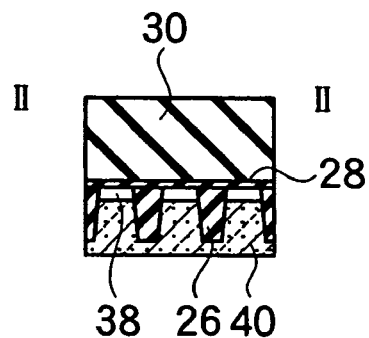
FIG. 14C is a schematic cross-sectional structure cut along the line II-II.
Figure 14D:
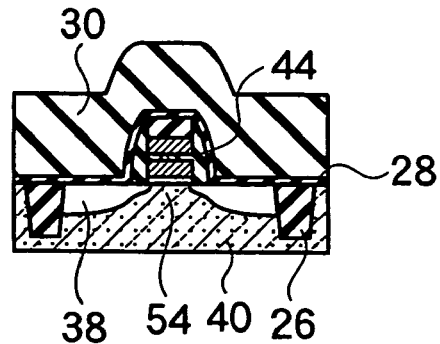
FIG. 14D is a schematic cross-sectional structure of a transistor in the peripheral circuit.
Figure 15A:
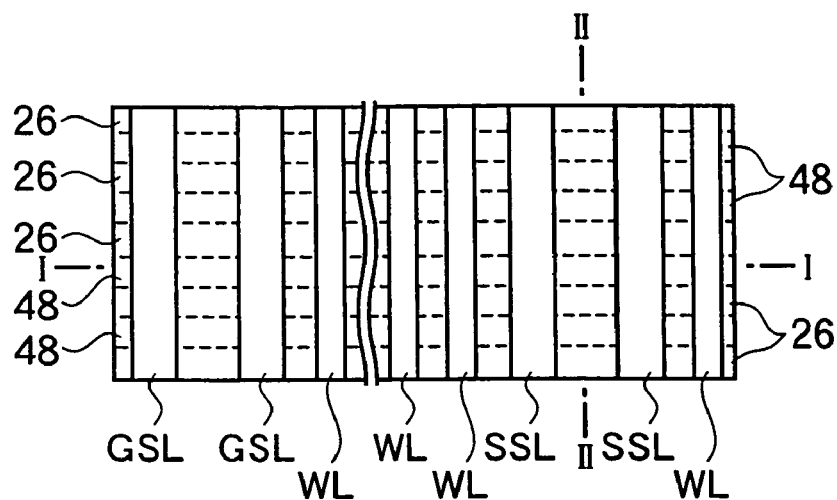
FIG. 15A is an aerial view of a pattern showing a step of the fabrication method of the nonvolatile semiconductor memory according to the first embodiment of the present invention.
Figure 15B:
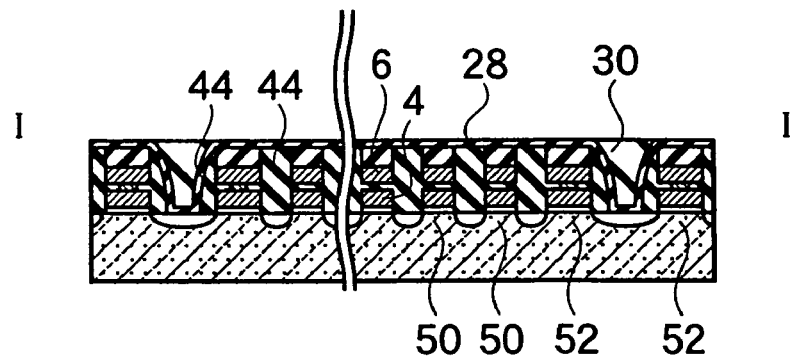
FIG. 15B is a schematic cross-sectional structure cut along the line I-I.
Figure 15C:
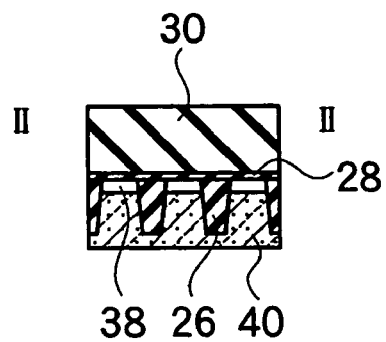
FIG. 15C is a schematic cross-sectional structure cut along the line II-II.
Figure 15D:
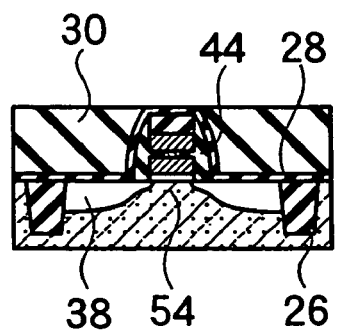
FIG. 15D is a schematic cross-sectional structure of a transistor in the peripheral circuit.
Figure 16A:
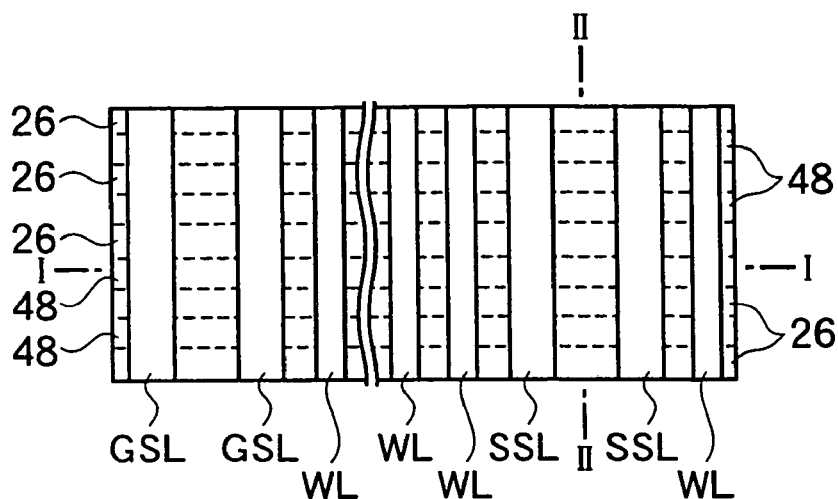
FIG. 16A is an aerial view of a pattern showing a step of the fabrication method of the nonvolatile semiconductor memory according to the first embodiment of the present invention.
Figure 16B:
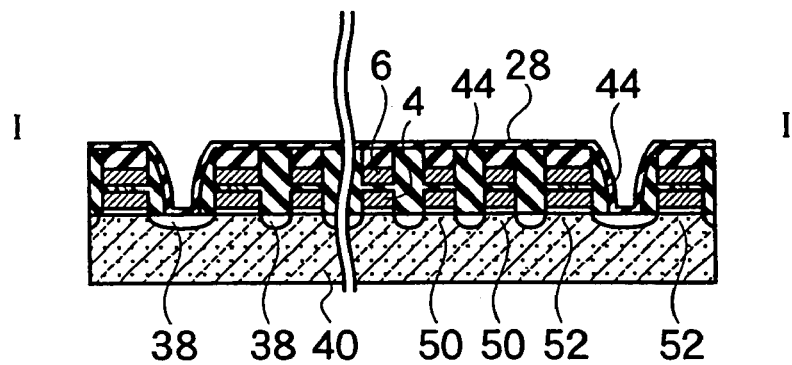
FIG. 16B is a schematic cross-sectional structure cut along the line I-I.
Figure 16C:
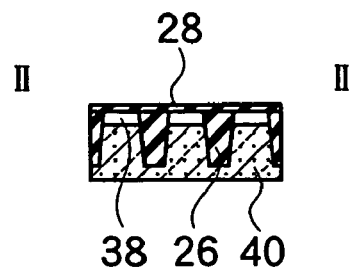
FIG. 16C is a schematic cross-sectional structure cut along the line II-II.
Figure 16D:
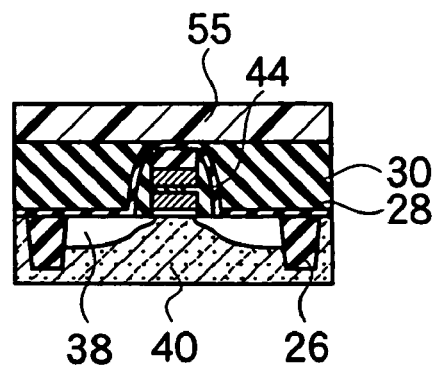
FIG. 16D is a schematic cross-sectional structure of a transistor in the peripheral circuit.
Figure 17A:
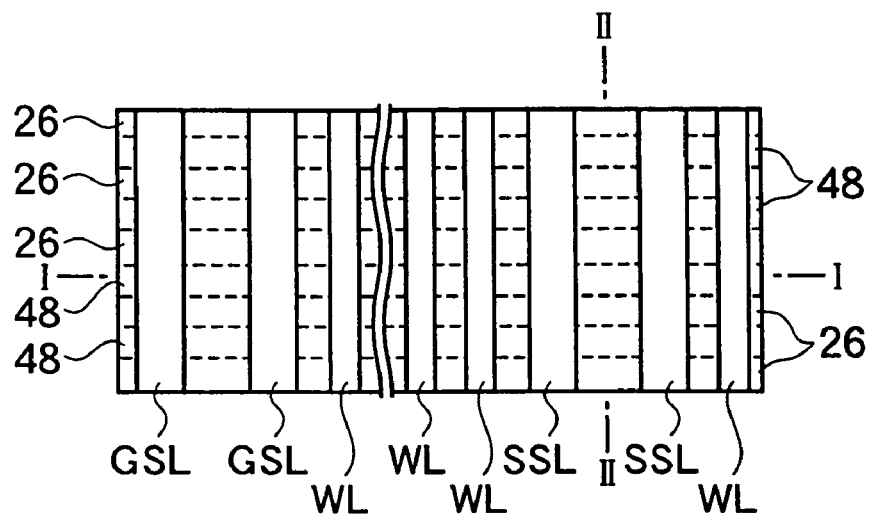
FIG. 17A is an aerial view of a pattern showing a step of the fabrication method of the nonvolatile semiconductor memory according to the first embodiment of the present invention.
Figure 17B:
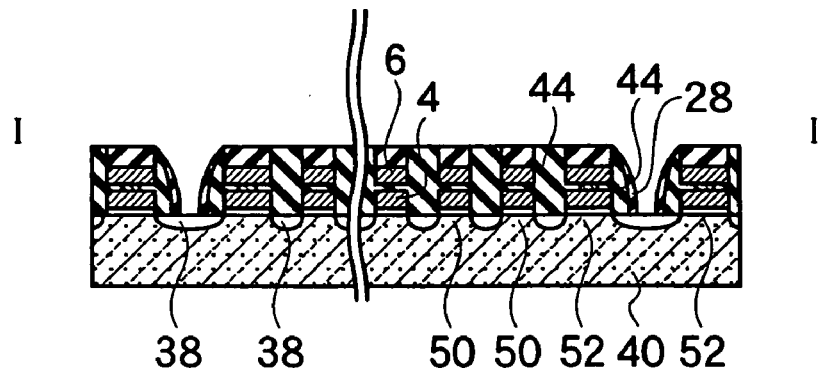
FIG. 17B is a schematic cross-sectional structure cut along the line I-I.
Figure 17C:
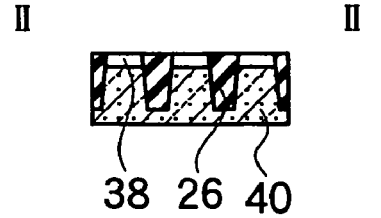
FIG. 17C is a schematic cross-sectional structure cut along the line II-II.
Figure 17D:
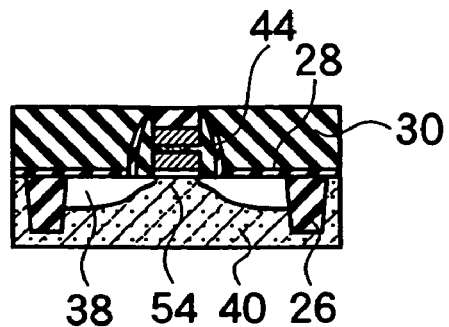
FIG. 17D is a schematic cross-sectional structure of a transistor in the peripheral circuit.
Figure 18A:
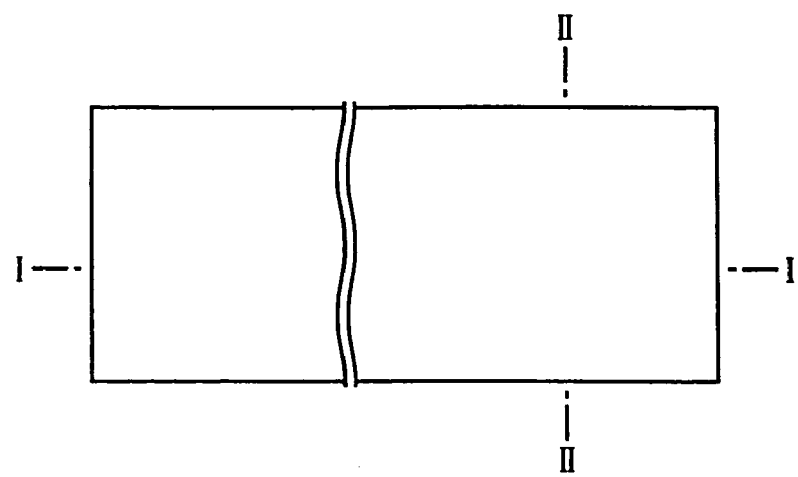
FIG. 18A is an aerial view of a pattern showing a step of the fabrication method of the nonvolatile semiconductor memory according to the first embodiment of the present invention.
Figure 18B:
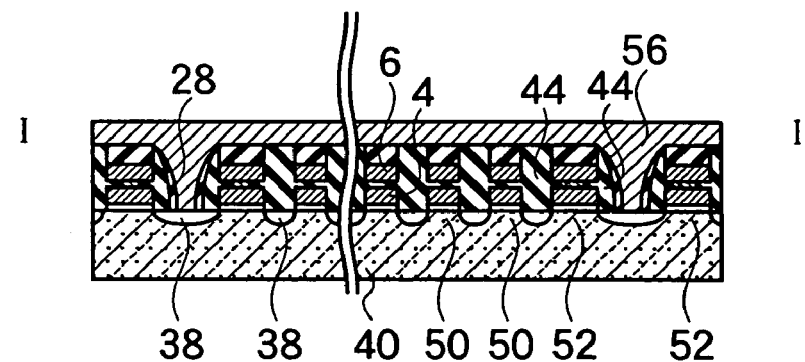
FIG. 18B is a schematic cross-sectional structure cut along the line I-I.
Figure 18C:
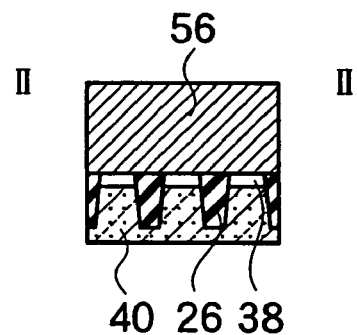
FIG. 18C is a schematic cross-sectional structure cut along the line II-II.
Figure 18D:
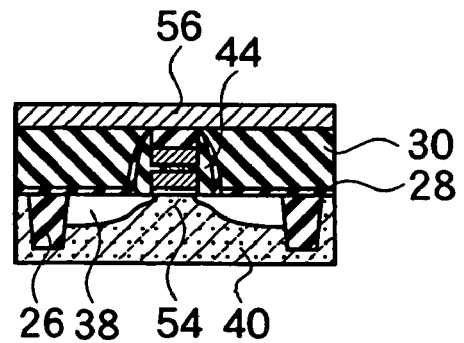
FIG. 18D is a schematic cross-sectional structure of a transistor in the peripheral circuit.
Figure 19A:
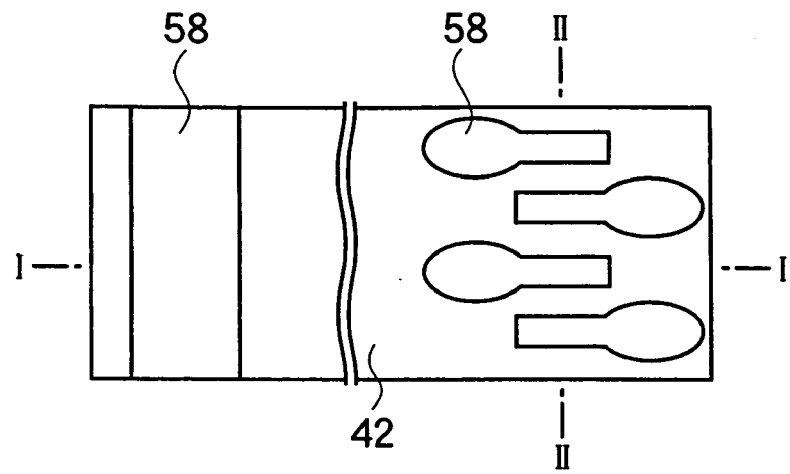
FIG. 19A is an aerial view of a pattern showing a step of the fabrication method of the nonvolatile semiconductor memory according to the first embodiment of the present invention.
Figure 19B:
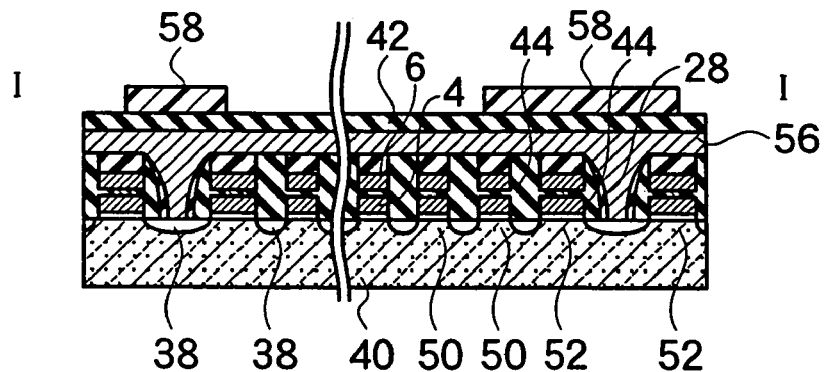
FIG. 19B is a schematic cross-sectional structure cut along the line I-I.
Figure 19C:
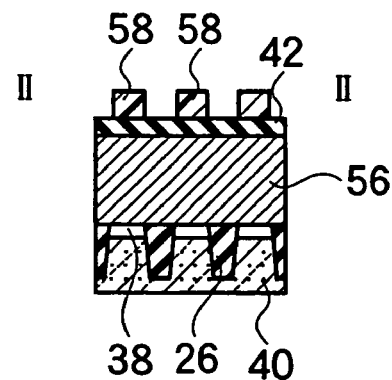
FIG. 19C is a schematic cross-sectional structure cut along the line II-II.
Figure 19D:
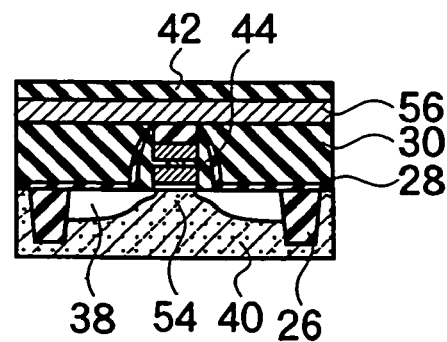
FIG. 19D is a schematic cross-sectional structure of a transistor in the peripheral circuit.
Figure 20A:
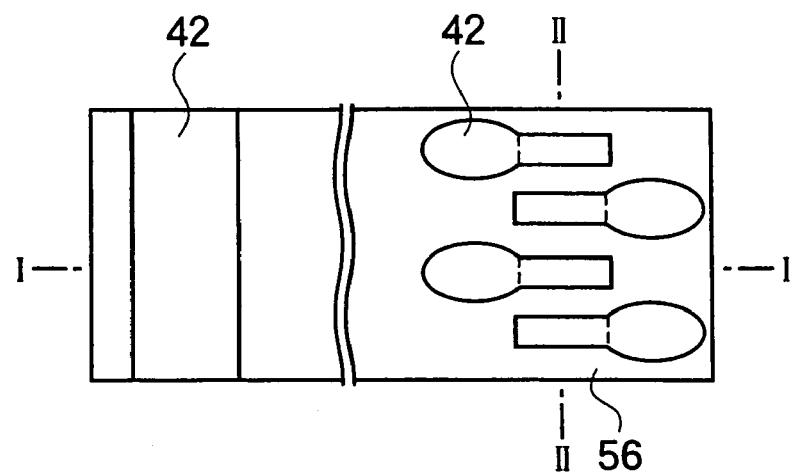
FIG. 20A is an aerial view of a pattern showing a step of the fabrication method of the nonvolatile semiconductor memory according to the first embodiment of the present invention.
Figure 20B:
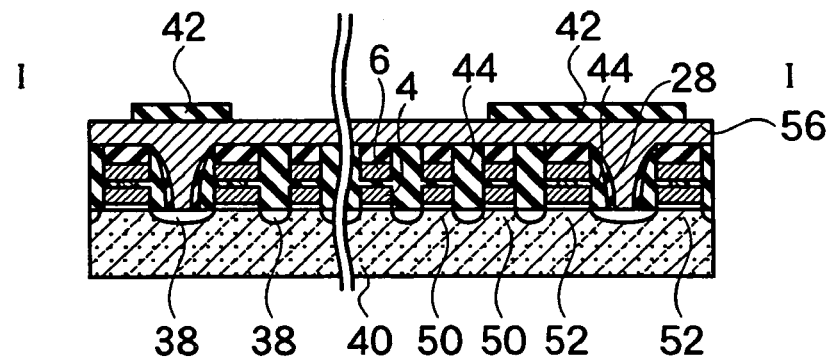
FIG. 20B is a schematic cross-sectional structure cut along the line I-I.
Figure 20C:
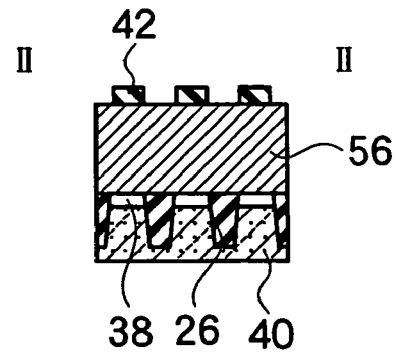
FIG. 20C is a schematic cross-sectional structure cut along the line II-II.
Figure 20D:
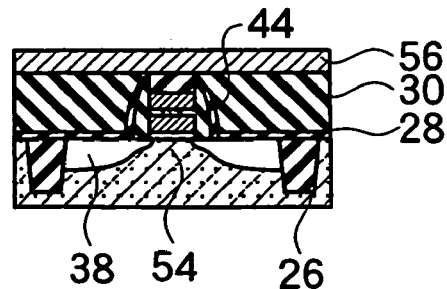
FIG. 20D is a schematic cross-sectional structure of a transistor in the peripheral circuit.

(c) A sidewall insulator film 44 formed of an oxide film with a thickness of approximately 20 to 200 nm is deposited (FIG. 11A through FIG. 1D). In this case, it is desirable that the areas between the memory cell transistors are filled with the sidewall insulator film 44. In other words, it is desirable that the thickness of the sidewall insulator film 44 is thicker by one-half or more than the area between the memory cell transistors.

(d) The sidewall insulator film 44 is subjected to anisotropic etching so that the sidewall insulator film 44 remains inbetween the sidewalls of the select transistors 52 and the memory cell transistors 50 (FIG. 12A through FIG. 12D).

(e) A barrier insulator film 28 is then deposited across the entire surface of the semiconductor substrate 40. The barrier insulator film 28 is formed of a silicon nitride film with a thickness of approximately 5 to 50 nm. The barrier insulator film 28 must be an insulator film having etching selectivity in terms of the first interlayer film 30 to be deposited in the following process (FIG. 13A through FIG. 13D).

(f) The areas between gates are filled with the first interlayer film 30 (FIG. 14A through FIG. 14D).

(g) The first interlayer film 30 is planarized using chemical mechanical polishing (CMP) technology (FIG. 15A through FIG. 15D).

(h) The first interlayer film 30 between the select transistors 52 is then removed by etching while coating the peripheral circuit 2 with a photoresist 55. Isotropic etching or anisotropic etching may be used, however, etching conditions including etch selectivity to the barrier insulator film 28, that is, etching conditions that prevent the barrier insulator film 28 from being etched must be used. Employment of such etching conditions prevents the sidewall insulator film 44 coated with the barrier insulator film 28 from being etched (FIG. 16A through FIG. 16D).

(i) Once the photoresist 55 is removed, the barrier insulator film 28 on the select transistors 52, the memory cell transistors 50, and the semiconductor substrate 40 is removed through anisotropic etching, whereas the barrier insulator film 28 at the sidewalls of the gates of the select transistors 52 and the peripheral transistors 54 is not removed (FIG. 17A through FIG. 17D). Alternatively, the barrier insulator film 28 at the gate sidewalls may be removed through isotropic etching.

(j) Next, the conductive metal material 56 such as tungsten, aluminum, or copper, is deposited 50 to 500 nm thick via a barrier metal such as impurity-doped polysilicon, amorphous silicon, titanium (Ti), tantalum (Ta), tantalum nitride (TaN), or titanium nitride (TiN). The conductive material 56 must have at least a sufficient thickness for completely filling the area between the select transistors 52 (FIG. 18A through FIG. 18D).

(k) Next, a mask insulator film 42 formed of a silicon oxide film or a silicon nitride film is deposited upon the conductive material 56 in a thickness range of 10 to 500 nm, and a photoresist 58 is then subjected to patterning (FIG. 19A through FIG. 19D). In this case, a photoresist 58 pattern is used as a pattern for the source line SL and the extending line 22 for the bit line contacts CBL.

(l) The mask insulator film 42 is then subjected to patterning using the photoresist 58 as a mask (FIG. 20A through FIG. 20D).

Figure 21A:
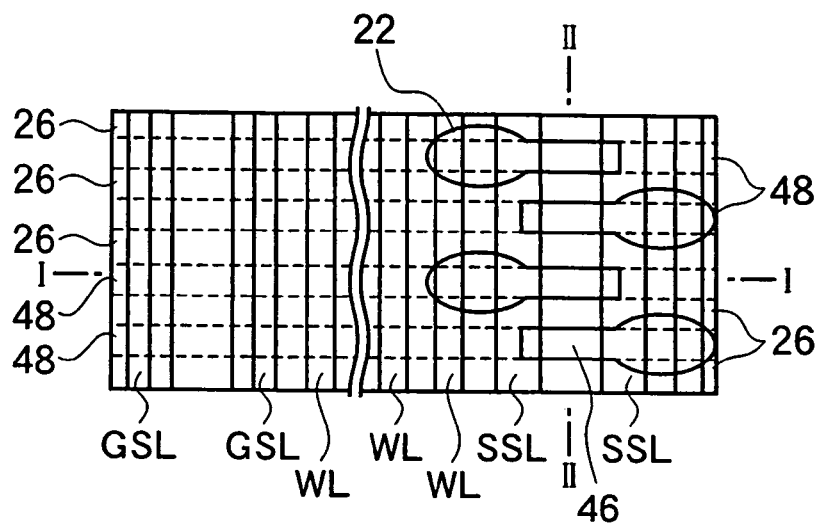
FIG. 21A is an aerial view of a pattern showing a step of the fabrication method of the nonvolatile semiconductor memory according to the first embodiment of the present invention.
Figure 21B:
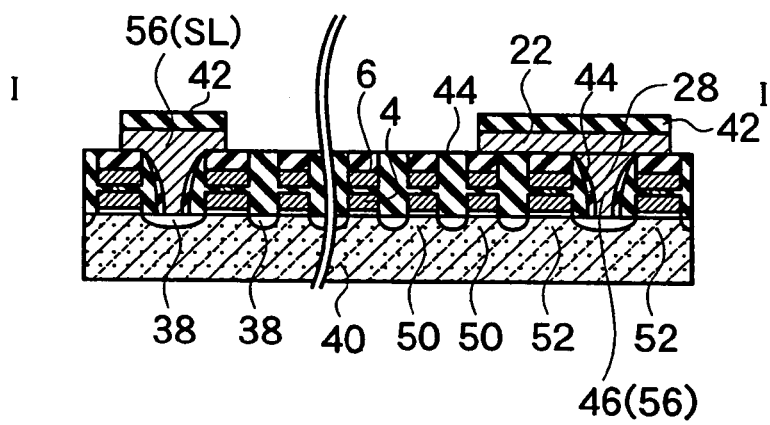
FIG. 21B is a schematic cross-sectional structure cut along the line I-I.
Figure 21C:
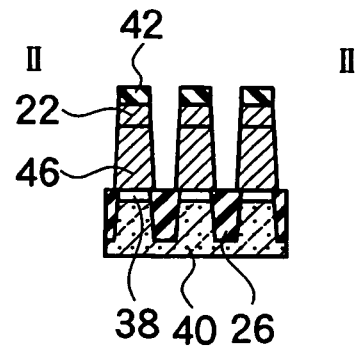
FIG. 21C is a schematic cross-sectional structure cut along the line II-II.
Figure 21D:
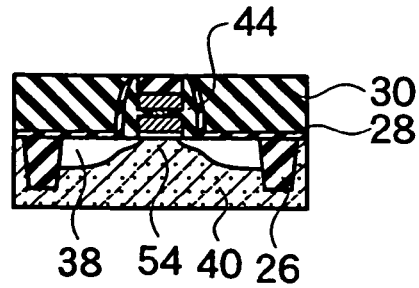
FIG. 21D is a schematic cross-sectional structure of a transistor in the peripheral circuit.
Figure 22A:
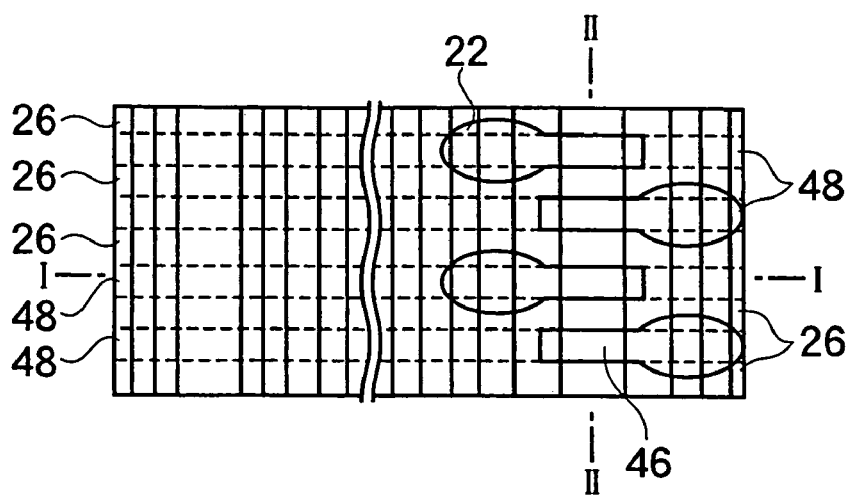
FIG. 22A is an aerial view of a pattern showing a step of the fabrication method of the nonvolatile semiconductor memory according to the first embodiment of the present invention.
Figure 22B:
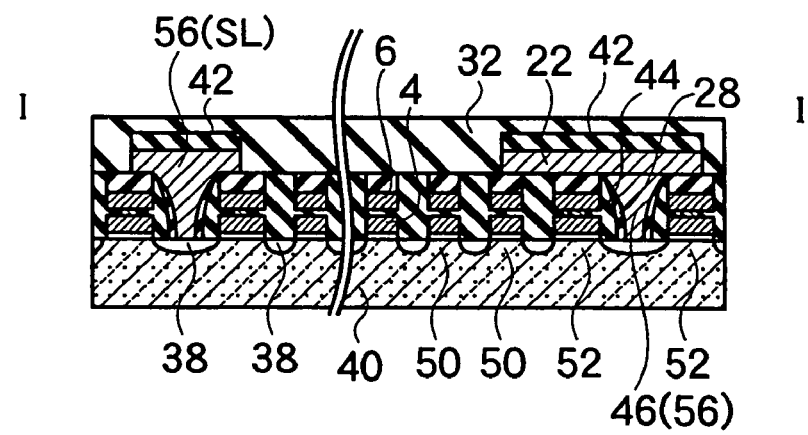
FIG. 22B is a schematic cross-sectional structure cut along the line I-I.
Figure 22C:
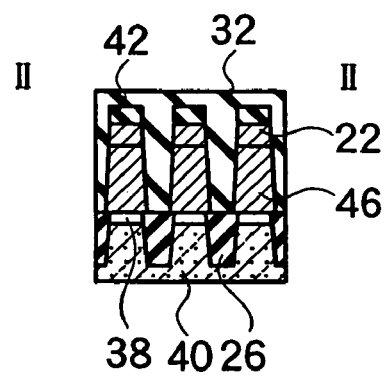
FIG. 22C is a schematic cross-sectional structure cut along the line II-II.
Figure 22D:
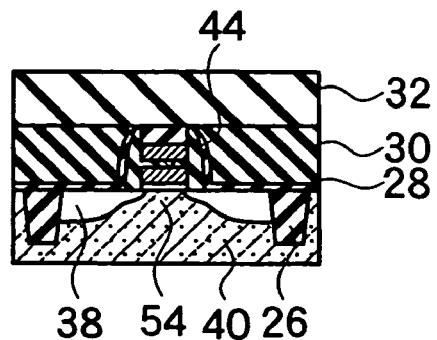
FIG. 22D is a schematic cross-sectional structure of a transistor in the peripheral circuit.
Figure 24A:
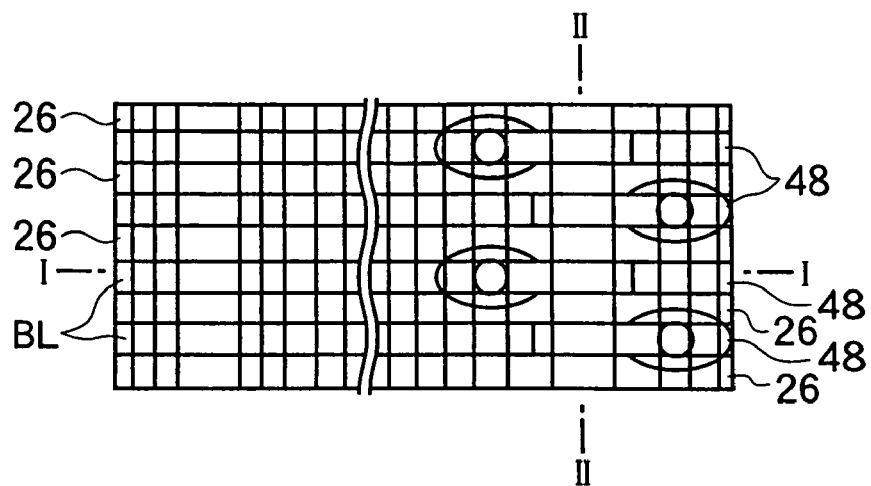
FIG. 24A is an aerial view of a pattern showing a step of the fabrication method of the nonvolatile semiconductor memory according to the first embodiment of the present invention.
Figure 24B:
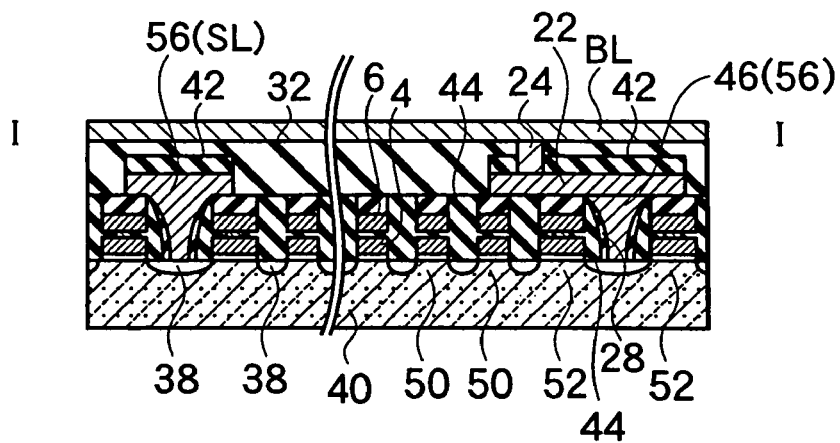
FIG. 24B is a schematic cross-sectional structure cut along the line I-I.
Figure 24C:
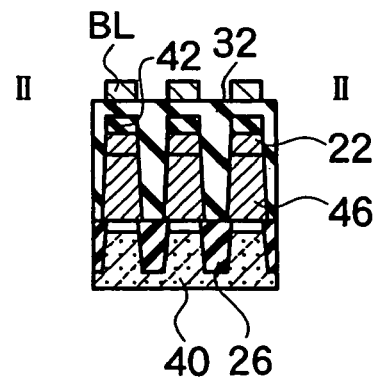
FIG. 24C is a schematic cross-sectional structure cut along the line II-II.
Figure 24D:
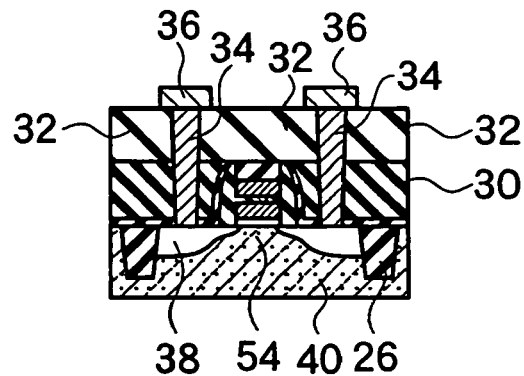
FIG. 24D is a schematic cross-sectional structure of a transistor in the peripheral circuit.

(m) Next, the conductive material 56 is processed through anisotropic etching using the mask insulator film 42 as an etching mask, so as to form the source line SL, the bit line contacts CBL, and the extending line 22 for the bit line contacts CBL made of the same conductive material 56 (FIG. 21A through FIG. 21D). As shown in FIG. 21B, anisotropic etching conditions are adjusted so that the cross section cut along the line II-II that is perpendicular to the bit lines BL has a forward tapered shape. Such a shape is desirable for making the width of the bit line contacts CBL greater than that of the device region 48 at the junction with the semiconductor device region 48. This structure provides a processing margin and reduces the contact resistance.

(n) Next, the second interlayer film 32 formed of a silicon oxide film is deposited in a thickness range of 100 to 1000 nm, and is then planarized, if necessary (FIG. 22A through FIG. 22D).

(o) Next, the peripheral transistor contacts 34 for the source/drain diffusion layers 38 of the peripheral transistors in the peripheral circuit 2 and the via contacts 24 for the memory cell array 1 are formed simultaneously (FIG. 23A through FIG. 23D).

(p) Next, the interconnect layers 36 for the peripheral transistors and the bit lines BL are formed simultaneously (FIG. 24A through FIG. 24D). Thereafter, an upper interconnect layer and a passivation film or the like are formed to complete the nonvolatile semiconductor memory according to the first embodiment of the present invention.

Second Embodiment

Figure 25:
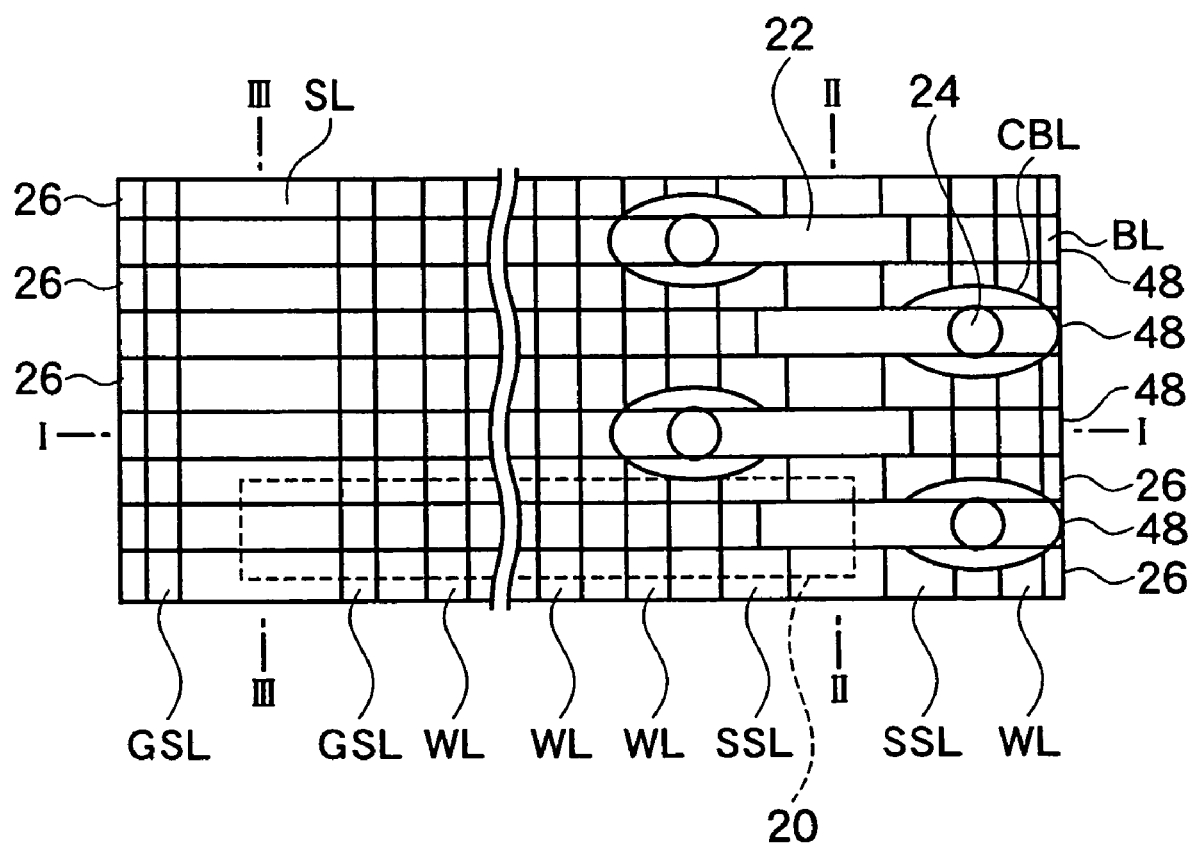
FIG. 25 is an aerial view of a partial pattern in a memory cell array of a nonvolatile semiconductor memory according to a second embodiment of the present invention.
Figure 26A:
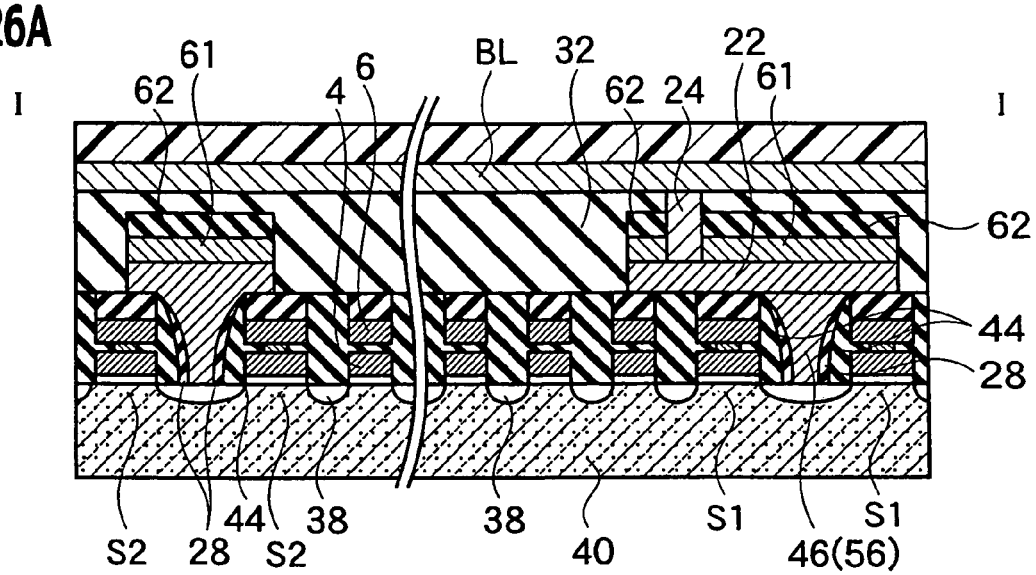
FIG. 26A is a schematic cross-sectional structure cut along the line I-I in FIG. 25.
Figure 26B:
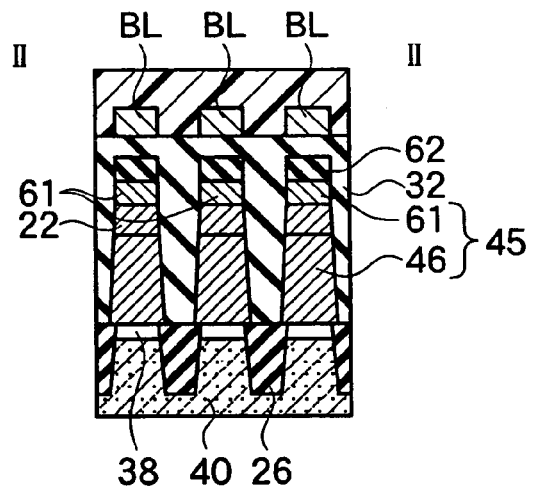
FIG. 26B is a schematic cross-sectional structure cut along the line II-II in FIG. 25.
Figure 26C:
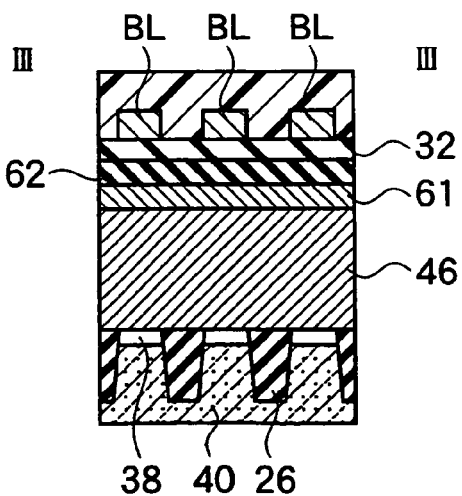
FIG. 26C is a schematic cross-sectional structure cut along the line III-III in FIG. 25.
Figure 27:
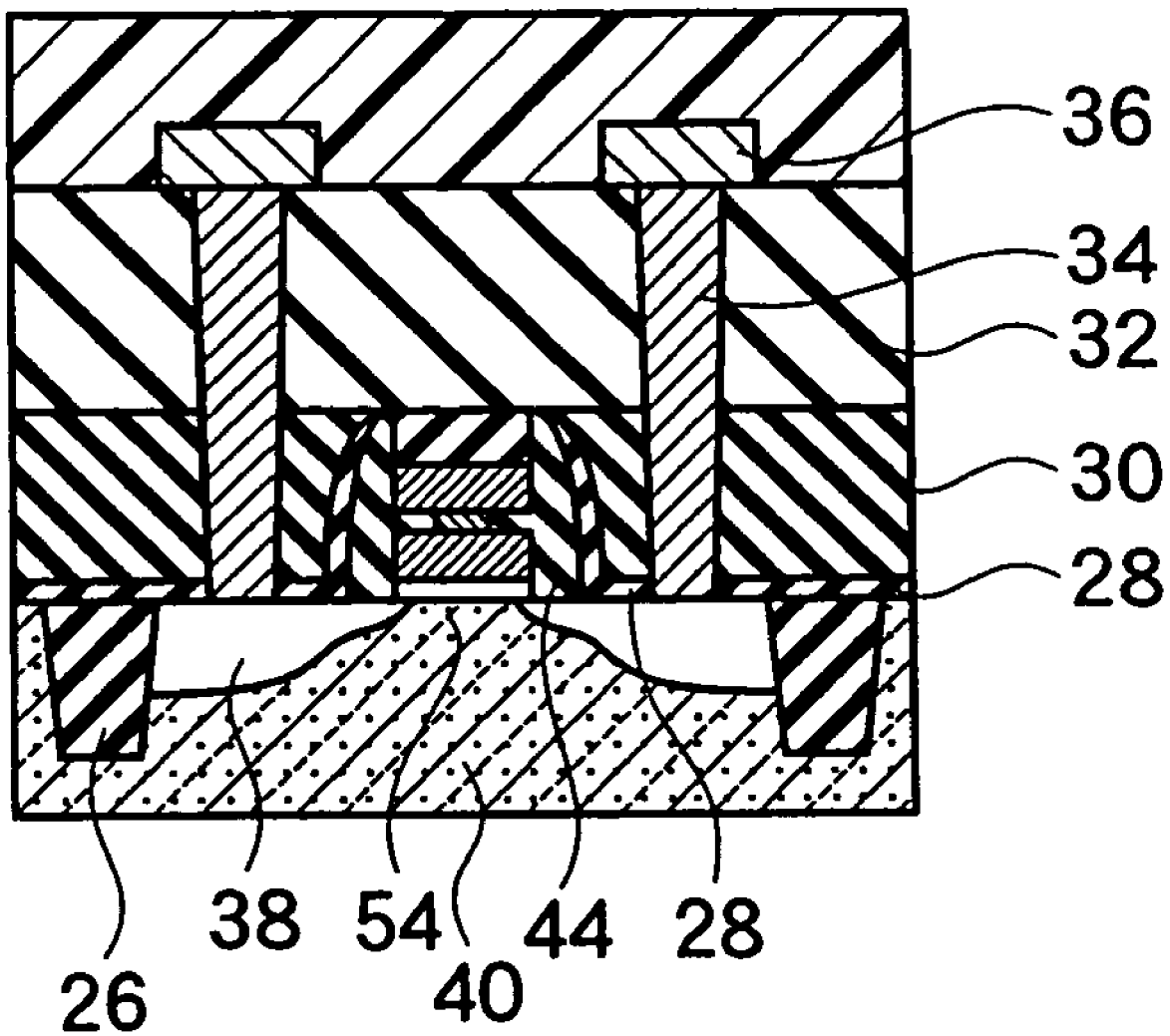
FIG. 27 is a schematic cross-sectional structure of a transistor in a peripheral circuit of the nonvolatile semiconductor memory according to the second embodiment of the present invention.
Figure 28A:
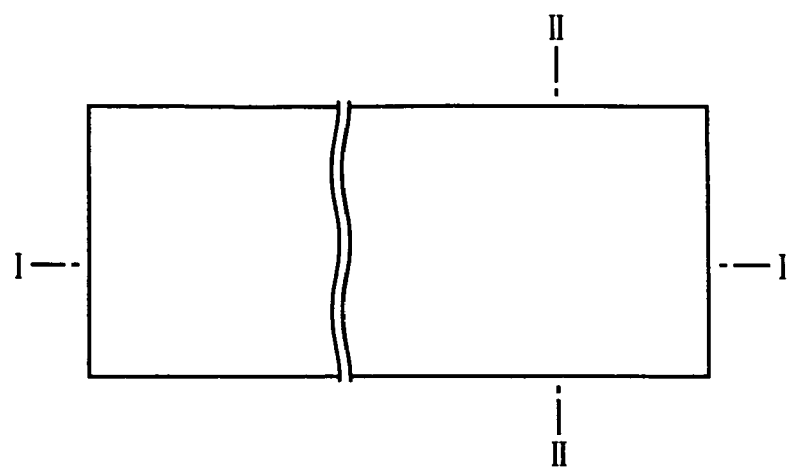
FIG. 28A is an aerial view of a pattern showing a step of a fabrication method of the nonvolatile semiconductor memory according to the second embodiment of the present invention.
Figure 28B:
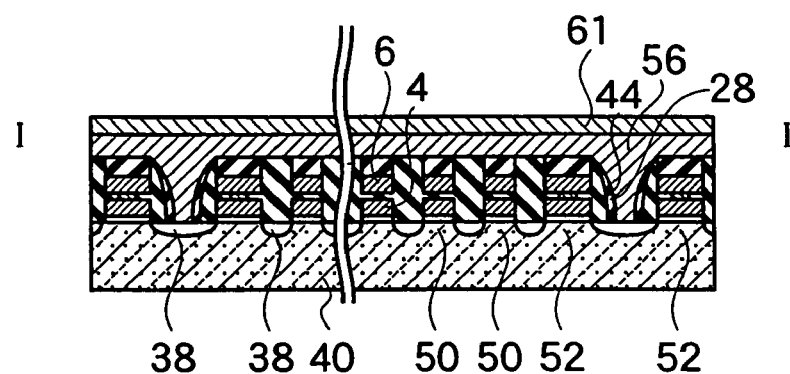
FIG. 28B is a schematic cross-sectional structure cut along the line I-I.
Figure 28C:
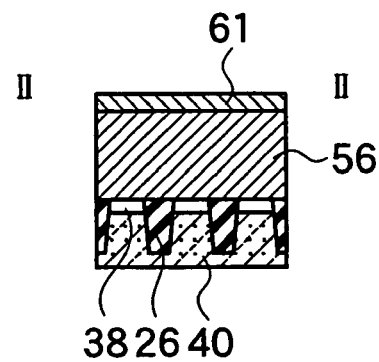
FIG. 28C is a schematic cross-sectional structure cut along the line II-II.
Figure 28D:
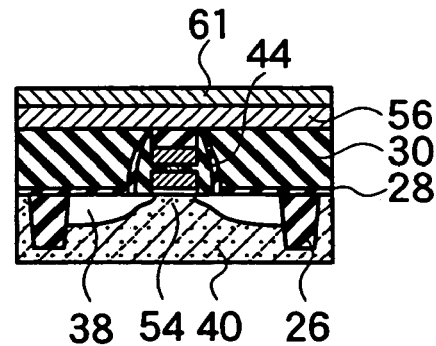
FIG. 28D is a schematic cross-sectional structure of a transistor in the peripheral circuit.
Figure 29A:
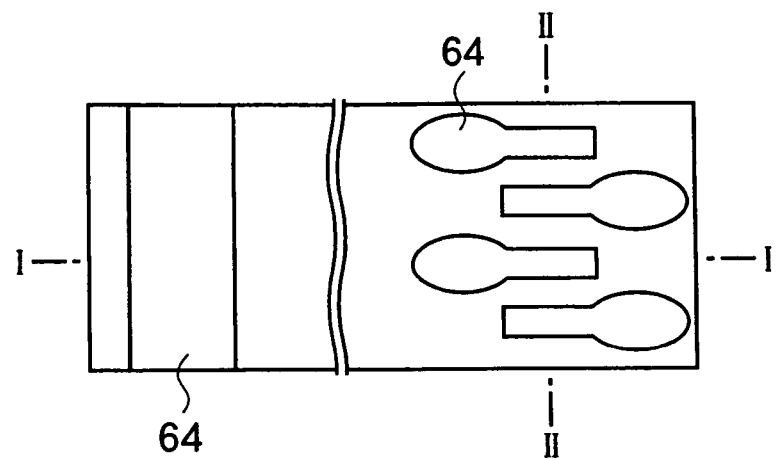
FIG. 29A is an aerial view of a pattern showing a step of the fabrication method of the nonvolatile semiconductor memory according to the second embodiment of the present invention.
Figure 29B:
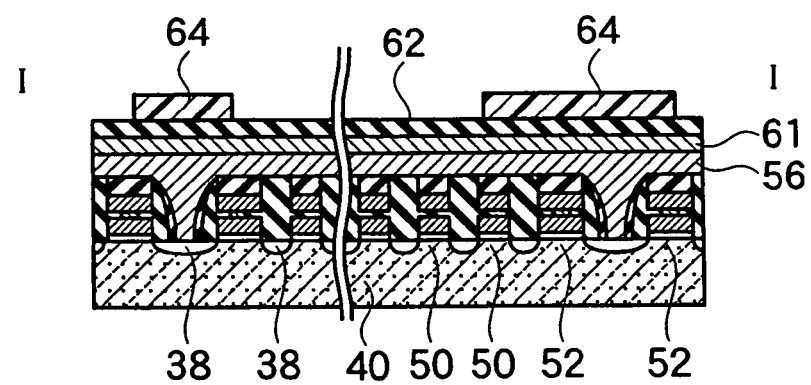
FIG. 29B is a schematic cross-sectional structure cut along the line I-I.
Figure 29C:
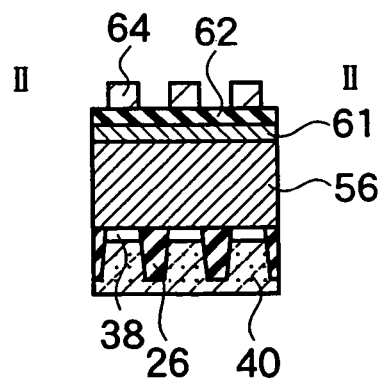
FIG. 29C is a schematic cross-sectional structure cut along the line II-II.
Figure 29D:
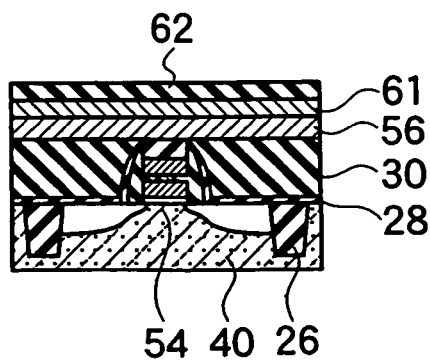
FIG. 29D is a schematic cross-sectional structure of a transistor in the peripheral circuit.
Figure 30A:
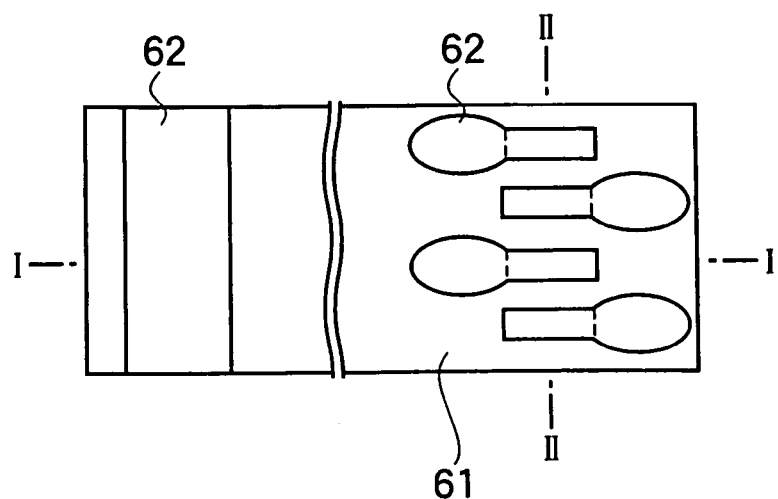
FIG. 30A is an aerial view of a pattern showing a step of the fabrication method of the nonvolatile semiconductor memory according to the second embodiment of the present invention.
Figure 30B:
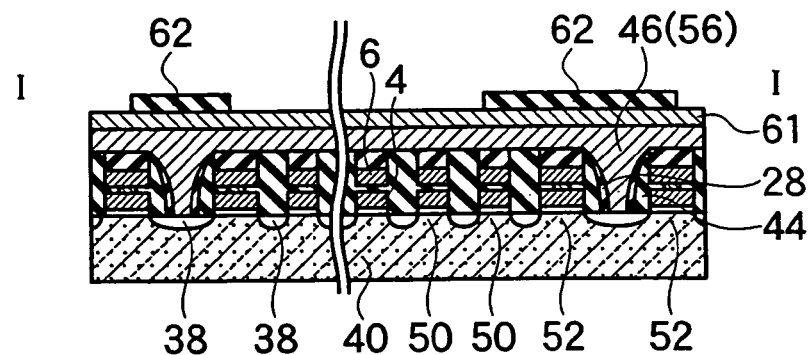
FIG. 30B is a schematic cross-sectional structure cut along the line I-I.
Figure 30C:
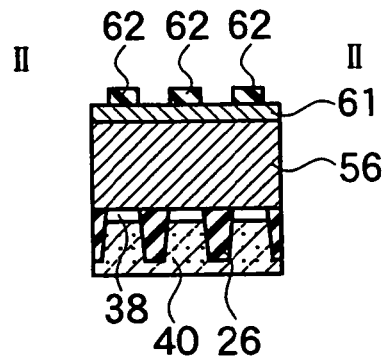
FIG. 30C is a schematic cross-sectional structure cut along the line II-II.
Figure 30D:
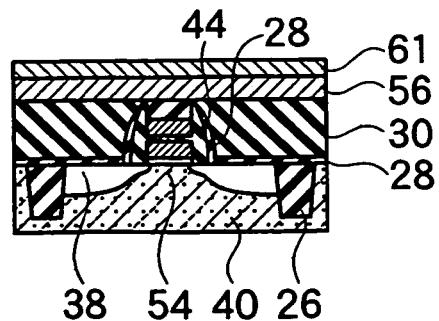
FIG. 30D is a schematic cross-sectional structure of a transistor in the peripheral circuit.

A nonvolatile semiconductor memory according to a second embodiment of the present invention is described referencing FIG. 25 through FIG. 27. The second embodiment differs from the first embodiment in that a second conductive material 61 is formed upon the conductive material 56 (first conductive material), to fill the area between the select transistors 52. Here, the first conductive material 56 is impurity-doped polysilicon or amorphous silicon, and the second conductive material 61 is a metal material such as tungsten, aluminum, or copper deposited via a barrier metal such as Ti, Ta, TaN, or TiN. Connection of the second conductive material 61, with lower resistivity than the first conductive material 56, to the top of the first conductive material 56, as described above, allows reduction in the resistances of the bit line contact plugs 45, the extending lines 22, and the source lines, resulting in improved performance of the nonvolatile semiconductor memory.

FIG. 25 is an aerial view of a part of the memory cell array. FIGS. 26A through 26C are schematic cross-sectional structures cut along the lines I-I, II-II, and III-III, respectively, in the aerial view of FIG. 25. Device isolating regions 26 are disposed with a striped form in the semiconductor substrate 40 at fixed intervals in a first direction along the line I-I, and word lines WL are disposed with a striped form in a direction perpendicular to the first direction. In addition, as shown in FIG. 26A, the memory cell transistors are connected in series via diffusion layers 38, and connected to a source line SL and a bit line contact CBL via the select transistors S2 and S1 on both ends of the memory cell transistors connected in series, respectively. A bit line contact 46 and an extending line 22, which are made of a contact plug conductive material, are buried between the adjacent select transistors S1 via sidewall insulator films 44 so as to form a bit line contact CBL. Similarly, the contact plug conductive material is buried between the adjacent select transistors S2 via the sidewall insulator films 44 so as to form a source line SL. The contact plug conductive material is, for example, impurity-doped polysilicon or amorphous silicon. Alternatively, the contact plug conductive material is a metal such as tungsten, aluminum, or copper deposited via a barrier metal such as Ti, Ta, TaN, or TiN.

The conductive material buried between the source select transistors S2 is linearly formed parallel to the word line WL so as to form a source line SL. The upper portion of each conductive material protrudes over corresponding select transistor S2. Such a shape with an extended upper portion allows an increase in the cross-sectional area, and reduction in the resistance of the source line SL, resulting in improved performance of the nonvolatile semiconductor memory.

FIG. 26B shows a cross section II-II that is perpendicular to the bit lines BL made of the conductive material filled inbetween drain select transistors S1. The conductive material forms lines and spaces altenately arranged at the same pitch as the device isolating region 26, and forms bit line contact plugs 45. Each of the bit line contact plug 45 is, as shown in FIG. 26B, made up of the bit line contact 46, the second conductive material 61, which is formed as a common region, and the extending line 22. In addition, each bit line contact plug 45 has a forward tapered shape with the bottom width ('width' means the length perpendicular to the bit line BL) longer than the top width. The top width is almost equivalent to a half pitch, and the bottom width is longer than the half pitch, and is longer than the width of a device region 48 to which the bit line contact plug 45 is connected. Such a shape allows an increase in lithographic margins and etching margins during formation of the bit line contact plug 45, thereby minimizing the contact resistance at the junction with the semiconductor device region 48.

The conductive material of each bit line contact plug 45 has its upper portion and the second conductive material 61 protruding over the select transistor and the memory cell transistor, and forms an extending line 22 for a bit line contact 46 as shown in FIG. 25 and FIG. 26A. This extending line 22 is connected to the bit line BL via a via contact 24.

On the other hand, a peripheral transistor 54 in the peripheral circuit has, as shown in FIG. 27, diffusion layers 38 sandwiched inbetween the device isolating regions 26, sidewall insulator films 44, barrier insulator films 28, a first interlayer film 30, a second interlayer film 32, peripheral transistor contacts 34, and interconnect layers 36. The peripheral transistor 54 is formed on a different-layer than the bit line contact plug 45 shown in FIG. 26B, and is connected to the interconnect layers 36, which are the same layer as the bit lines BL. Such configuration allows independent formation of the bit line contacts CBL and the peripheral transistor contacts 34 made of the most appropriate material, respectively, resulting in improved performance of the nonvolatile semiconductor memory. Naturally, manufacturing cost can be reduced by forming both of them in the same layer.

(Fabrication Method of the Second Embodiment)

A fabrication method of the nonvolatile semiconductor memory according to the second embodiment of the present invention is described referencing FIG. 28 through FIG. 34. In each process shown in FIG. 28 through FIG. 34, A shows an aerial view of a partial pattern of the memory cell array, B shows a schematic cross-sectional device structure cut along the line I-I in A, C shows a schematic cross-sectional device structure cut along the line II-II in A, and D shows a schematic cross-sectional device structure of a peripheral transistor in the peripheral circuit. FIG. 28 through FIG. 34 correspond to FIG. 18 through FIG. 24 according to the first embodiment. Description of the same processes as those of the first embodiment is omitted.

One feature of the fabrication method of the second embodiment is the step of depositing the second conductive material 61, which is made of a metal such as tungsten, aluminum, or copper, via a barrier metal such as Ti, Ta, TaN, or TiN, so as to have a thickness of, for example, 10 to 300 nm after the step shown in FIG. 28 (corresponding to the process of FIG. 18) of filling the first conductive material 56 in the area between the select transistors 52. To begin with, the step shown in FIG. 28 is described.

(2j) The first conductive material 56 is made of a metal such as tungsten, aluminum, or copper, is deposited with a thickness of 50-500 nm via a barrier metal such as impurity-doped polysilicon, amorphous silicon, titanium (Ti) tantalum (Ta), tantalum nitride (TaN), or titanium nitride (TiN). The first conductive material 56 must have at least a sufficient thickness for completely filling the area between the select transistors 52. Next, as described above, the second conductive material 61 made of a metal such as tungsten, aluminum, or copper, is deposited with a thickness of 10-300 nm via a barrier metal such as Ti, Ta, TaN, or TiN (FIG. 28A through FIG. 28D).

(2k) Next, a mask insulator film 62 formed of a silicon oxide film or a silicon nitride film is deposited upon the second conductive material 61 in a thickness range of 10 to 500 nm, and a photoresist 64 is then subjected to patterning (FIG. 29A through FIG. 29D). In this case, a photoresist 64 pattern is used as a pattern for the source line SL and the extending line 22 for the bit line contacts CBL.

(2l) The mask insulator film 62 is then subjected to patterning using the photoresist 64 as a mask (FIG. 30A through FIG. 30D).

Figure 31A:
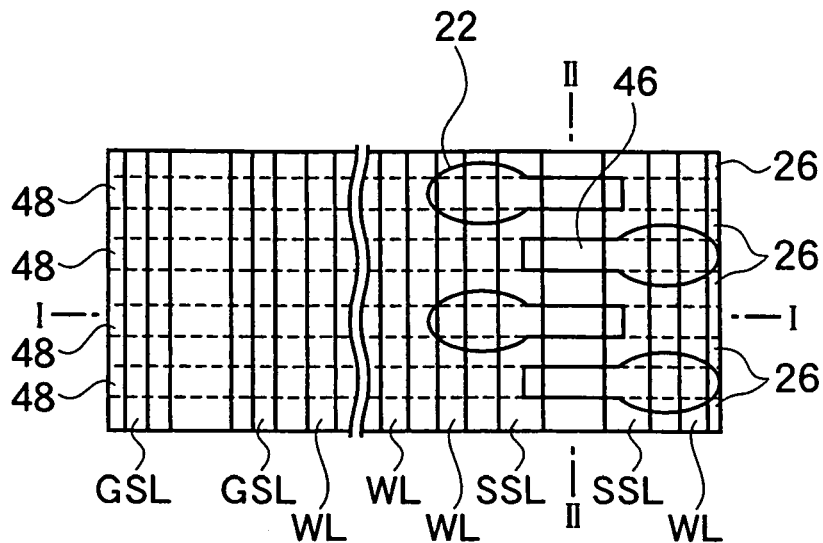
FIG. 31A is an aerial view of a pattern showing a step of the fabrication method of the nonvolatile semiconductor memory according to the second embodiment of the present invention.
Figure 31B:
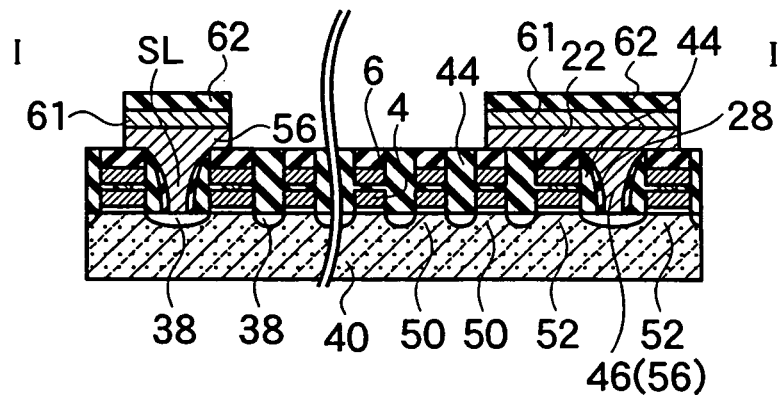
FIG. 31B is a schematic cross-sectional structure cut along the line I-I.
Figure 31C:
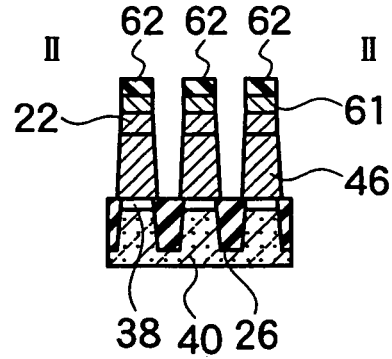
FIG. 31C is a schematic cross-sectional structure cut along the line II-II.
Figure 31D:
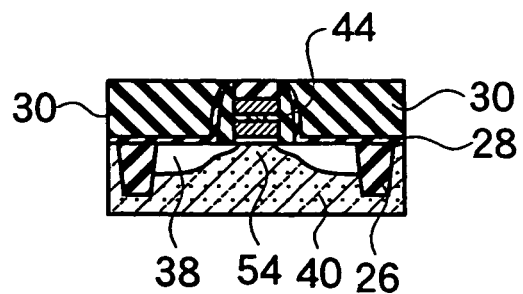
FIG. 31D is a schematic cross-sectional structure of a transistor in the peripheral circuit.
Figure 32A:
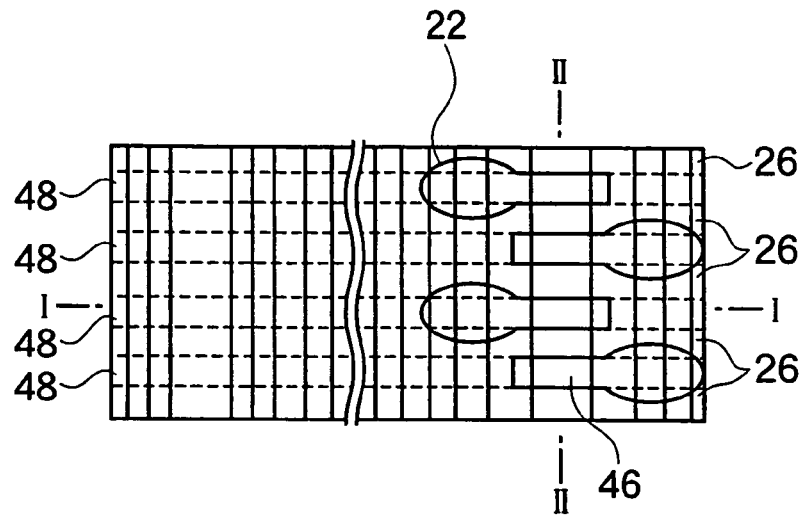
FIG. 32A is an aerial view of a pattern showing a step of the fabrication method of the nonvolatile semiconductor memory according to the second embodiment of the present invention.
Figure 32B:
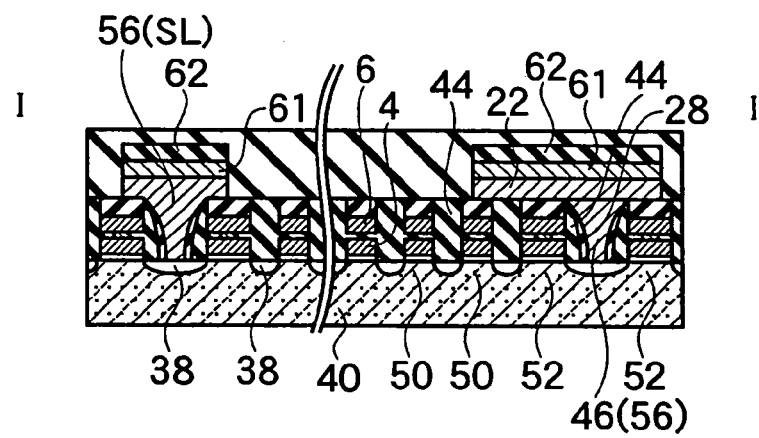
FIG. 32B is a schematic cross-sectional structure cut along the line I-I.
Figure 32C:
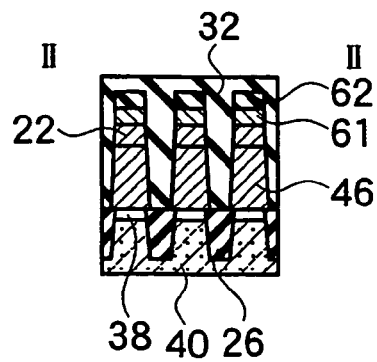
FIG. 32C is a schematic cross-sectional structure cut along the line II-II.
Figure 32D:
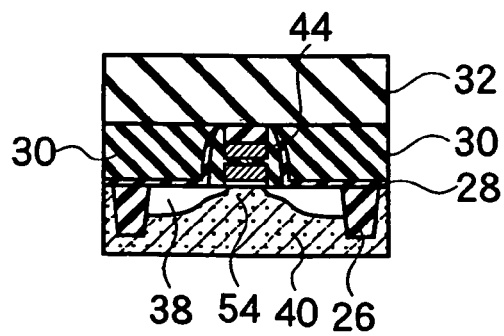
FIG. 32D is a schematic cross-sectional structure of a transistor in the peripheral circuit.
Figure 33A:
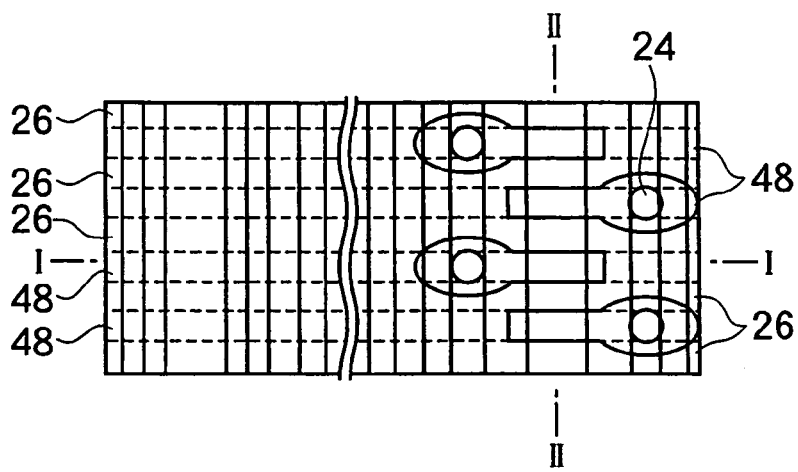
FIG. 33A is an aerial view of a pattern showing a step of the fabrication method of the nonvolatile semiconductor memory according to the second embodiment of the present invention.
Figure 33B:
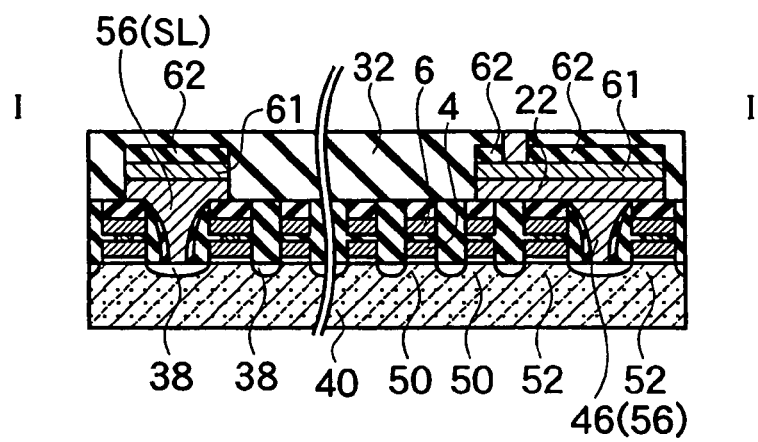
FIG. 33B is a schematic cross-sectional structure cut along the line I-I.
Figure 33C:
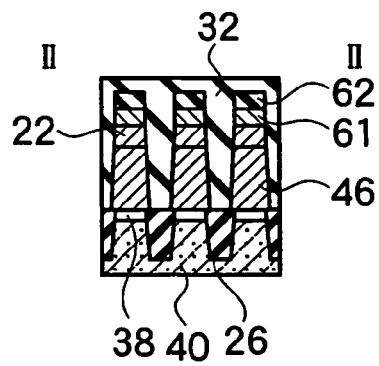
FIG. 33C is a schematic cross-sectional structure cut along the line II-II.
Figure 33D:
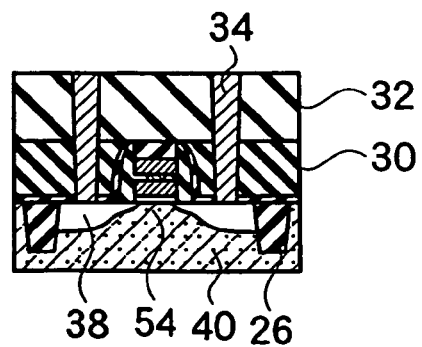
FIG. 33D is a schematic cross-sectional structure of a transistor in the peripheral circuit.
Figure 34A:
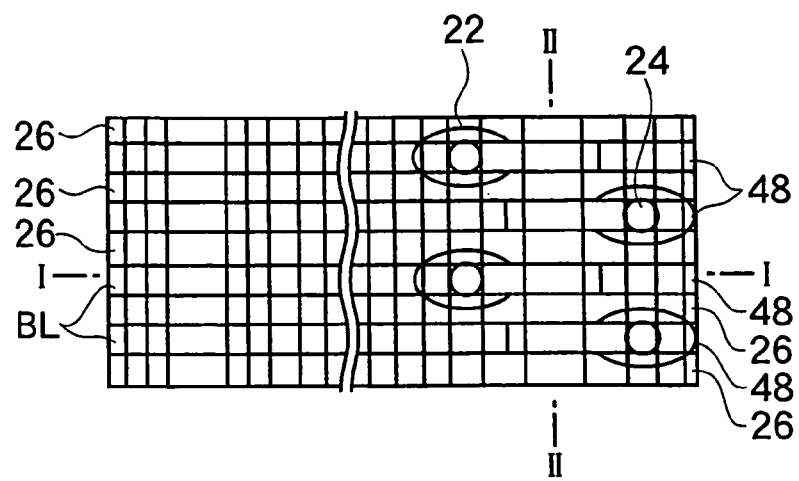
FIG. 34A is an aerial view of a pattern showing a step of the fabrication method of the nonvolatile semiconductor memory according to the second embodiment of the present invention.
Figure 34B:
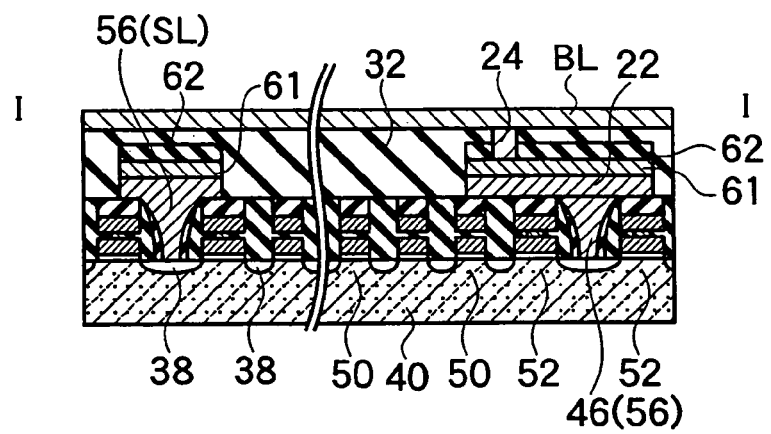
FIG. 34B is a schematic cross-sectional structure cut along the line I-I.
Figure 34C:
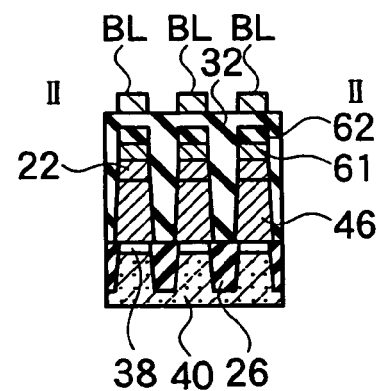
FIG. 34C is a schematic cross-sectional structure cut along the line II-II.
Figure 34D:
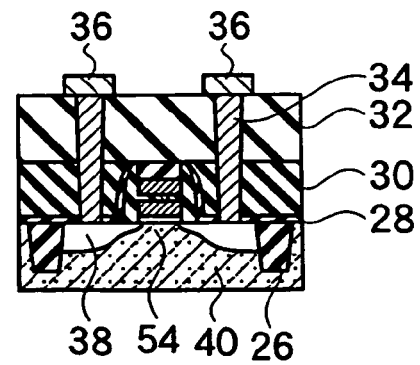
FIG. 34D is a schematic cross-sectional structure of a transistor in the peripheral circuit.

(2m) Next, the second conductive material 61 and the first conductive material 56 are processed through anisotropic etching using the mask insulator film 62 as an etching mask, so as to form the source line SL, the bit line contacts CBL, and the extending line 22 for the bit line contacts CBL made of the second conductive material 61 and the first conductive material 56 (FIG. 31A through FIG. 31D). As shown in FIG. 31B, anisotropic etching conditions are adjusted so that the cross section cut along the line II-II that is perpendicular to the bit lines BL has a forward tapered shape. Such a shape is desirable for making the width of the bit line contacts CBL greater than that of the device region 48 at the junction with the semiconductor device region 48. This provides a processing margin and reduces the contact resistance.

(2n) Next, the second interlayer film 32 formed of a silicon oxide film is deposited in a thickness range of 100 to 1000 nm, and is then planarized, if necessary (FIG. 32A through FIG. 32D).

(2o) Next, the peripheral transistor contacts 34 for the source/drain diffusion layers 38 of the peripheral transistors 54 in the peripheral circuit and the via contacts 24 for the memory cell array are formed simultaneously (FIG. 33A through FIG. 33D).

(2p) Next, the interconnect layers 36 for the peripheral transistors and the bit lines BL are formed simultaneously (FIG. 34A through FIG. 34D). Thereafter, an upper interconnect layer and a passivation film or the like are formed to complete the nonvolatile semiconductor memory according to the second embodiment of the present invention.

Third Embodiment

Figure 35:
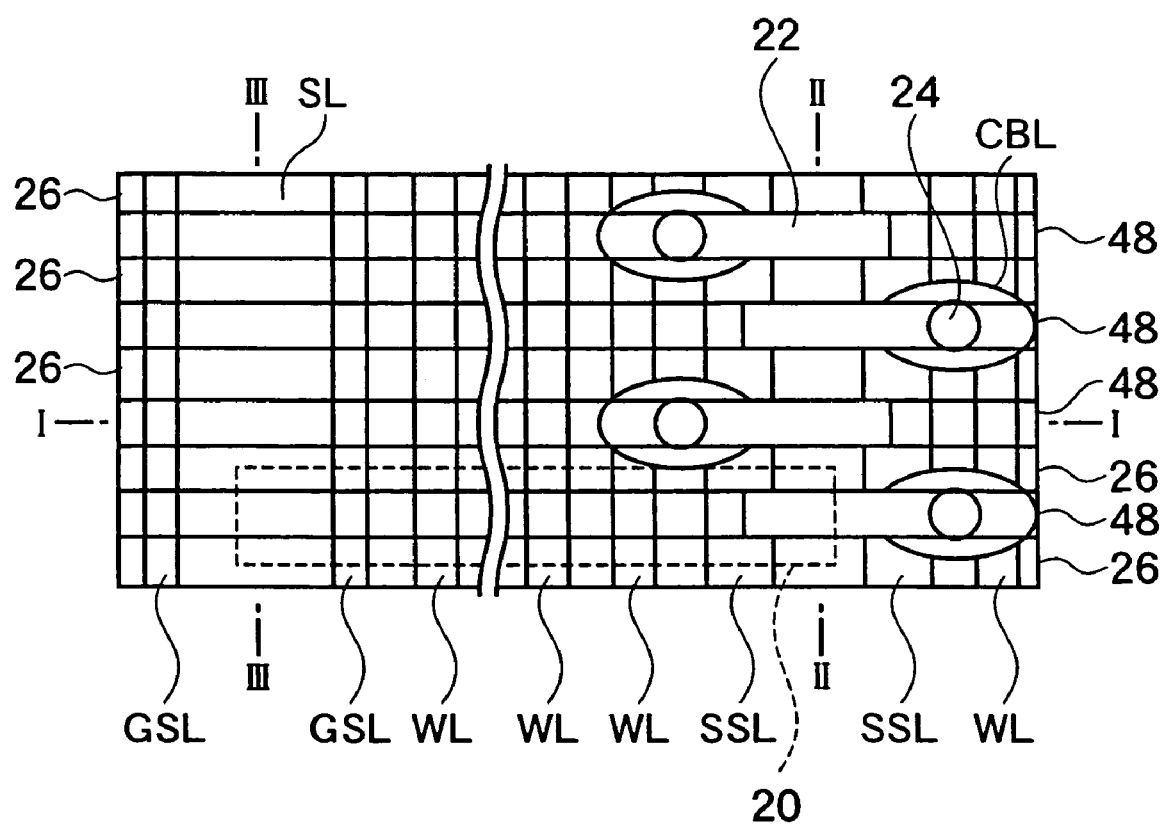
FIG. 35 is an aerial view of a partial pattern in a memory cell array of a nonvolatile semiconductor memory according to a third embodiment of the present invention.
Figure 36A:
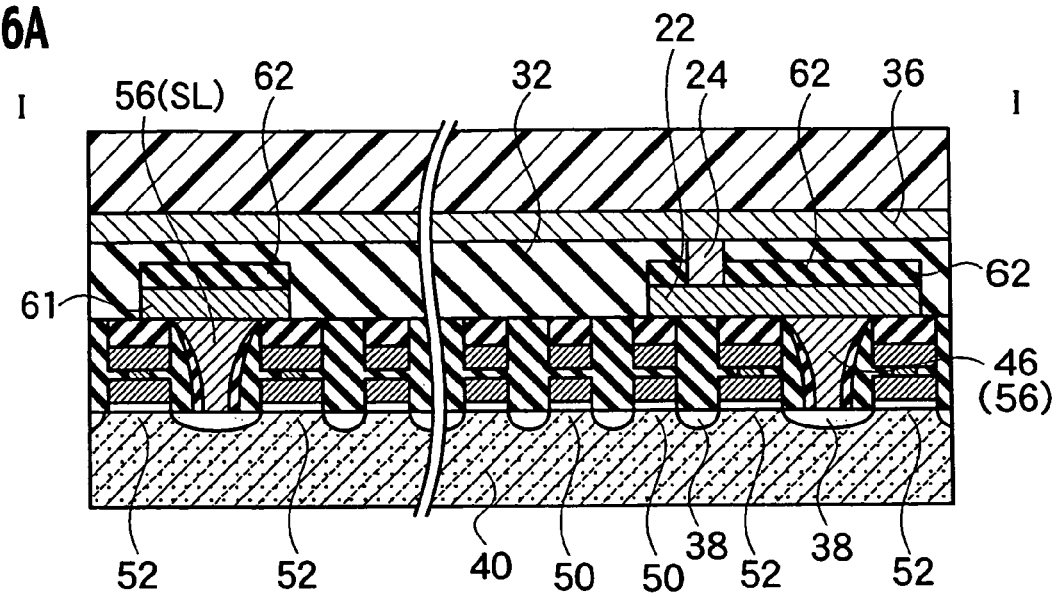
FIG. 36A is a schematic cross-sectional structure cut along the line I-I in FIG. 35.
Figure 36B:
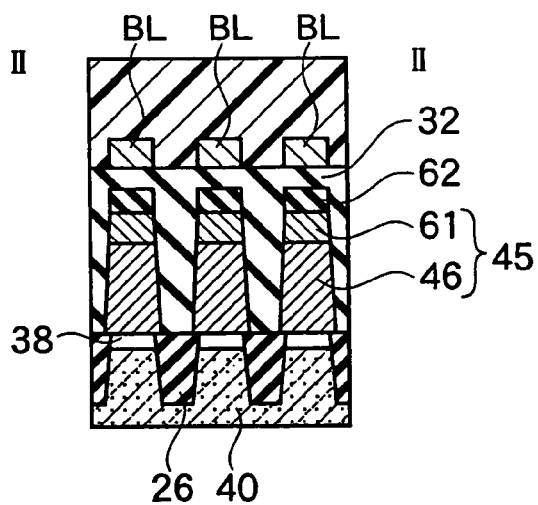
FIG. 36B is a schematic cross-sectional structure cut along the line II-II of FIG. 35.
Figure 36C:
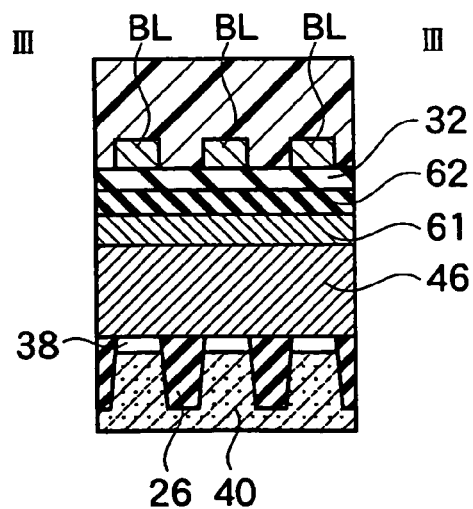
FIG. 36C is a schematic cross-sectional structure cut along the line III-III of FIG. 35.
Figure 37:
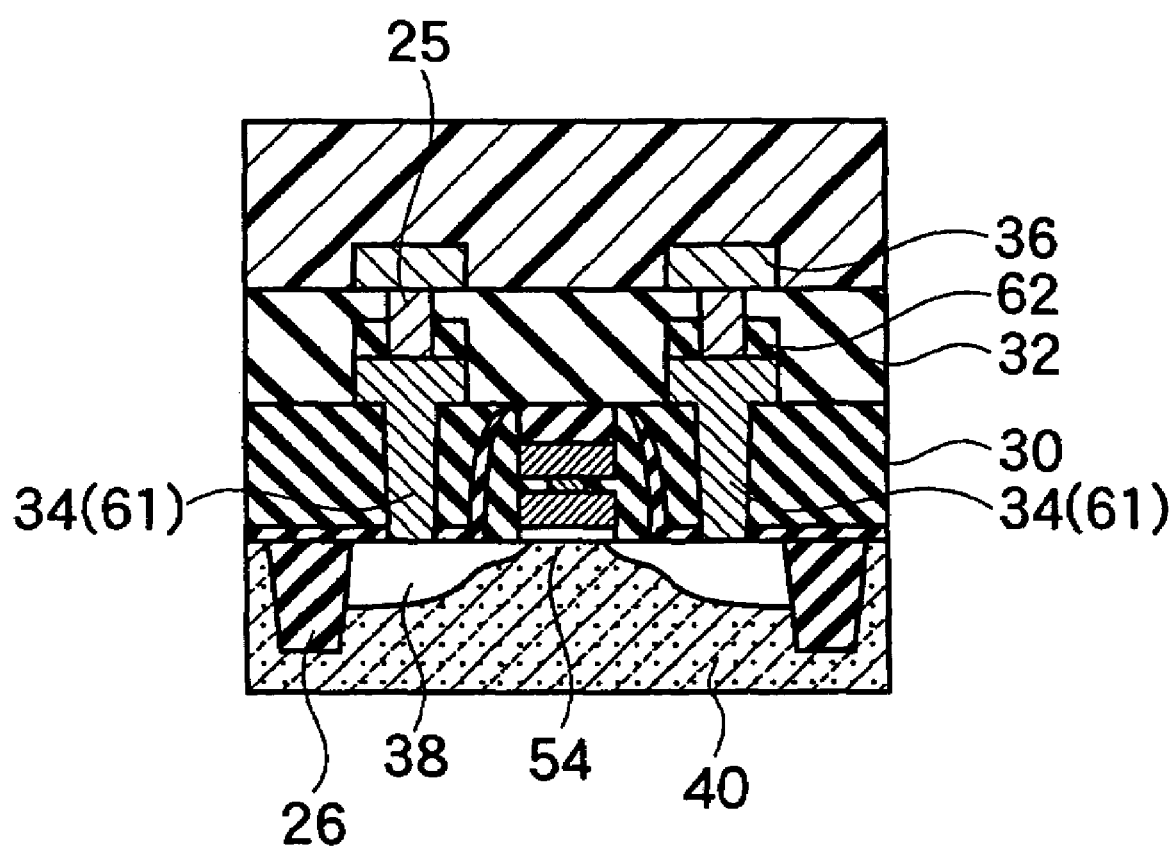
FIG. 37 is a schematic cross-sectional structure of a transistor in the peripheral circuit of the nonvolatile semiconductor memory according to the third embodiment of the present invention.
Figure 38A:
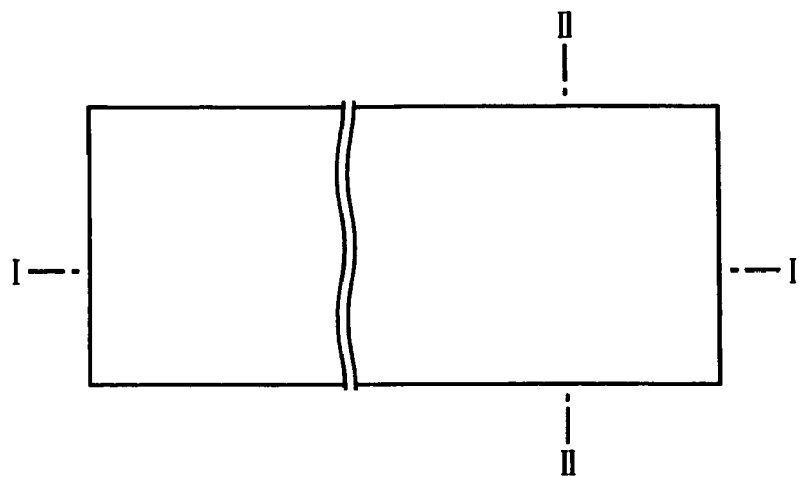
FIG. 38A is an aerial view of a pattern showing a step of a fabrication method of the nonvolatile semiconductor memory according to the third embodiment of the present invention.
Figure 38B:
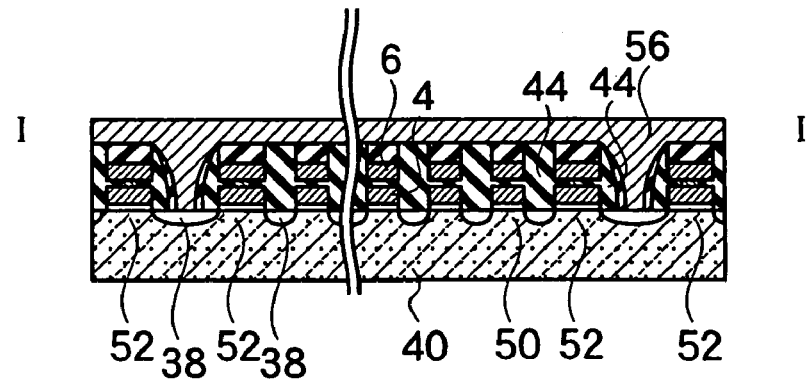
FIG. 38B is a schematic cross-sectional structure cut along the line I-I.
Figure 38C:
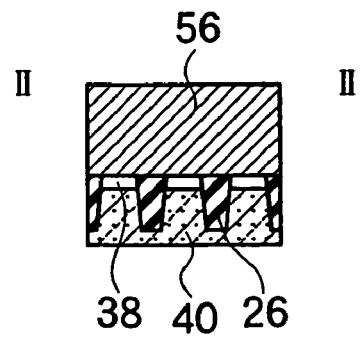
FIG. 38C is a schematic cross-sectional structure cut along the line II-II.
Figure 38D:
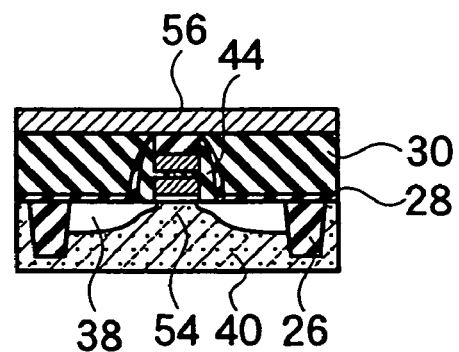
FIG. 38D is a schematic cross-sectional structure of a transistor in the peripheral circuit.
Figure 39A:
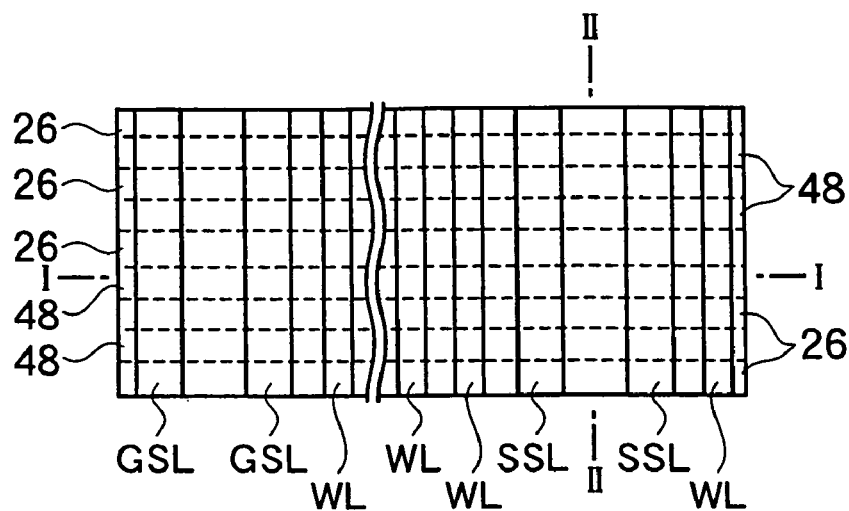
Figure 39B:
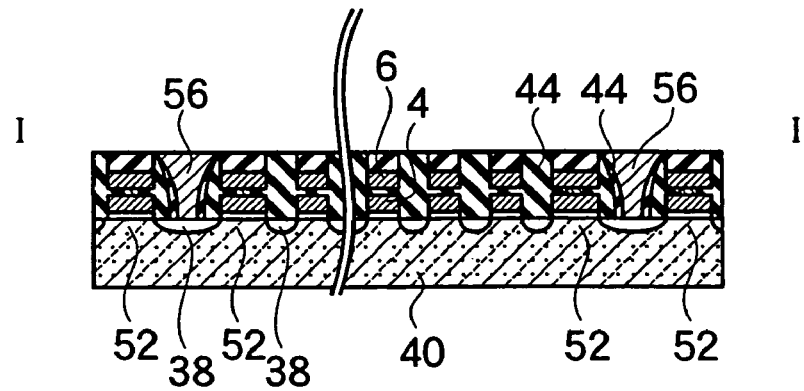
Figure 39C:
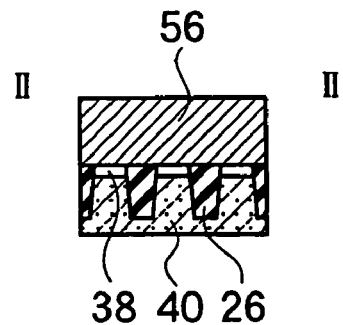
Figure 39D:
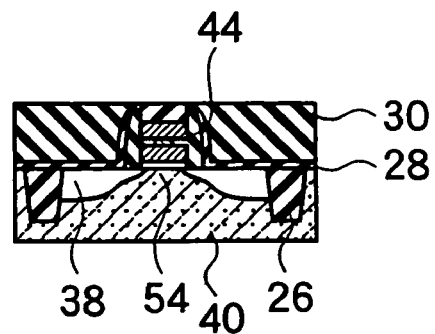
Figure 40A:
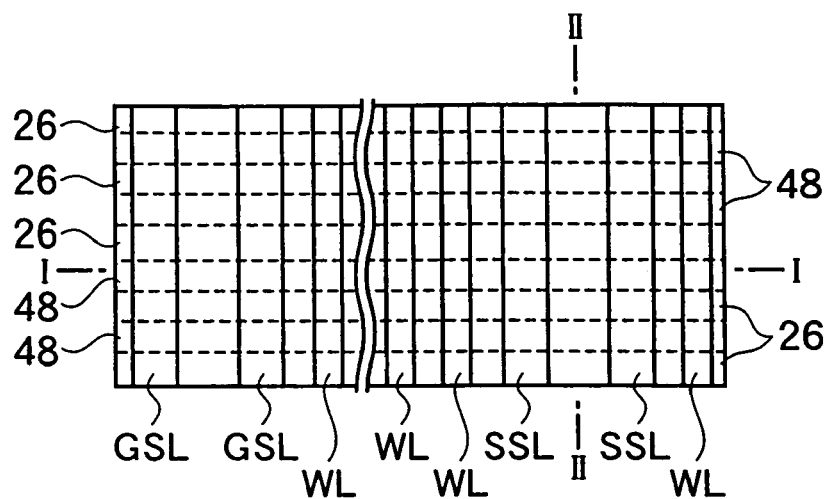
Figure 40B:
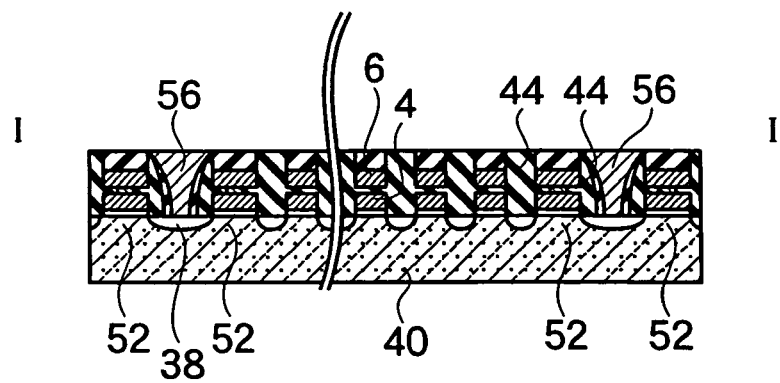
Figure 40C:
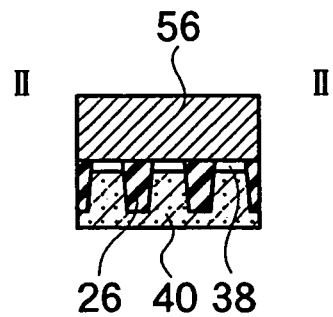
Figure 40D:
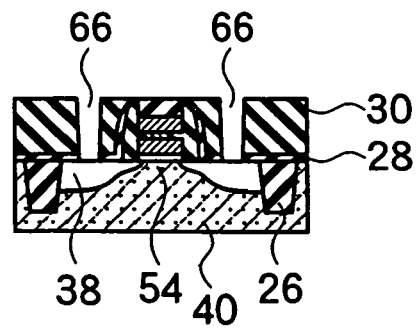
Figure 41A:
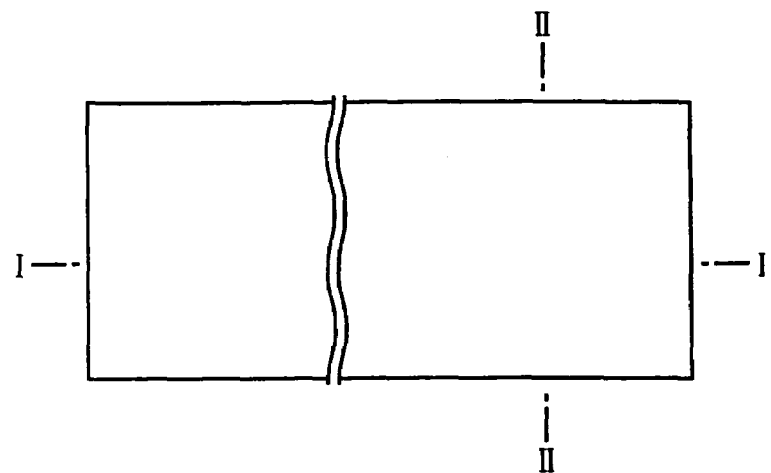
Figure 41B:
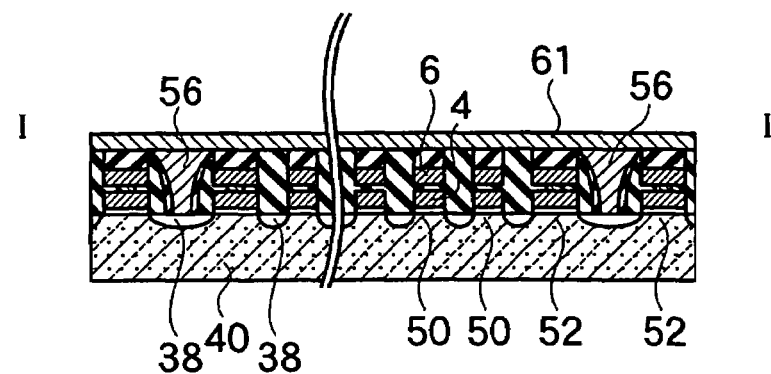
Figure 41C:
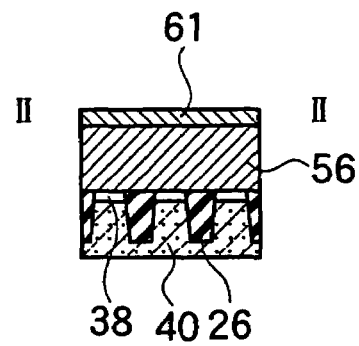
Figure 41D:
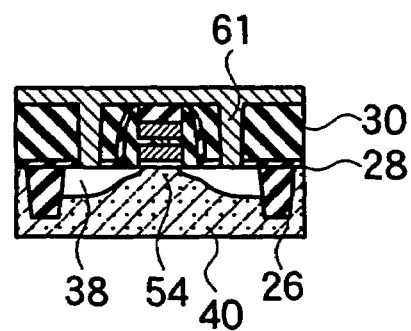

A nonvolatile semiconductor memory according to a third embodiment of the present invention is described referencing FIG. 35 through FIG. 37. A feature of the nonvolatile semiconductor memory according to the third embodiment of the present invention is, as shown in FIG. 36A, the first conductive material 56, which fills in the area between the select transistors 52 to configure the bit line contacts 46, not being disposed to protrude over the select transistors 52. In addition, another feature is, as shown in FIG. 36A, the second conductive material 61, which is disposed on the first conductive material 56, is disposed over the select transistors 52 and the memory cell transistors 50 so as to form a part of a source line SL and an extending line 22 for the bit line contacts CBL. Furthermore, as shown in FIG. 37, another feature is peripheral transistor contacts 34 for peripheral transistors 54 being formed with the second conductive material 61, and the peripheral transistor contacts 34 (61) in the peripheral circuit and the extending lines 22 for the bit line contacts CBL, in particular, being formed on the same layer. The peripheral transistor 54 also has the via contacts 24 in the memory cell block, the interconnect layers 36, and the via contacts 25 formed on the same layer as the bit lines BL.

Such configuration according to the third embodiment allows an increase in the number of interconnect layers in the peripheral transistor region without adding any processes, resulting in implementation of a higher-density and higher-performance peripheral circuit, as well as the effects of the first and second embodiments.

FIG. 35 is an aerial view of a part of the memory cell array. FIGS. 36A through 36C are schematic cross-sectional structures cut along the lines I-I, II-II, and III-III, respectively, in the aerial view of FIG. 35. Device isolating regions 26 are disposed with a striped form in the semiconductor substrate 40 at fixed intervals in a first direction along the line I-I, and word lines WL are disposed with a striped form in a direction perpendicular to the first direction. In addition, as shown in FIG. 36A, the memory cell transistors 50 are connected in series via diffusion layers 38, and connected to a source line SL and a bit line contact CBL via the select transistors 52 (S2 and S1) on both ends of the memory cell transistors 50 connected in series. A bit line contact 46 and an extending line 22, which are made of a contact plug conductive material, are buried between the adjacent select transistors 52 (S1) via sidewall insulator films 44 so as to form a bit line contact CBL. Similarly, the contact plug conductive material is buried between the adjacent select transistors 52 (S2) via the sidewall insulator films 44 so as to form a source line SL. The contact plug conductive material is, for example, impurity-doped polysilicon or amorphous silicon. Alternatively, the contact plug conductive material is a metal such as tungsten, aluminum, or copper deposited via a barrier metal such as Ti, Ta, TaN, or TiN.

The first conductive material 56 buried between the source select transistors 52 (S2) is linearly formed parallel to the word line WL so as to form a source line SL. In addition, the second conductive material 61 to be connected to the first conductive material 56 is disposed, and the upper portion of the second conductive material 61 extends and protrudes over the select transistor 52 (S2). Such a shape with an extended upper portion allows an increase in the cross-sectional area, and reduction in the resistance of the source line SL, resulting in improved performance of the nonvolatile semiconductor memory.

FIG. 26B shows a cross section II-II that is perpendicular to the bit lines BL made of the first conductive material 56 filled inbetween drain select transistors 52 (S1). The first conductive material 56 forms lines and spaces alternatingly arranged at the same pitch as the device isolating region 26, and forms a part of bit line contact plugs 45. The second conductive material 61 is disposed and connected to the bit line contact 46 formed of the first conductive material 56, and the upper portion of the second conductive material 61 extends and protrudes over the select transistor 52 (S1). Such shape with an extended upper portion allows an increase in the cross-sectional area, and a reduction in the resistance of the bit lines BL, resulting in improved performance of the nonvolatile semiconductor memory.

Each of the bit line contact plug 45 is, as shown in FIG. 36B, made up of the bit line contact 46, the second conductive material 61, which forms as a common region, and the extending line 22. In addition, each bit line contact plug 45 has a forward tapered shape with the bottom width ('width' means the length perpendicular to the bit line BL) longer than the top width. The top width is almost equivalent to a half pitch, and the bottom width is longer than the half pitch, and is longer than the width of a device region 48 to which the bit line contact plug 45 is connected. Such a shape allows an increase in lithographic margins and etching margins during formation of the bit line contact plug 45, thereby minimizing the contact resistance at the junction with the semiconductor device region 48.

The conductive material of each bit line contact plug 45 has the second conductive material 61 protruding over the select transistor and the memory cell transistor, and forms an extending line 22 for the bit line contacts 46 as shown in FIG. 35 and FIG. 36A. This extending line 22 is connected to coresponding bit line BL via a via contact 24.

On the other hand, as shown in FIG. 37, a peripheral transistor 54 in the peripheral circuit has diffusion layers 38 sandwiched inbetween the device isolating regions 26, sidewall insulator films 44, barrier insulator films 28, a first interlayer film 30, a second interlayer film 32, peripheral transistor contacts 34 formed of the second conductive material 61, via contacts 25, each connecting to the second conductive material 61, and interconnect layers 36, each contacting with a via contact 25. The peripheral transistor contacts 34 for the peripheral transistors 54 and the second conductive materials 61 shown in FIGS. 36A through 36C are formed simultaneously; the via contacts 25 and the via contacts 24 are formed simultaneously; and the interconnect layers 36 are formed on the same layer as the bit lines BL. Such configuration allows simplification of the fabrication method, which is described later, and reduction of the manufacturing cost.

(Fabrication Method of the Third Embodiment)

A fabrication method of the semiconductor memory according to the third embodiment of the present invention is described referencing FIG. 38 through FIG. 45. In each process shown in FIG. 38 through FIG. 45, A shows an aerial view of a partial pattern of the memory cell array, B shows a schematic cross-sectional device structure cut along the line I-I in A, C shows a schematic cross-sectional device structure cut along the line II-II in A, and D shows a schematic cross-sectional device structure of a peripheral transistor in the peripheral circuit. FIG. 38 through FIG. 45 correspond to FIG. 18 through FIG. 24 according to the first embodiment, and FIG. 28 through FIG. 34 according to the second embodiment. Description of the same processes as those of the first embodiment is omitted. To begin with, the step shown in FIG. 38 is described.

(3j) The first conductive material 56 is deposited with a thickness range of 50 to 500 nm, and is a metal such as tungsten, aluminum, or copper. The layer is deposited via a barrier metal such as impurity-doped polysilicon, amorphous silicon, titanium (Ti), tantalum (Ta), tantalum nitride (TaN), or titanium nitride (TiN). The first conductive material 56 must have at least a sufficient thickness for completely filling the area between the select transistors 52 (FIG. 38A through FIG. 38D).

(3j-1) A feature of the fabrication method according to the third embodiment is the step shown in FIG. 38 of filling the area between the select transistors 52 with the first conductive material 56 followed by the step of etching back the filled first conductive material using, for example, a CMP method (FIG. 39A through FIG. 39D).

(3j-2) Next, peripheral transistor contact holes 66 are formed through photolithography and anisotropic etching (FIG. 40A through FIG. 40D).

(3j-3) Next, the second conductive material 61 is deposited in a thickness range of 10 to 300 nm, and is a metal such as tungsten, aluminum, or copper. The layer is deposited via a barrier metal such as Ti, Ta, TaN, or TiN. In this case, the second conductive material 61 is disposed on the top of the first conductive material 56 in the memory cell block, and is filled in the peripheral transistor contact holes 66 to form the peripheral transistor contact plugs (FIG. 41A through FIG. 41D).

(3k) Next, a mask insulator film 62 as a silicon oxide film or a silicon nitride film is deposited upon the second conductive material 61 to a thickness of 10 to 500 nm, and a photoresist 64 is then subjected to patterning (FIG. 42A through FIG. 42D). In this case, a photoresist 64 pattern is used as a pattern for the source line SL and the extending line 22 for the bit line contacts CBL.

(3l) The mask insulator film 62 is then subjected to patterning using the photoresist 64 as a mask (FIG. 43A through FIG. 43D).

(3m) Next, the second conductive material 61 is processed through anisotropic etching using the mask insulator film 62 as an etching mask so as to form the source line SL, the bit line contacts CBL, the extending line 22 for the bit line contacts CBL, and the peripheral transistor contacts 34 for the source/drain region of a peripheral transistor 54 made of the second conductive material 61 (FIG. 44A through FIG. 44D). As shown in FIG. 44B, anisotropic etching conditions are adjusted so that the cross section cut along the line II-II that is perpendicular to the bit lines BL has a forward tapered shape. Such a shape is desirable for making the width of the bit line contacts CBL greater than that of the device region 48 at the junction with the semiconductor device region 48. The greater width of the bit line contact CBL than that of the device region 48 provides a processing margin and reduces the contact resistance between the bit line contact CBL and the first conductive material 56.

(3n) Next, the second interlayer film 32 formed of a silicon oxide film is deposited with a thickness range of 100 to 1000 nm, and is then planarized if necessary. Next, the via contacts 25 for the peripheral transistor contacts 34 (61), which are used for the peripheral transistor 54 in the peripheral circuit, and via contacts 24 in the memory cell array are formed simultaneously. Next, the interconnect layers 36 for the peripheral transistors and the bit lines BL are formed simultaneously (FIG. 45A through FIG. 45D). Thereafter, an upper interconnect layer and a passivation film or the like are formed to complete the nonvolatile semiconductor memory according to the third embodiment of the present invention.

A process of forming contact plugs for the peripheral transistors that corresponds to FIG. 23 or FIG. 33 is not needed for the third embodiment. This is because the contact plugs for the peripheral transistors have been formed in the process shown in FIG. 40 and FIG. 41.

Fourth Embodiment

FIG. 46 through FIG. 48 shows a nonvolatile semiconductor memory according to a fourth embodiment of the present invention. A feature of the fourth embodiment is: the entire NAND cell unit 20 is covered with a barrier insulator film 28; and each intermediate insulator film 68 formed of a silicon oxide film or a silicon nitride film having a thickness of 10 to 300 nm is disposed between a cap insulator film 69 for corresponding select transistor 52 and the partial regions, which is of a first conductive material 56 filled inbetween the select transistors 52 to protrude over the select transistors 52, as shown in FIG. 47A. In addition, as shown in FIG. 48, another feature is peripheral transistor contacts 34 for peripheral transistors 54 being formed with the first conductive material 56, and the peripheral transistor contacts 34 (56) in the peripheral circuit and the extending lines 22 for the bit line contacts CBL, in particular, being formed on the same layer. The peripheral transistor 54 also has the via contacts 24 in the memory cell block, the interconnect layers 36, and the via contacts 25 formed on the same layer as the bit lines BL. Such configuration with the intermediate insulator film 68 can reduce the value of the capacitance between each first conductive material 56 connected to corresponding interconnect layer 36 (BL) and the gate electrode of a select transistor 52, as shown in FIG. 47A. As a result, a high-speed operation of the nonvolatile semiconductor memory can be achieved. In addition, since the intermediate insulator film 68 functions as an etching stopper when etching the first conductive materials filled between the select transistors 52, the upper portions of the select transistors 52, the memory cell transistors 50, and the peripheral transistors 54 cannot be etched. Therefore, processing margins increase and manufacturing yield is improved.

FIG. 46 is an aerial view of a part of the memory cell array. FIGS. 47A through 47C are schematic cross-sectional structures cut along the lines I-I, II-II, and III-III, respectively, in the aerial view of FIG. 47. Device isolating regions 26 are disposed with a striped form in the semiconductor substrate 40 at fixed intervals in a first direction along the line I-I, and word lines WL are disposed with a striped form in a direction perpendicular to the first direction. In addition, as shown in FIG. 47A, the memory cell transistors 50 are connected in series via diffusion layers 38, and also connected to a source line SL and a bit line contact CBL via the select transistors 52 (S2 and S1) on both ends. A bit line contact 46 and an extending line 22, which are made of a contact plug conductive material, are buried between the adjacent select transistors 52 (S1) via sidewall insulator films 44 so as to form a bit line contact CBL. Similarly, the contact plug conductive material is buried between the adjacent select transistors 52 (S2) via the sidewall insulator films 44 so as to form a source line SL (56). The contact plug conductive material is, for example, impurity-doped polysilicon or amorphous silicon. Alternatingly, the contact plug conductive material it is a metal such as tungsten, aluminum, or copper deposited via a barrier metal such as Ti, Ta, TaN, or TiN.

The first conductive material 56 buried between the source select transistors 52 (S2) is linearly formed parallel to the word line WL so as to form a source line SL. In addition, the upper portion of first conductive material 56 extends and protrudes over corresponding select transistor 52 (S2) via the intermediate insulator film 68. Such a shape with an extended upper portion allows an increase in the cross-sectional area, and reduction in the resistance of the source line SL, resulting in improved performance of the nonvolatile semiconductor memory.

FIG. 47B shows a cross section II-II that is perpendicular to the bit lines BL made of the first conductive material 56 filled inbetween drain select transistors 52 (S1). The first conductive material 56 forms lines and spaces alternately arranged at the same pitch as the device isolating region 26, and forms bit line contact plugs 46. The upper portion of each bit line contact 46 made of the first conductive material 56 extends and protrudes over corresponding select transistor 52 (S2) via the intermediate insulator film 68. Such a shape with an extended upper portion allows an increase in the cross-sectional area, and reduction in the resistance of bit lines BL, resulting in improved the performance of the nonvolatile semiconductor memory.

As shown in FIG. 47B, each bit line contact plug 46 has a forward tapered shape with the bottom width ('width' means the length perpendicular to the bit line BL) longer than the top width. The top width is almost equivalent to a half pitch, and the bottom width is longer than a half pitch, and is longer than the width of the device region 48 to which the bit line contact plug 46 is connected. Such a shape allows an increase in lithographic margins and etching margins during formation of the bit line contact plug 46, minimizing the contact resistance at the junction with the semiconductor device region 48.

The first conductive material 56 of each bit line contact 46 protrudes over the select transistor 52 and the memory cell transistor 50, and forms an extending line 22 for the bit line contact 46, as shown in FIG. 46 and FIG. 47A. This extending line 22 is connected to corresponding bit line BL via a via contact 24.

On the other hand, as shown in FIG. 48, a peripheral transistor 54 in the peripheral circuit has diffusion layers 38 sandwiched between the device isolating regions 26, sidewall insulator films 44, barrier insulator films 28, first interlayer films 30, intermediate insulator films 68, a second interlayer film 32, transistor contacts 34 formed of the first conductive materials 56, via contacts 25, each connecting to the first conductive material 56, and interconnect layers 36, each contacting with a via contacts 25. The peripheral transistor contacts 34 for the peripheral transistors 54 and the second conductive materials 56 shown in FIGS. 47A through 47C are formed simultaneously; the via contacts 25 and the via contacts 24 are formed simultaneously; and the interconnect layers 36 are formed on the same layer as the bit lines BL. Such configuration allows simplification of the fabrication method, which is described later, and reduction of the manufacturing cost.

(Fabrication Method of the Fourth Embodiment)

A fabrication method of the nonvolatile semiconductor memory according to the fourth embodiment of the present invention is described referencing FIG. 49 through FIG. 58. In each process shown in FIG. 49 through FIG. 58, A shows an aerial view of a partial pattern of the memory cell array, B shows a schematic cross-sectional device structure cut along the line I-I in A, C shows a schematic cross-sectional device structure cut along the line II-II in A, and D shows a schematic cross-sectional device structure of a peripheral transistor in the peripheral circuit. FIG. 49 through FIG. 58 correspond to FIG. 15 through FIG. 24 according to the first embodiment. Description of the same processes of FIG. 49 as those of the first embodiment is omitted. To begin with, the step shown in FIG. 49 is described.

(4g) The first interlayer film 30 is planarized using chemical mechanical polishing (CMP) technology (FIG. 49A through FIG. 49D). A feature of the fabrication method of the nonvolatile semiconductor memory according to the fourth embodiment is the above-mentioned process of planarizing the first interlayer film 30 through CMP.

(4g-1) Thereafter, the intermediate insulator film 68 formed of a silicon oxide film or a silicon nitride film having a thickness of 10 to 300 nm is deposited (FIG. 50A through FIG. 50D).

(4g-2) Next, a photoresist 67 is subjected to patterning through photolithography (FIG. 51A through FIG. 51D). Here, as shown in FIG. 51B and FIG. 51D, both of the memory cell array and the peripheral circuit are patterned simultaneously.

(4h) The intermediate insulator film 68 and the first interlayer films 30 between the select transistors 52 are then selectively removed through anisotropic etching. Isotropic etching or anisotropic etching may be used, however, etching conditions including etch selectivity to the barrier insulator film 28, that is, etching conditions that prevent the barrier insulator film from being etched must be used. Employment of such etching conditions prevents the sidewall insulator film 44 coated with the barrier insulator film 28 from being etched (FIG. 52A through FIG. 52D).

(4i) Once the photoresist 67 is removed, the barrier insulator film 28 on the select transistors 52, the memory cell transistors 50, and the semiconductor substrate 40 is removed through anisotropic etching, whereas the barrier insulator film 28 at the sidewalls of the gates of the select transistors 52 and the peripheral transistors 54 is not removed (FIG. 53A through FIG. 53D). Alternatingly, the barrier insulator film 28 at the gate sidewalls may be removed through isotropic etching.

(4j) Next, the first conductive material 56 is deposited with a thickness range of 50 to 500 nm. The first conductive material is a metal such as tungsten, aluminum, or copper, and is deposited via a barrier metal such as impurity-doped polysilicon, amorphous silicon, titanium (Ti), tantalum (Ta), tantalum nitride (TaN), or titanium nitride (TiN). The conductive material 56 must have at least a sufficient thickness for completely filling the area between the select transistors 52 (FIG. 54A through FIG. 54D).

(4k) Next, a mask insulator film 62 formed of a silicon oxide film or a silicon nitride film is deposited upon the conductive material 56 with a thickness range of 10 to 500 nm, and a photoresist 70 is then subjected to patterning (FIG. 55A through FIG. 55D). In this case, a photoresist 70 pattern is used as a pattern for the source line SL and the extending line 22 for the bit line contacts CBL.

(4l) The mask insulator film 62 is then subjected to patterning using the photoresist 70 as a mask (FIG. 56A through FIG. 56D).

(4m) Next, the first conductive material 56 is processed through anisotropic etching using the mask insulator film 62 as an etching mask, so as to form the source line SL, the bit line contacts CBL, and the extending line 22 for the bit line contacts CBL made of the same conductive material 56 (FIG. 57A through FIG. 57D). As shown in FIG. 57B, anisotropic etching conditions are adjusted so that the cross section cut along the line II-II that is perpendicular to the bit lines BL has a forward tapered shape. Such a shape is desirable for making the width of the bit line contact CBL greater than that of the device region 48 at the junction with the semiconductor device region 48. This structure provides a processing margin and reduces the contact resistance.

(4n) Next, the second interlayer film 32 formed by a silicon oxide film is deposited with a thickness range of 100 to 1000 nm, and is then planarized, if necessary. Next, the via contacts 25 for the peripheral transistor contacts 34, which are used for the peripheral transistors in the peripheral circuit, and via contacts 24 for the memory cell array are formed simultaneously. Next, the interconnect layers 36 for the peripheral transistors and the bit lines BL are formed simultaneously (FIG. 58A through FIG. 58D). Thereafter, an upper interconnect layer and a passivation film or the like are formed to complete the nonvolatile semiconductor memory according to the fourth embodiment of the present invention.

Fifth Embodiment

A nonvolatile semiconductor memory according to a fifth embodiment of the present invention is described referencing FIG. 59 through FIG. 62. The nonvolatile semiconductor memory of the fifth embodiment relates to an EEPROM with a NOR circuit structure, as shown in FIG. 59. The memory cell array has a NOR circuit structure as shown in FIG. 59; that is, the memory cell transistors are connected in parallel between two current terminals, i.e., between the common source line SL and the bit lines BL. Since the gate of each memory cell transistor is connected to a word line WL, a memory cell transistor can be selected by driving that word line WL. FIG. 60 is an aerial view of a part of the memory cell array. FIGS. 61 through 63 are schematic cross-sectional structures cut along the lines I-I, II-II, and III-III, respectively, in the aerial view of FIG. 60. Device isolating regions 26 are disposed with a striped form in the semiconductor substrate 40 at fixed intervals in a first direction along the line I-I, and word lines WL are disposed with a striped form in a direction perpendicular to the first direction. As shown in FIG. 61, in two memory cell transistors connected in series, source regions made from the diffusion layers 38 are connected to the source lines SL (56), respectively, and drain regions on both ends are connected to the bit lines BL via the first conductive layers 56 and the via contacts 24. Bit line contacts 46, which are made of the first conductive material 56, are buried between the adjacent memory cell transistors via sidewall insulator films 44 so as to form a bit line contact CBL. A contact plug conductive material is, for example, impurity-doped polysilicon or amorphous silicon. Alternatingly, the contact plug conductive material is a metal such as tungsten, aluminum, or copper deposited via a barrier metal such as Ti, Ta, TaN, or TiN.

FIG. 62 shows a cross section II-II that is perpendicular to the bit lines BL made of the conductive material filled inbetween memory transistors. The conductive material forms lines and spaces alternatingly arranged at the same pitch as the device isolating region 26, and forms bit line contacts 46. In addition, each bit line contact 46 has a forward tapered shape with the bottom width ('width' means the length perpendicular to the bit line BL) longer than the top width. The top width is almost equivalent to a half pitch, and the bottom width is longer than the half pitch, and is longer than the width of the device region 48 to which the bit line contact 46 is connected. Such a shape allows an increase in lithographic margins and etching margins during formation of the bit line contact 46, thereby minimizing the contact resistance at the junction with the semiconductor device region 48.

As shown in FIG. 63, the source line SL has a structure with the diffusion layers 38 connected in series, each being sandwiched between the device isolating regions 26. More specifically, the source line SL (56) is formed by connecting the interfaces between the semiconductor substrate 40 and the device isolating regions 26 in series along the line III-III via the diffusion layers 38 and connecting the interfaces between the semiconductor substrate and the device isolating region them to the first conductive material 56 on top of the diffusion layers 38.

As shown in FIG. 61, the conductive material of each bit line contact 46 has an upper portion protruding over the memory cell transistors, and is connected to corresponding bit line BL via corresponding via contact 24.

On the other hand, as shown in FIG. 64, a transistor in the peripheral circuit has diffusion layers 38 sandwiched between device isolating regions 26, sidewall insulator films 44, barrier insulator films 28, a first interlayer film 30, a second interlayer film 32, peripheral transistor contacts 34, and interconnect layers 36. The transistor in the peripheral circuit is formed on a different layer than the bit line contact 46 shown in FIG. 61, and is connected to the interconnect layers 36, which are the same layer as the bit lines BL. Such configuration allows independent formation of the bit line contacts CBL and the peripheral transistor contacts 34, made of the most appropriate material, respectively, resulting in improved performance of the nonvolatile semiconductor memory. Naturally, manufacturing cost can be reduced by forming both of the bit line contacts and the peripheral transistor contacts in the same layer.

Sixth Embodiment

In the nonvolatile semiconductor memory according to the first through fifth embodiments, the memory cell transistor has a stacked-layer memory cell transistor structure with a floating gate structure. Alternatingly, the semiconductor memory may have a MONOS (Metal-Oxide-Nitride-Oxide-Semiconductor) stacked-layer structure.

A nonvolatile semiconductor memory according to a sixth embodiment of the present invention is substantially the same as the first embodiment, which configures the same NAND EEPROM as that of FIG. 7A, except for forming a standard memory cell transistor with a MONOS structure as shown in FIG. 65. In addition, FIG. 66 shows a schematic cross-sectional structure of a transistor in the peripheral circuit of the nonvolatile semiconductor memory corresponding to FIG. 65, which is substantially the same as that of FIG. 8 in the first embodiment. A memory cell transistor M in FIG. 65 has a mask insulator film 16, a gate electrode 14, a MONOS top insulator film 12, a charge accumulation insulator film 11, a tunnel insulator film 10, a semiconductor substrate 40, and diffusion layers 38 as shown in FIG. 67.

Each of the bit line contact plugs 45 is, as shown in FIG. 7B, made up of the bit line contact 46, the upper region 47, which forms as a common region, and the extending line 22. In addition, each bit line contact plug 45 has a forward tapered shape with the bottom width ('width' means the length perpendicular to the bit line BL) longer than the top width. The top width is almost equivalent to a half pitch, and the bottom width is longer than the half pitch, and is longer than the width of the device region 48 to which the bit line contact plug 45 is connected. Such a shape allows an increase in lithographic margins and etching margins during formation of the bit line contact plug 45, thereby minimizing the contact resistance at the junction with the semiconductor device region 48.

The conductive material of each bit line contact plug 45 has its upper portion protruding over the select transistor and the memory cell transistor, and forms an extending line 22 for a bit line contact 46 as shown in FIG. 6 and FIG. 65. The extending line 22 is connected to corresponding bit line BL via a via contact 24.

As shown in FIG. 66, a transistor in the peripheral circuit 2 has diffusion layers 38 sandwiched by device isolating regions 26, sidewall insulator films 44, barrier insulator films 28, a first interlayer film 30, a second interlayer film 32, transistor contacts 34, and interconnect layers 36. The transistor in the peripheral circuit 2 is formed on a different layer than the bit line contact plug 45 and is connected to the interconnect layers 36, which are the same layer as the bit lines BL. Such configuration allows independent formation of the bit line contacts CBL and the peripheral transistor contacts 34, made of the most appropriate material, respectively, resulting in improved performance of the nonvolatile semiconductor memory. Naturally, manufacturing cost can be reduced by forming both of the bit line contacts and the peripheral transistor contacts in the same layer.

As described above, in the first through sixth embodiments, formation of contact plugs and extending lines with the same material is described. Alternatingly, the same effects obtained by forming the contact plugs through etching of the conductive material filled between transistors can also be obtained even by forming contact plugs and extending lines with different materials. In other words, filling between transistors with a conductive material in advance allows resolution of the problem of failure in filling in with an insulator film. In addition, processing the contact plug to change to a forward tapered form with the bottom width greater than the top width allows an increase in lithographic margins and processing margins during formation of the contact plug, and reduction in the contact resistance between the semiconductor device region and the contact plug. In this case, it is desirable that the width of the contact plug be greater than the width of the semiconductor device region at the junction between the contact plug and the semiconductor device region.

Seventh Embodiment

As the nonvolatile semiconductor memory according to the first embodiment of the present invention, the schematic circuit configuration of a 64 M-bit NAND flash memory has, as shown in FIG. 68, two select gates SSL1 and SSL2 on the bit line side of NAND strings, and two select gates GSL1 and GSL2 on the source side. In FIG. 68, block 0 through block 1023 configured with NAND memory cell arrays are provided, and a top page buffer 290, a bottom page buffer 291, a left row decoder/charge pump 292, and a right row decoder/charge pump 293 are disposed there surrounding. In addition, in FIG. 68, word lines WL0 through WL 15 are aligned in parallel with the select gates SSL1, SSL2, GSL1, and GSL2, and bit lines BL0 through BL4223 are aligned perpendicular to such word lines.

Eighth Embodiment

As the nonvolatile semiconductor memory according to the first embodiment of the present invention, the schematic circuit configuration of the AND flash memory has, as shown in FIG. 69, two select gates SGS1 and SGS2 on the source side of the AND memory cell array, respectively, and two select gates SGB1 and SGB2 on the bit line side, respectively. In FIG. 69, a bottom page buffer 302, a word line driver 300, and a select gate control circuit 301 are disposed surrounding the AND memory cell array. In addition, in the AND memory cell array, word lines WL0 through WL15 are aligned perpendicular to the bit lines BL0 through BL4223, and memory cell transistors are connected to each word line. In FIG. 69, the region 303 enclosed by a dotted line indicates the AND memory cell unit.

The term "AND" is derived from the fact that the connecting method is a parallel connection as with the NOR type, and the logic method is opposite the NOR type. The AND type flash memory cell unit in the case of, for example, a 64 M-bit AND type flash memory that is connected in parallel between sub bit lines SUD and sub source lines SUS is configured with 128 unit cells, bit line side select transistors SGD1 and SDG2, which connect the sub bit lines SUD to the bit lines, and source line side select transistors SGS1 and SGS2, which connect the sub source lines SUS to the source line CS. The feature of the memory cell array is a pseudo contactless structure being employed where the wirings of the bit lines BL0 through BL4223 and the source line CS are hierarchized, and sub bit lines SUD and sub source lines SUS are made from diffused layers.

Ninth Embodiment

The divided bit line NOR (DINOR) type flash memory has the following features. A single power supply operation, high-speed write in, and small memory size, which are the same features as those of the NAND flash memory, and high-speed random access. Since a hierarchical structure is employed for the bit lines and sub bit lines SUD in the memory array, the DINOR flash memory unit is approximately equal to the AND type. The memory cell transistor is a stacked-gate type as with the NOR type or the NAND type memory cell transistor, and the drain in the memory cell transistor is connected in parallel to the sub bit line SUD, which is made of polysilicon. For example, in the case of a 16M-bit DINOR type flash memory, 64 memory cell transistors are connected to the sub bit lines. Reduction in the memory cell transistor size is implemented by making the connection to the memory cell transistor using implanted contacts between polysilicon and diffused layer. The mechanism for writing-in/erasing the memory cell transistor is the same as that for the AND flash memory, and is performed using the Fowler-Nordheim (FN) tunnel current. Write-in mode of operation of the memory cell transistor is performed by drawing electrons from the floating gate to the drain side using the FN tunnel current. In the erase operation, the FN tunnel current of the entire channel surface is implanted from the substrate to the floating gate.

According to a non-volatile semiconductor memory of the ninth embodiment of the present invention, an exemplary circuit structure of the DINOR flash memory, as shown in FIG. 70, includes a DINOR MONONOS memory cell array in which a hierarchical structure is employed for the bit lines BL0 through BL2047, and the sub bit lines SUD, and the bit lines are connected to the sub bit lines SUD via select gate lines SGL01 and SGL02, and select gate lines SGL11 and SGL12, respectively. In other words, at the bottom of the page, two select gate lines SGL11 and SGL12 are respectively formed, whereas, at the top of the page, two select gate lines SGL01 and SGL02 are respectively formed. In FIG. 70, a bottom page buffer 312, a word line driver 310, and a select gate control circuit 311 are disposed surrounding the DINOR memory cell array. In addition, in the DINOR memory cell array, word lines WL0 through WL63 are aligned orthogonal to the bit lines BL0 through BL2047, and a memory cell transistor is connected to each word line. The source region of each memory cell transistor is electrically and commonly connected to one another, and also connected to the common source line SL. In FIG. 35, the region 313 enclosed by a dotted line indicates the DINOR memory cell unit. Furthermore, in FIG. 70, a black circle ● indicates a diffusion layer region while a white circle ○ indicates a contact region.

Tenth Embodiment

Roughly classified, there are three operation modes of a nonvolatile semiconductor memory according to the embodiments of the present invention. Those are called 'page mode', 'byte mode', and 'ROM region included EEPROM mode'.

As shown in FIG. 71, the page mode collectively reads out via bit lines 603 a memory cell string 606, which is on a word line 604 in a flash memory cell array 601, which becomes a memory cell string 605 in a sense amplifier 602, or collectively writes in from the sense amplifier 602. In other words, read-out/write-in operation is performed page-by-page. In FIG. 71, memory cell transistors 607 are disposed at the intersections of the word lines 604 and the bit lines 603.

In contrast, as shown in FIG. 72, the byte mode reads out byte-by-byte from a memory cell transistor 608, which is on a word line 604 in the flash memory cell array 601, which becomes a memory cell transistor 613 in the sense amplifier 602, or writes in byte-by-byte from the memory cell transistor 613 in the sense amplifier 602 to the memory cell transistor 608. In other words, it is different from the page mode in that read-out/write-in operation is performed byte-by-byte.

The ROM region included EEPROM mode, performs, as shown in FIG. 73, operations of reading out information from the flash memory cell array 601 page-by-page, or, byte-by-byte, and rewriting the information while systematically switching a ROM region included EEPROM 610 section, which is provided by partitioning the inside of the flash memory cell array 601 into that ROM region included EEPROM 610 section and a flash memory 609 section. An example is shown in FIG. 73 where a memory cell string 611 on the same word line in the flash memory 609 is read out or written in a page unit in place of a memory cell string 612 in the ROM region included EEPROM 610.

It is possible to operate the nonvolatile semiconductor memory according to the first through ninth embodiments of the present invention in each mode: page mode, byte mode, and ROM region included EEPROM mode. In particular, as described later, in the case of using the flash memory in applications such as memory cards or IC cards, the ROM region included EEPROM mode allowing the flash memory to operate systematically is important for configuring a system LSI as well as in terms of advancing one-chip integration.

Eleventh Embodiment (System LSI)

Various application examples are possible with the nonvolatile semiconductor memory according to the first through tenth embodiments of the present invention. Some of these application examples are shown in FIG. 74 through FIG. 87.

APPLICATION EXAMPLE 1

As an example, a memory card 60 including a semiconductor memory device 51 is configured as shown in FIG. 74. The nonvolatile semiconductor memory according to the first through ninth embodiments of the present invention is applicable to the semiconductor memory device 51. The memory card 60, as shown in FIG. 74, is operable so as to receive a predetermined signal from an external device (not shown in the drawing) or to output a predetermined signal to an external device (not shown in the drawing).

A signal line DAT, a command line enable signal line CLE, an address line enable signal line ALE, and a ready/busy signal line R/B are connected to the memory card 60, which includes the semiconductor memory device 51. The signal line DAT is used to transfer a data signal, an address signal, or a command signal. The command line enable signal line CLE is used to transmit a signal that indicates that the command signal is being transferred over the signal line DAT. The address line enable signal line ALE is used to transmit a signal that indicates that the address signal is being transferred over the signal line DAT. The ready/busy signal line R/B is used to transmit a signal that indicates whether the semiconductor memory device 51 is ready or not.

APPLICATION EXAMPLE 2

Another example of the memory card 60 includes, as shown in FIG. 75, a semiconductor memory device 51, and a controller 76 that controls the semiconductor memory device 51 and receives/transmits a predetermined signal from/to an external device, unlike with the example of the memory card of FIG. 39. The controller 76 has interface units (I/F) 71 and 72, a microprocessor unit (MPU) 73, buffer RAM 74, and an error correction code unit (ECC) 75 included in the interface unit (I/F) 72.

The interface unit (I/F) 71 receives/transmits a predetermined signal from/to an external device. The interface unit (I/F) 72 receives/transmits a predetermined signal from/to the semiconductor memory device 51. The microprocessor unit (MPU) 73 converts a logic address to a physical address. The buffer RAM 74 temporarily stores data. The error correction code unit (ECC) 75 generates an error correction code.

A command signal line CMD, a clock signal line CLK, and a signal line DAT are connected to the memory card 60. The number of control signal lines, bit width of the signal line DAT, and circuitry of the controller 76 may be modified, if needed.

APPLICATION EXAMPLE 3

Yet another exemplary structure of the memory card 60 implements, as shown in FIG. 76, a single chip or a system LSI chip 507 integrating all of the interface units (I/F) 71 and 72, the microprocessor unit (MPU) 73, buffer RAM 74, the error correction code unit (ECC) 75 included in the interface unit (I/F) 72, and a semiconductor memory device region 501. Such system LSI chip 507 is loaded in the memory card 60.

APPLICATION EXAMPLE 4

Yet another exemplary structure of the memory card 60 implements, as shown in FIG. 77, a memory mixed MPU 502 by forming the semiconductor memory device region 501 in the microprocessor unit (MPU) 73, and implements a single chip or a system LSI chip 506 integrating all of the interface units (I/F) 71 and 72, buffer RAM 74, and the error correction code unit (ECC) 75 included in the interface unit (I/F) 72. Such system LSI chip 506 is loaded in the memory card 60.

APPLICATION EXAMPLE 5

Yet another exemplary structure of the memory card 60 utilizes, as shown in FIG. 78, a ROM region included EEPROM mode flash memory 503, which is configured with byte EEPROM and NAND flash memory, instead of the semiconductor memory device 51 shown in FIG. 74 or FIG. 75.

It is possible to configure the system LSI chip 507 by forming the ROM region included EEPROM mode flash memory 503 in the same chip as the controller 76, as shown in FIG. 76, and integrating the controller and the ROM region included EEPROM mode flash memory onto a single chip. In addition, as shown in FIG. 77, it is possible to implement a memory mixed MPU 502 by forming a semiconductor memory region configured with the ROM region included EEPROM mode flash memory 503 in the microprocessor unit (MPU) 73, and to configure the system LSI chip 506 by integrating the interface units (I/F) 71 and 72 and buffer RAM 74 onto a single chip.

APPLICATION EXAMPLE 6

As an application example of the memory card 60 shown in FIG. 75 through FIG. 78, a memory card holder 80 may be considered, as shown in FIG. 79. The memory card holder 80 may receive the memory card 60, which uses the nonvolatile semiconductor memory described in detail in the first through tenth embodiments of the present invention as a semiconductor memory device 51. The memory card holder 80 is connected to an electronic device (not shown in the drawing), and is operable as an interface between the memory card 60 and the electronic device. The memory card holder 80 is capable of executing various functions such as those of the controller 76, the microprocessor unit (MPU) 73, buffer RAM 74, the error correction code unit (ECC) 75, and the interface units (I/F) 71 and 72 in the memory card 60 disclosed in FIG. 75 through FIG. 78.

APPLICATION EXAMPLE 7

Yet another application example is described while referencing FIG. 80. In FIG. 80, a connecting apparatus 90 capable of receiving the memory card 60 or memory card holder 80 is disclosed. The nonvolatile semiconductor memory described in detail in the first through tenth embodiments of the present invention is embedded in either the memory card 60 or the memory card holder 80 and is used as the semiconductor memory device 51, the semiconductor memory device region 501, the memory mixed MPU 502, or ROM region included EEPROM mode flash memory 503. The memory card 60 or the memory card holder 80 is attached to the connecting apparatus 90, and connected electrically. The connecting apparatus 90 is connected to a circuit board 91, which mounts a CPU 94 and a bus 95 via a connecting wire 92 and an interface circuit 93.

APPLICATION EXAMPLE 8

Another application example is described while referencing FIG. 81. The nonvolatile semiconductor memory described in detail in the first through seventh embodiments of the present invention is embedded in either the memory card 60 or the memory card holder 80 and is used as the semiconductor memory device 51, the semiconductor memory device region 501, the memory mixed MPU 502, or ROM region included EEPROM mode flash memory 503. The memory card 60 or the memory card holder 80 is attached to the connecting apparatus 90, and connected electrically. The connecting apparatus 90 is connected to a personal computer (PC) 350 via a connecting wire 92.

APPLICATION EXAMPLE 9

Another application example is described while referencing FIG. 46. The memory card 60 includes the nonvolatile semiconductor memory described in detail in the first through seventh embodiments of the present invention, which is used as the semiconductor memory device 51, the semiconductor memory device region 501, the memory mixed MPU 502, or ROM region included EEPROM mode flash memory 503. FIG. 82 shows an example of applying such memory card 60 to a digital camera 650 embedded with the memory card holder 80.

APPLICATION EXAMPLE 10

Another application example of the nonvolatile semiconductor memory according to the first through tenth embodiments of the present invention configures, as shown in FIG. 83 and FIG. 84, an interface circuit (IC) card 500, which includes an MPU 400 configured with a semiconductor memory device 51, ROM 410, RAM 420, and a CPU 430, and a plane terminal 600. The IC card 500 may be connected to an external device via the plane terminal 600. In addition, the plane terminal 600 is coupled to the MPU 400 in the IC card 500. The CPU 430 has a calculation section 431 and control section 432. The control section 432 is coupled to the semiconductor memory device 51, ROM 410, and RAM 420. It is desirable that the MPU 400 be molded on one of the surfaces of the IC card 500, and the plane terminal 600 manufactured on the other surface of the IC card 500. As shown in FIG. 84, the nonvolatile semiconductor memory described in detail in the first through tenth embodiments of the present invention is applicable to the semiconductor memory device 51 or ROM 410. In addition, it is possible for the nonvolatile semiconductor memory to operate in page mode, byte mode, or ROM region included EEPROM mode.

APPLICATION EXAMPLE 11

Yet another exemplary structure of the IC card 500 configures, as shown in FIG. 85, a single chip or a system LSI chip 508 integrating all of a ROM 410, RAM 420, a CPU 430, and the semiconductor memory device region 501. Such system LSI chip 508 is embedded in the IC card 500. As shown in FIG. 85, the nonvolatile semiconductor memory described in detail in the first through seventh embodiments of the present invention is applicable to the semiconductor memory device region 501 or ROM 410. In addition, it is possible for the nonvolatile semiconductor memory to operate in page mode, byte mode, or ROM region included EEPROM mode.

APPLICATION EXAMPLE 12

Yet another exemplary structure of the IC card 500, as shown in FIG. 86, has the structure of a ROM region included EEPROM mode flash memory 510 with an embedded ROM 410 in the semiconductor memory device region 501, and configures a single chip or a system LSI chip 509 integrating all of a ROM region included EEPROM mode flash memory 510, RAM 420, and the CPU 430. Such system LSI chip 509 is embedded in the IC card 500.

APPLICATION EXAMPLE 13

Yet another exemplary structure of the IC card 500, as shown in FIG. 87, has the structure of a ROM region included EEPROM mode flash memory 510 with an embedded ROM 410 in the semiconductor memory device 51 shown in FIG. 36. Such ROM region included EEPROM mode flash memory 510 being embedded in the MPU 400 is the same as with FIG. 84.

As described above, the present invention is described according to various embodiments, however, it should not be perceived that descriptions forming a part of this disclosure and drawings are intended to limit the present invention. Various alternative embodiments, working examples, and operational techniques will become apparent from this disclosure for those skills in the art. Accordingly, the technical range of the present invention is determined only by specified features of the invention, according to the above-mentioned descriptions and appropriate appended claims.

In addition, the embodiments of the present invention can be modified and implemented in various ways as long as not deviating from the present invention. It should be noted that each of the above embodiments can be implemented in respective combinations. In this manner, the present invention naturally includes various embodiments not described herein.

Accordingly, the technical range of the present invention is determined only by the above-mentioned descriptions and appropriate appended claims.

According to the present invention, wide industrial applicability can exist not only for a memory card and IC card, but for a vehicle system, a hard disk driver, a portable phone, high-speed network modem equipment, and the like.

Other Embodiments

While the present invention is described in accordance with the aforementioned embodiments, it should not be understood that the description and drawings that configure part of this disclosure are to limit the present invention. This disclosure makes clear a variety of alternative embodiments, working examples, and operational techniques for those skilled in the art. Accordingly, the technical scope of the present invention is defined by only the claims that appear appropriate from the above explanation.

Various modifications will become possible for those skilled in the art after receiving the teachings of the present disclosure without departing from the scope thereof.

What is claimed is:

1. A nonvolatile semiconductor memory comprising a memory cell array and a peripheral circuit:
   the memory cell array comprises:
   a first device region and a first device isolating region, which have a striped pattern that extends in a first direction, the first device region and the first device isolating region being alternately and sequentially disposed at a first pitch in a second direction that is perpendicular to the first direction;
   a contact of a first conductive material, connected to the first device region and disposed at the first pitch in the second direction, and
   an extending line, being the same material as the first conductive material and connected to the top of the contact, and
   the peripheral circuit comprises:
   a transistor having a diffusion layer disposed in between second device isolating regions; and
   a peripheral transistor contact connected to the diffusion layer,
   wherein,
   on a cross section along the second direction, a bottom width of the contact is longer than the top width of the contact, the bottom width is longer than the width of the first device region, the contact and at least a part of the extending line is formed as a unit, and a height of a top surface of the peripheral transistor contact is higher than a height of a top surface of the contact.

2. The nonvolatile semiconductor memory of claim 1, further comprising a mask insulator film disposed on the extending line so as to contact with the extending line, wherein the extending line and the contact are disposed in a self-aligning manner for the mask insulator film pattern.

3. The nonvolatile semiconductor memory of claim 2, further comprising a second conductive material intervening between the extending line and the mask insulator film, and having a lower resistivity than the first conductive material.

4. The nonvolatile semiconductor memory of claim 1, further comprising:
   a common source line linearly formed in the second direction and connected to the first device region;
   select gate lines; and
   a select transistor,
   wherein the common source line is embedded and disposed in a self-aligning manner between the select gate lines via a sidewall insulator film for the select transistor.

5. The nonvolatile semiconductor memory of claim 1, further comprising:
   select gate lines;
   a common source line; and
   a mask insulator film disposed on top of the common source line so as to make contact with the common source line, wherein an upper portion of the common source line protrudes over each of the select gate lines, and the common source line is disposed in a self-aligning manner for the mask insulator film pattern.

6. The nonvolatile semiconductor memory of claim 1, further comprising:
   a common source line;
   select gate lines; and
   an intermediate insulating layer disposed between the upper portion of the common source line protruding over each of the select gate lines and corresponding select gate line.

7. The nonvolatile semiconductor memory of claim 1, further comprising:
   a bit line connected to the contact,
   wherein the contact is embedded and disposed in a self-aligning manner between word lines via a sidewall insulator film for the a memory cell transistor.

8. The nonvolatile semiconductor memory of claim 7, further comprising a mask insulator film disposed at a top of the contact and in contact with therewith,
   wherein the upper portion of the contact protrudes over a corresponding word line, and the contact is formed in a self-aligning manner for the mask insulator film pattern.

* * * * *